US012598784B2

(12) United States Patent
Lai et al.

(10) Patent No.:  US 12,598,784 B2
(45) Date of Patent:       Apr. 7, 2026

(54) SEMICONDUCTOR DEVICE HAVING DOPED GATE DIELECTRIC LAYER AND METHOD FOR FORMING THE SAME

(71) Applicant: Taiwan Semiconductor Manufacturing Co., Ltd., Hsinchu (TW)

(72) Inventors: Te-Yang Lai, Hsinchu (TW); Hsueh-Ju Chen, Taipei (TW); Tsung-Da Lin, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 650 days.

(21) Appl. No.: 17/832,342

(22) Filed: Jun. 3, 2022

(65) Prior Publication Data

US 2023/0178601 A1      Jun. 8, 2023

Related U.S. Application Data

(60) Provisional application No. 63/286,619, filed on Dec. 7, 2021.

(51) Int. Cl.
H10D 30/01 (2025.01)
H10D 30/67 (2025.01)
H10D 62/10 (2025.01)

(52) U.S. Cl.
CPC ......... H10D 62/118 (2025.01); H10D 30/031 (2025.01); H10D 30/6713 (2025.01); H10D 30/6757 (2025.01)

(58) Field of Classification Search
CPC ........... H01L 29/0665; H01L 29/66742; H01L 29/78618; H01L 29/78696
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |

(Continued)

FOREIGN PATENT DOCUMENTS

TW            202145346 A      12/2021

*Primary Examiner* — Norman D Richards
*Assistant Examiner* — Ethan Edward Cutler
(74) *Attorney, Agent, or Firm* — Slater Matsil, LLP

(57) ABSTRACT

In an embodiment, a semiconductor device includes a first channel region disposed in a first device region over a substrate; a first gate dielectric layer disposed over the first channel region; and a gate electrode disposed over the first gate dielectric layer. The first gate dielectric layer includes a first dipole dopant and a second dipole dopant. The first dipole dopant along a thickness direction of the first gate dielectric layer has a first concentration peak, and the second dipole dopant along the thickness direction of the first gate dielectric layer has a second concentration peak. The second concentration peak is located between the first concentration peak and an upper surface of the first gate dielectric layer. The second concentration peak is offset from the upper surface of the first gate dielectric layer.

20 Claims, 77 Drawing Sheets

200

(56)          References Cited

U.S. PATENT DOCUMENTS

| | | | |
|---|---|---|---|
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2019/0318967 | A1* | 10/2019 | Chen ............... H01L 21/823462 |
| 2021/0303768 | A1* | 9/2021 | Yoo .................... H01L 29/4966 |
| 2021/0366783 | A1* | 11/2021 | Chu .................. H01L 29/78696 |

* cited by examiner

SEMICONDUCTOR DEVICE HAVING DOPED GATE DIELECTRIC LAYER AND METHOD FOR FORMING THE SAME

PRIORITY CLAIM AND CROSS-REFERENCE

This application claims the benefit of U.S. Provisional Application No. 63/286,619, filed on Dec. 7, 2021, and entitled with "Multiple Vt Fabrication on CMOS device," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, 25B, 26A, 26B, 27A, 27B, 28A, 28B, 29A, 29B, 30A, 30B, 31A, 31B, 32A, 32B, 33A, 33B, 33C, 34A, 34B, 34C, 35A, 35B, and 35C are cross-sectional views of intermediate stages in the manufacturing of nano-FETs, in accordance with some embodiments.

FIGS. 21C and 24C illustrate dopant concentration profiles along a thickness direction of a gate dielectric layer, in accordance with some embodiments.

DETAILED DESCRIPTION

Figure 1:
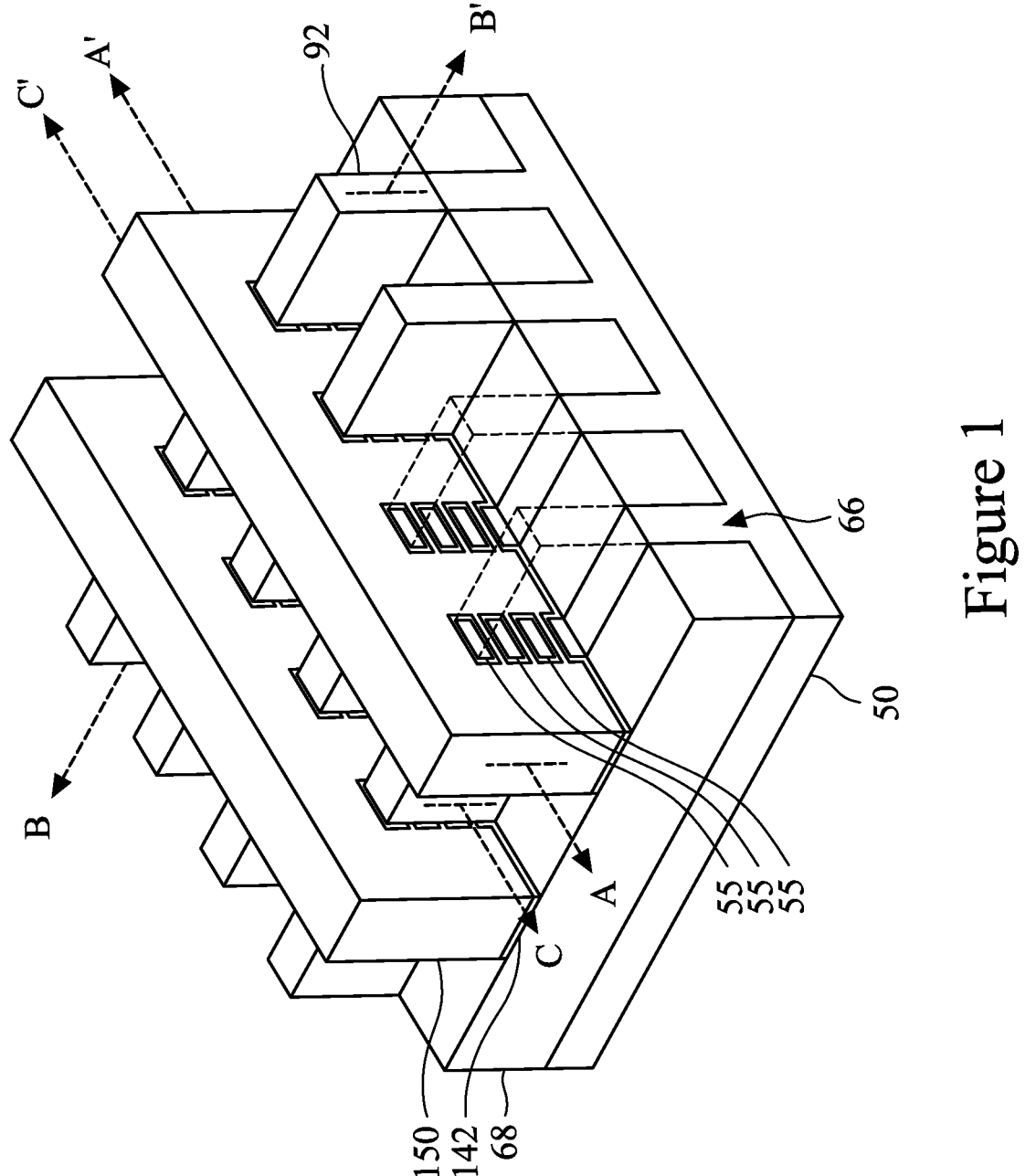
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed in greater detail below, embodiments illustrated in the present disclosure provide semiconductor devices which comprise doped gate dielectric layers. In particular, the doped dielectric layers are doped with one or more dipole dopants so as to affect threshold voltages of gate structures and provide the gate structures to have various threshold voltages in various regions. In some embodiments, each dipole dopant material may be doped into a gate dielectric layer by an individual doping loop. Thus, the concentration and concentration profiles of each dipole dopant material in one or more doped gate dielectric layers may be individually controlled.

Embodiments are described below in a particular context, e.g., a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 is illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layer 142 are over top surfaces of the fins 66 and along top surfaces, sidewalls, and bottom surfaces of the nanostructures 55. Gate electrodes 150 are over the gate dielectric layer 142. Epitaxial source/drain regions 92 are disposed on the fins 66 on opposing sides of the gate dielectric layers 142 and the gate electrodes 150.

FIG. 1 further illustrates reference cross-sections that are used in later figures. Cross-section A-A' is along a longitudinal axis of a gate electrode 150 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 36C are cross-sectional views of intermediate stages in the manufacturing of nano-FETs, in accordance with some embodiments. FIGS. 2 through 5, 6A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, 35A, and 36A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 22B, 23B, 24B, 25B, 26B, 27B, 28B, 29B, 30B, 31B, 32B, 33B, 34B, 35B, and 36B illustrate reference cross-section B-B' illustrated in FIG. 1. FIGS. 7A, 8A, 9A, 10A, 11A, 12A, 12C, 13C, 33C, 34C, 35C, and 36C illustrate reference cross-section C-C' illustrated in FIG. 1.

Figure 2:
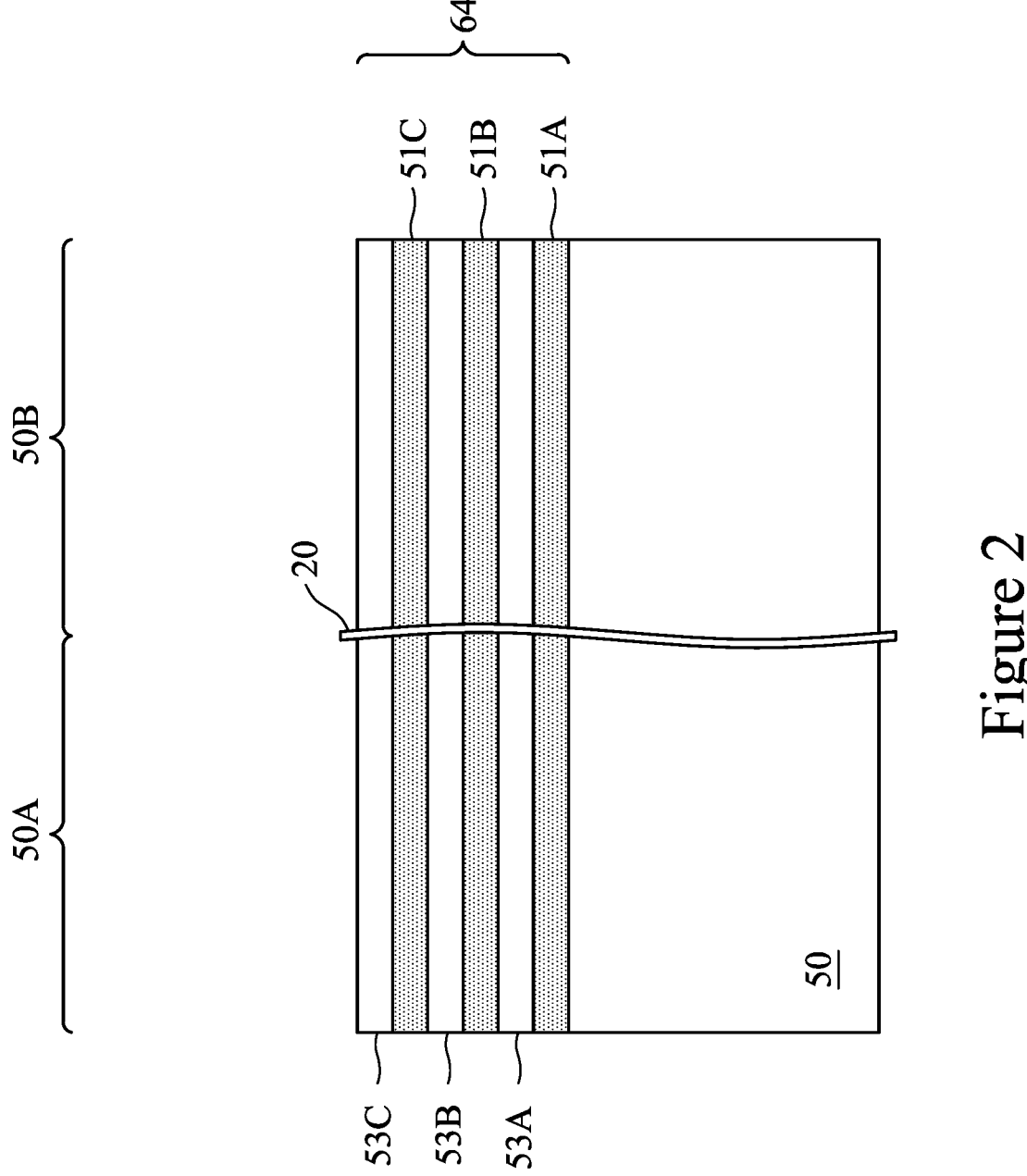

In FIG. 2, a substrate 50 is provided for forming the nano-FETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 includes a first region 50A and a second region 50B. In some embodiments, the first region 50A and the second region 50B are for forming different devices. For example, the first region 50A may be a logic device region, and the second region 50B may be an I/O device region. Alternatively, both the first region 50A and the second region 50B are the logic device region or the I/O device region with different functional circuits. In some embodiments, the first region 50A and the second region 50B may be used for forming devices of the same conductivity type or different conductivity types. For example, in an embodiment, both the first region 50A and the second region 50B are for forming n-type devices, such as NMOS transistors (e.g., n-type nano-FETs), or p-type devices, such as PMOS transistors (e.g., p-type nano-FETs). In some embodiments, the first region 50A can be for forming n-type devices, such as an NMOS device region for forming NMOS transistors (e.g., n-type nano-FETs), and the second region 50B can be for forming p-type devices, such as a PMOS device region for forming PMOS transistors (e.g., p-type nano-FETs). The first region 50A may be physically separated from the second region 50B (as illustrated by divider 20), and any number of device features (e.g., other active devices, doped regions, isolation structures, etc.) may be disposed between the first region 50A and the second region 50B. Although one first region 50A and one second region 50B are illustrated, any number of first regions 50A and second regions 50B may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material. Similarly, the second semiconductor layers 53 of the second semiconductor material may be removed without significantly removing the first semiconductor layers 51. For purposes of illustration and as discussed in greater detail below, the first semiconductor layers 51 will be removed, and the second semiconductor layers 53 will be patterned to form channel regions of the nano-FETs in both the first region 50A and the second region 50B. Nevertheless, in some embodiments, the second semiconductor layer 53 will be removed, and the first semiconductor layer 51 may be patterned to form channel regions of the nano-FETs. In such embodiments, the channel regions in both the first region 50A and the second region 50B may have a same material composition (e.g., silicon or other suitable semiconductor materials) and be formed simultaneously.

Figure 36A:
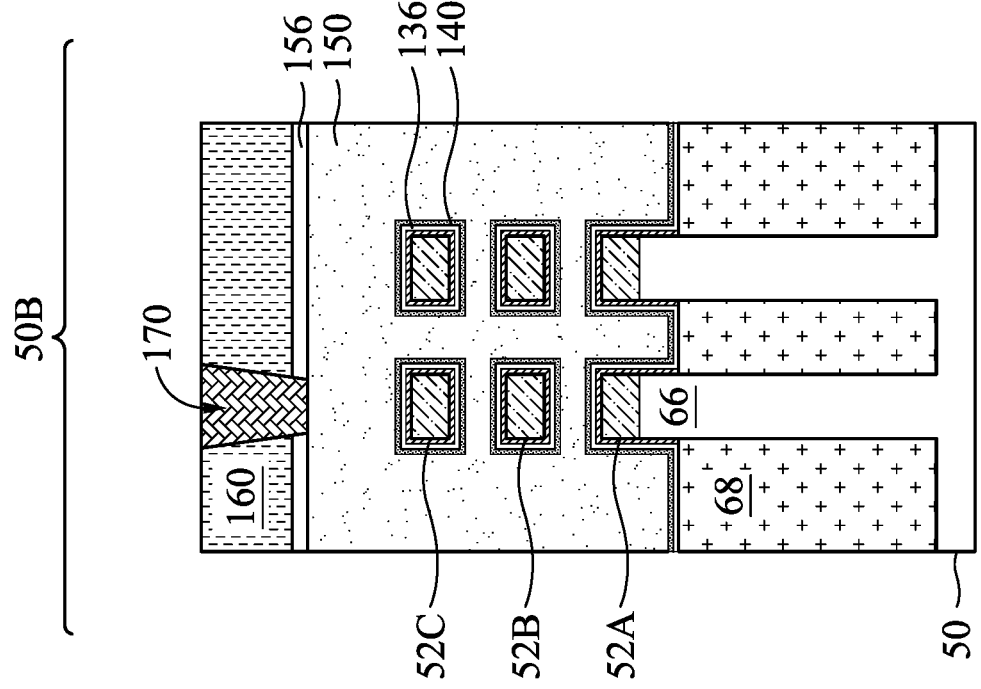
FIGS. 36A, 36B, and 36C are cross-sectional views of a nano-FET, in accordance with some embodiments.
Figure 36A:
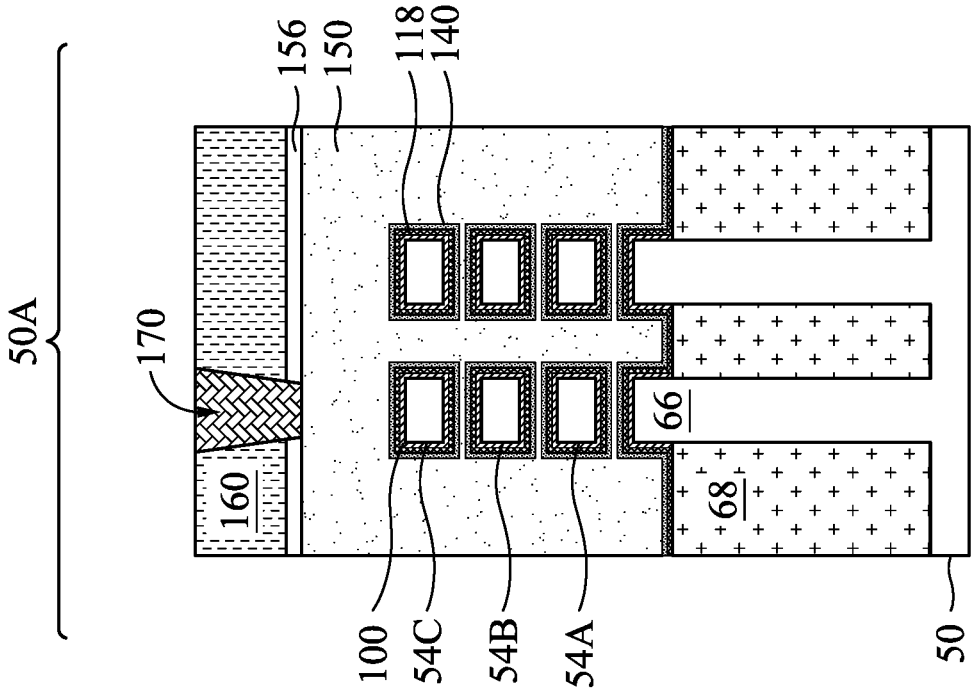
Figure 36B:
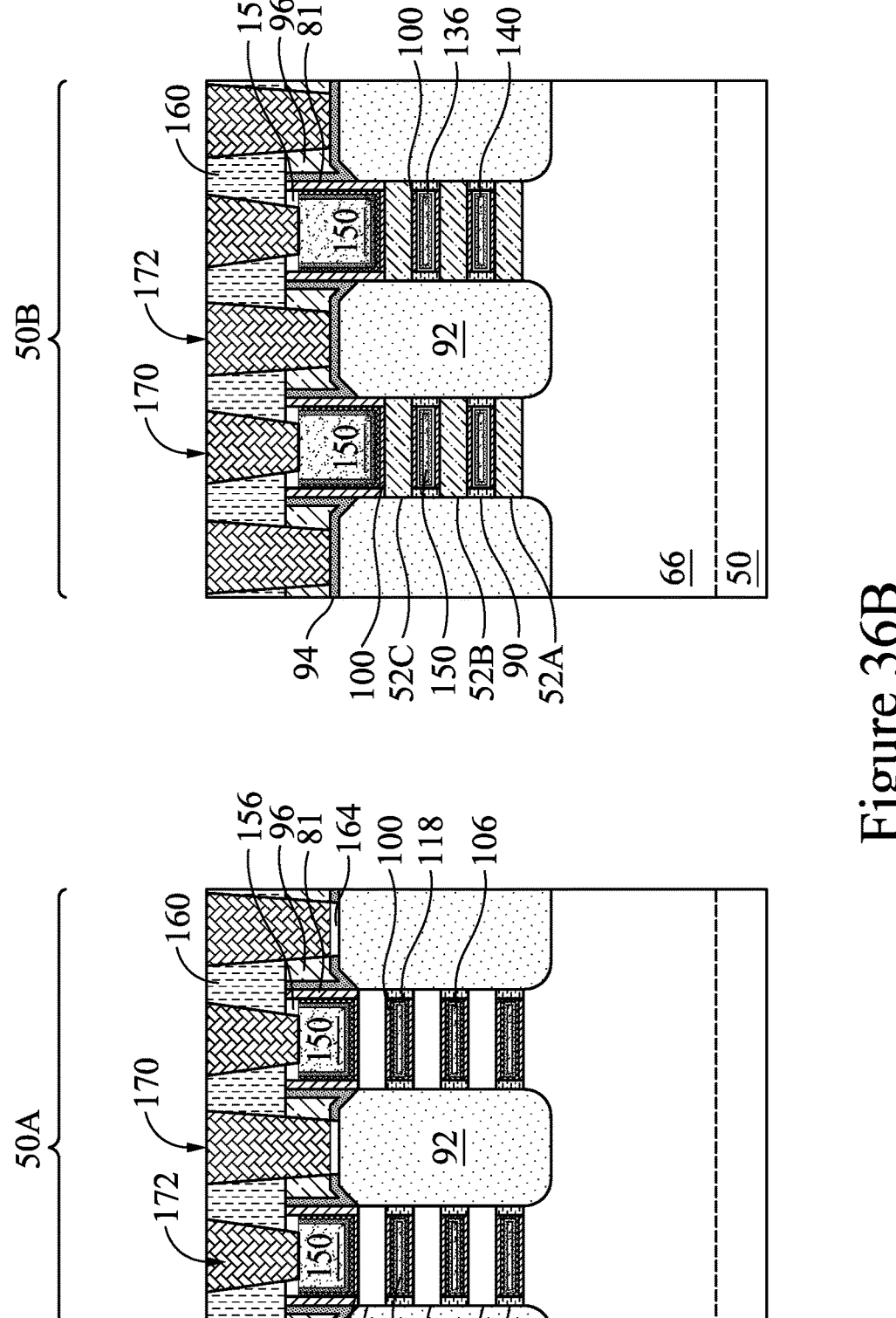
Figure 36C:
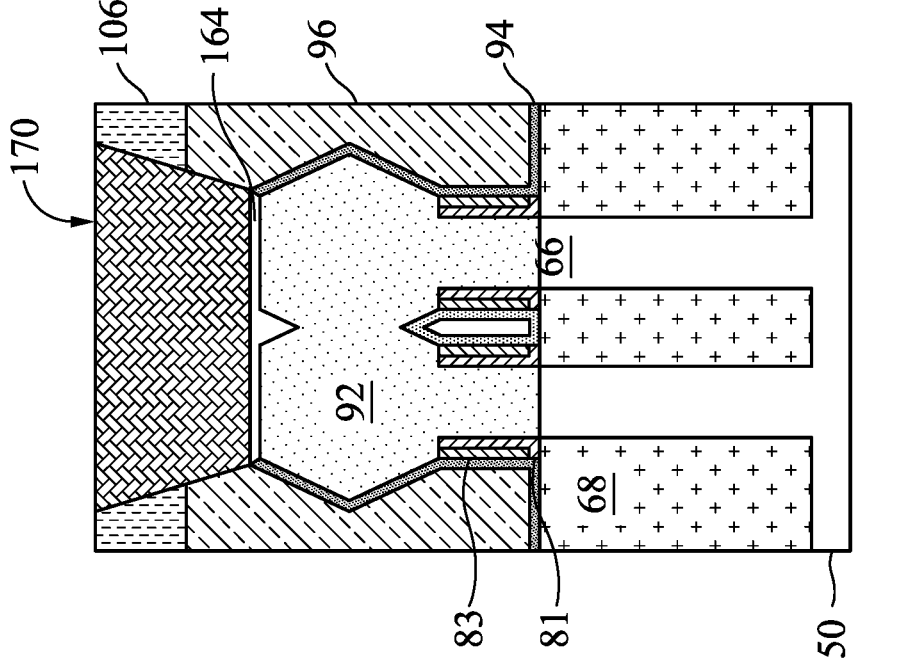

In still other embodiments, the first semiconductor layers 51 will be removed in the first region 50A, and the second semiconductor layers 53 will be patterned to form channel regions of the nano-FETs in the first region 50A. Also, the second semiconductor layer 53 will be removed, and the first semiconductor layer 51 will be patterned to form channel regions of the nano-FETs in the second region 50B. Nevertheless, in some embodiments, the second semiconductor layers 53 may be removed, and the first semiconductor layers 51 may be patterned to form channel regions of the nano-FETs in the first region 50A, and the first semiconductor layers 51 may be removed, and the second semiconductor layers 53 may be patterned to form channel regions of the nano-FETs in the second region 50B. In such embodiments, the channel regions in both the first region 50A and the second region 50B have different material compositions (e.g., one is silicon, silicon carbide, or the like, and another is silicon germanium or another semiconductor material). FIGS. 36A, 36B, and 36C illustrate a structure resulting from such embodiments where the channel region in the first region 50A formed of a semiconductor material such as silicon or silicon carbide, and the channel region in the second region 50B formed of another semiconductor material such as silicon germanium, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like.

Figure 3:
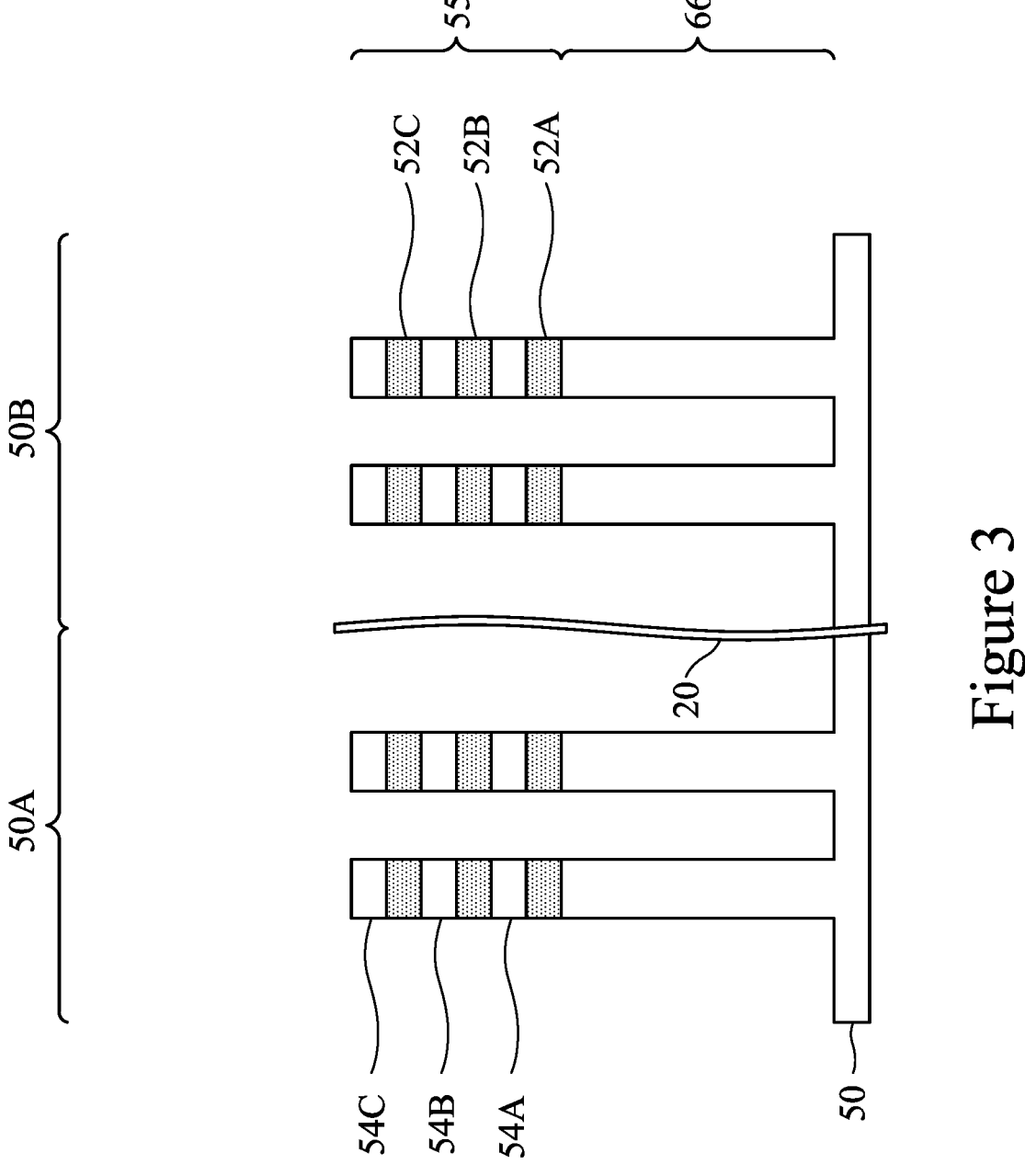

Referring to FIG. 3, fins 66 are formed in the substrate 50, and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the first region 50A and the second region 50B as having substantially equal widths for illustrative purposes. In some embodiments, widths of the fins 66 in the first region 50A may be greater or thinner than the fins 66 in the second region 50B. Further, while each of the fins 66 and the nanostructures 55 are illustrated as having a consistent width throughout, in some embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
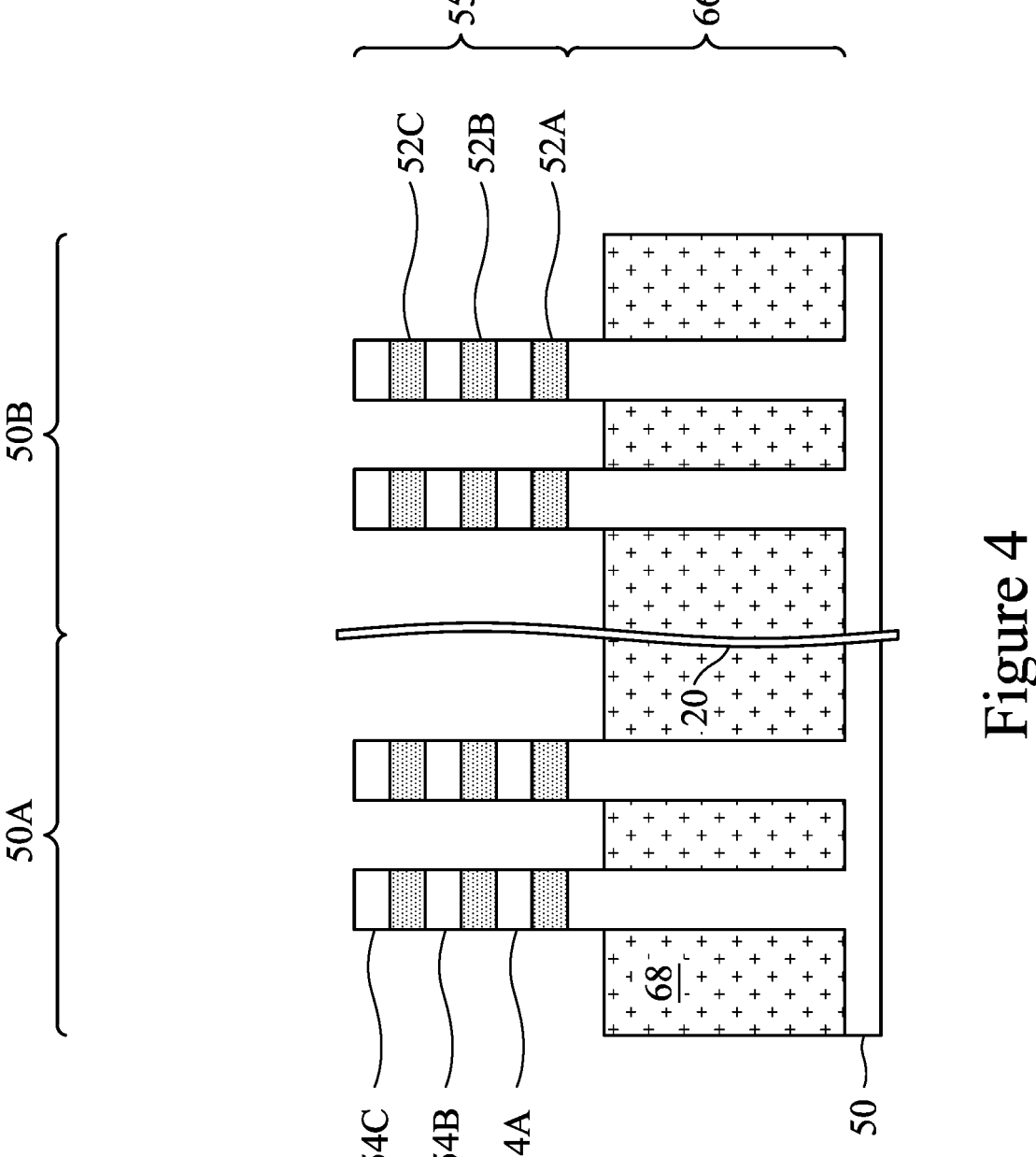

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the first region 50A and the second region 50B protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further in FIG. 4, appropriate wells (not separately illustrated) may be formed in the fins 66 and nanostructures 55, and/or the substrate 50. The wells may have a conductivity type opposite from a conductivity type of source/drain regions that will be subsequently formed in each of the n-type region and the p-type region. In some embodiments, a p-type well is formed in the n-type region, and an n-type well is formed in the p-type region. In some embodiments, a p-type well or an n-type well is formed in both the n-type region and the p-type region. The n-type well may be formed by performing an n-type impurity implant. The n-type impurities may be phosphorus, arsenic, antimony, or the like implanted in the region to a concentration in the range of $10^{13}$ cm$^{-3}$ to $10^{14}$ cm$^{-3}$. The p-type well may be formed by performing a p-type impurity implant. The p-type impurities may be boron, boron fluoride, indium, or the like implanted in the region to a concentration in the range of $10^{13}$ cm$^{-3}$ to $10^{14}$ cm$^{-3}$. After the implants are implanted, an anneal process may be performed to repair damage and activate the p-type and/or n-type impurities that were implanted. In some embodiments where epitaxial structures are epitaxially grown for the fins 66 and the nanostructures 55, the grown materials may be in situ doped during growth, which may obviate the implantations, although in situ and implantation doping may be used together.

Figure 5:
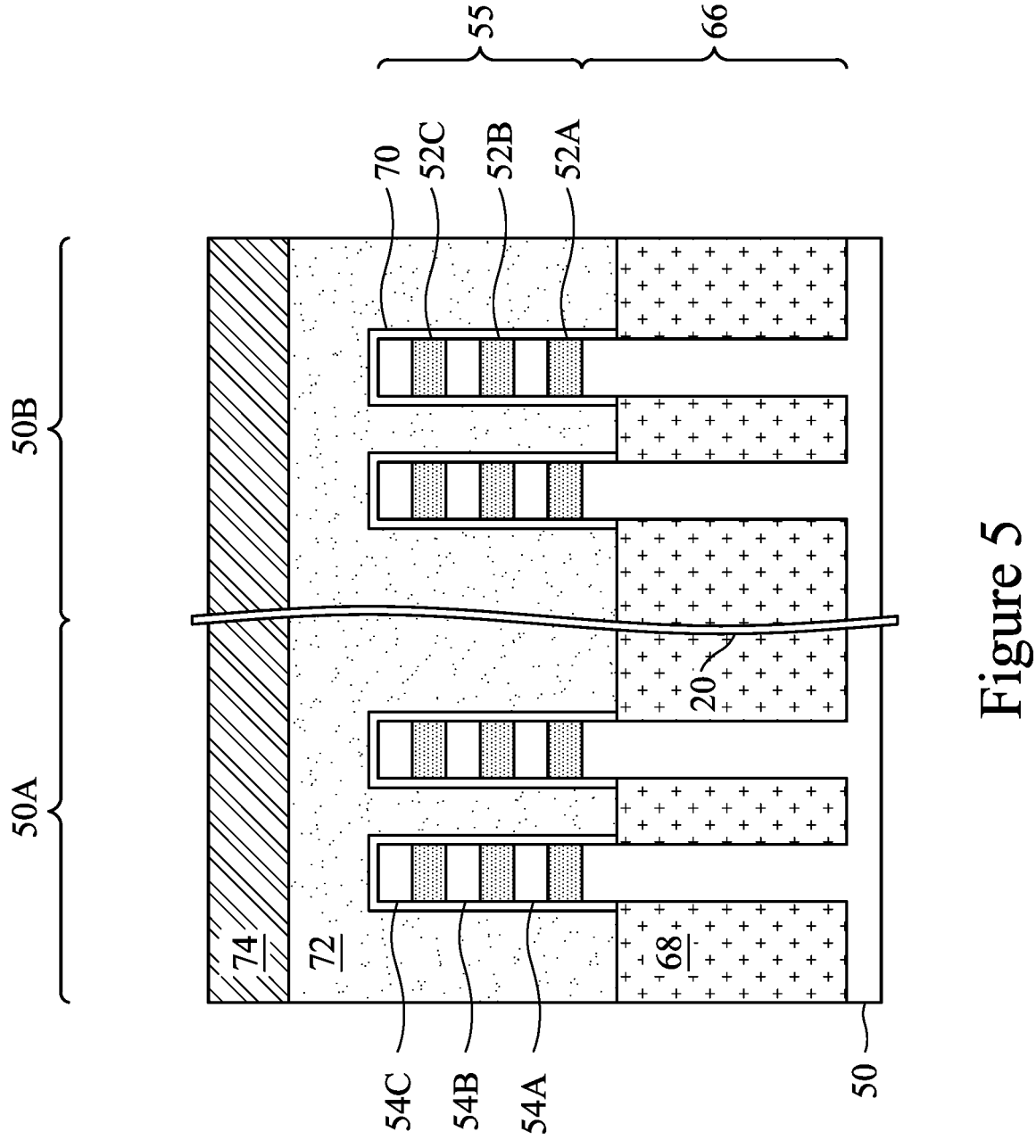

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a chemical mechanical polishing (CMP). The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the first region 50A and the second region 50B. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
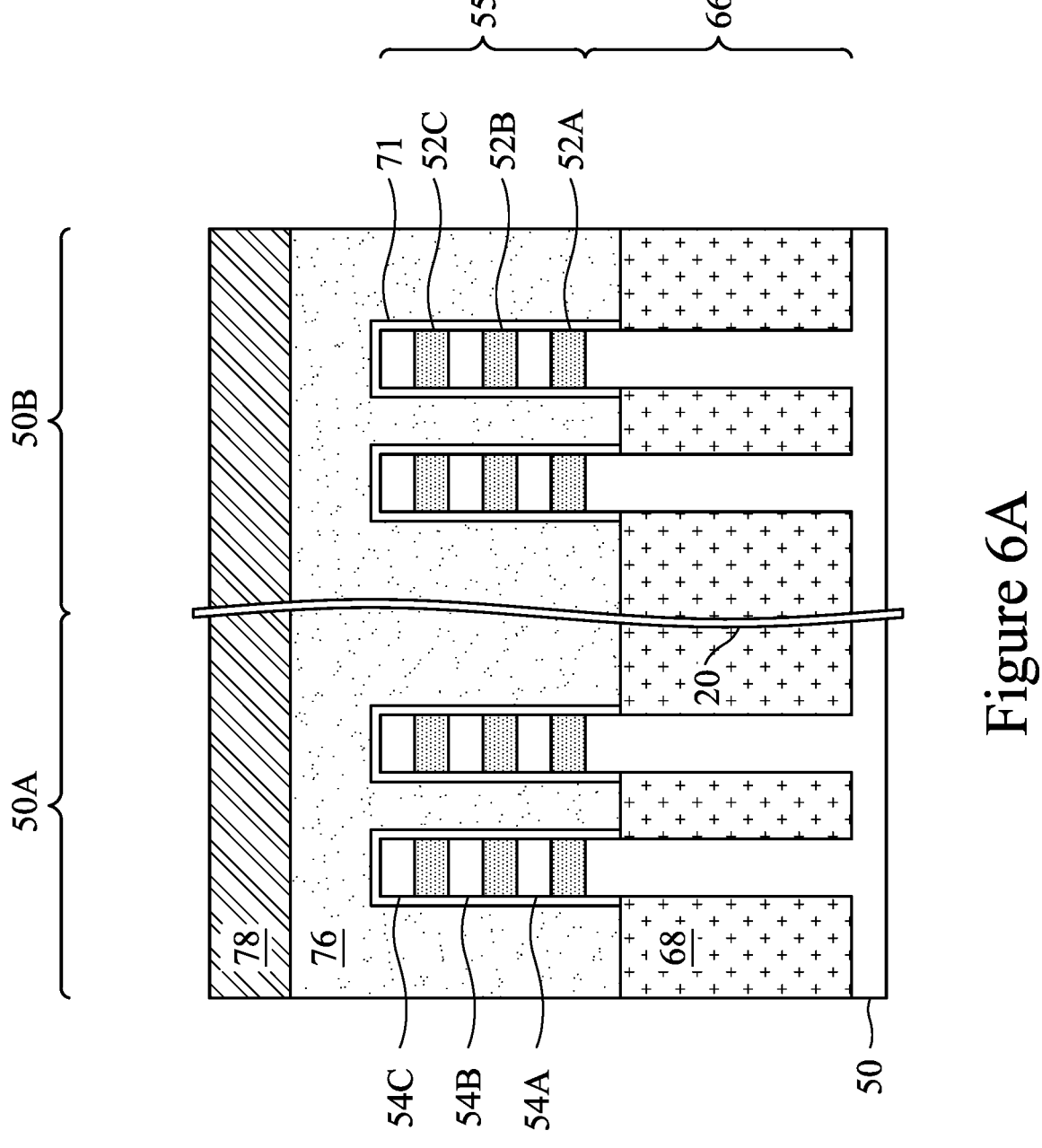
Figure 6B:
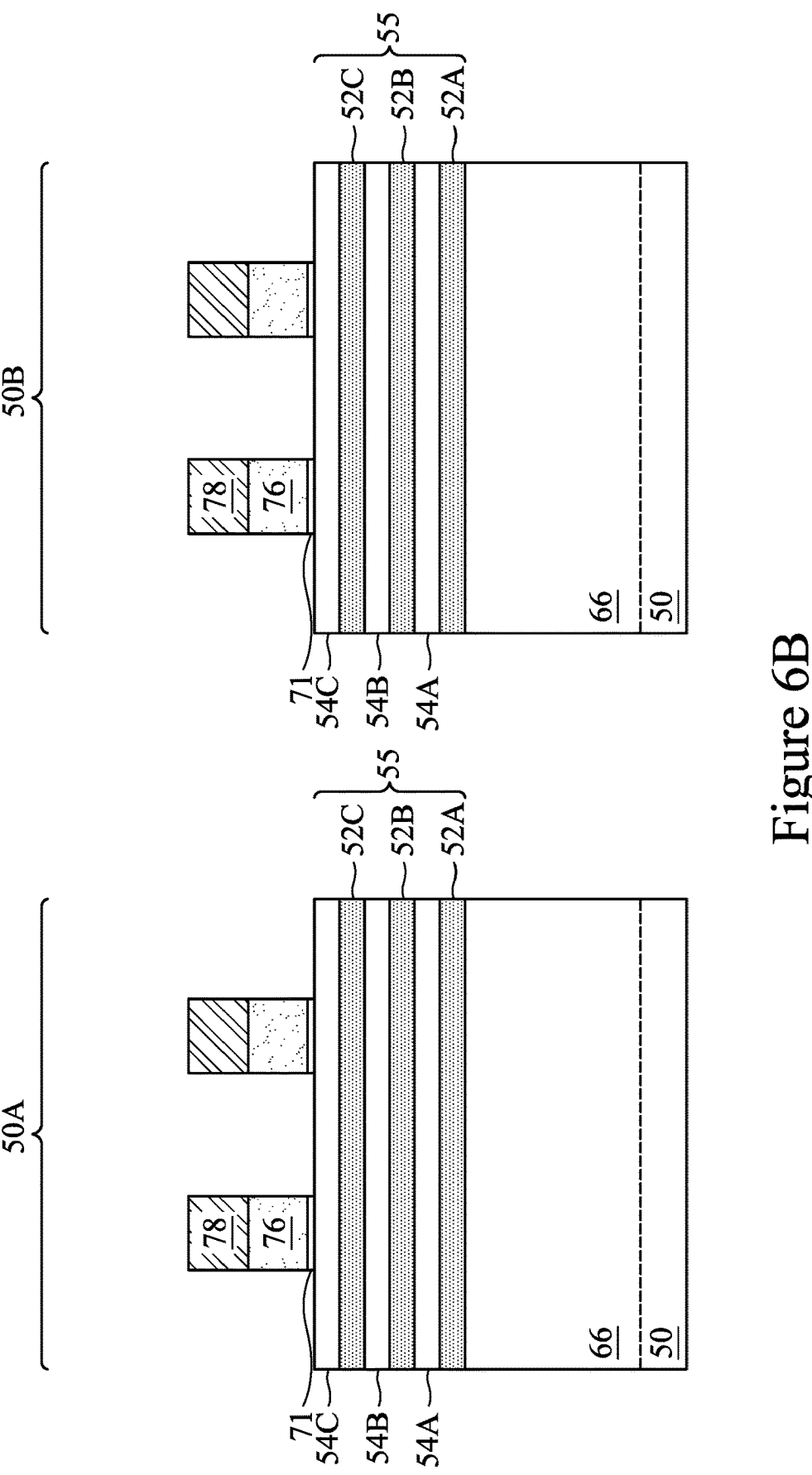

FIGS. 6A through 35C illustrate various additional steps in the manufacturing of embodiment devices. FIGS. 6A, 7A, 8A, 9A, 10A, 11A, 12A, 12C, 13A, 13C, 14A, 15A, 33C, 34C, and 35C illustrate features in either the first region 50A or the second region 50B. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
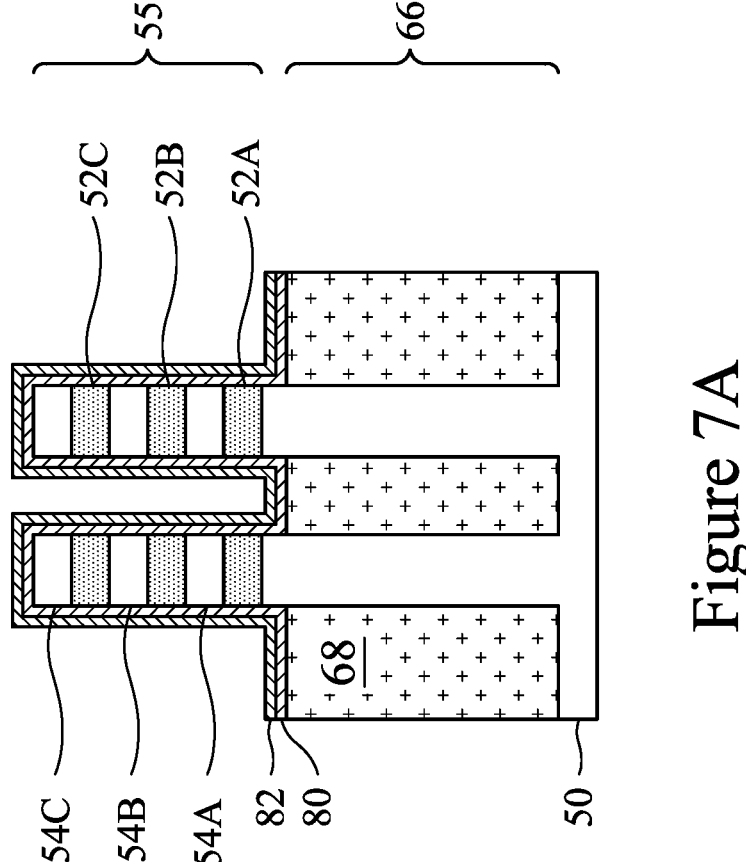
Figure 7B:
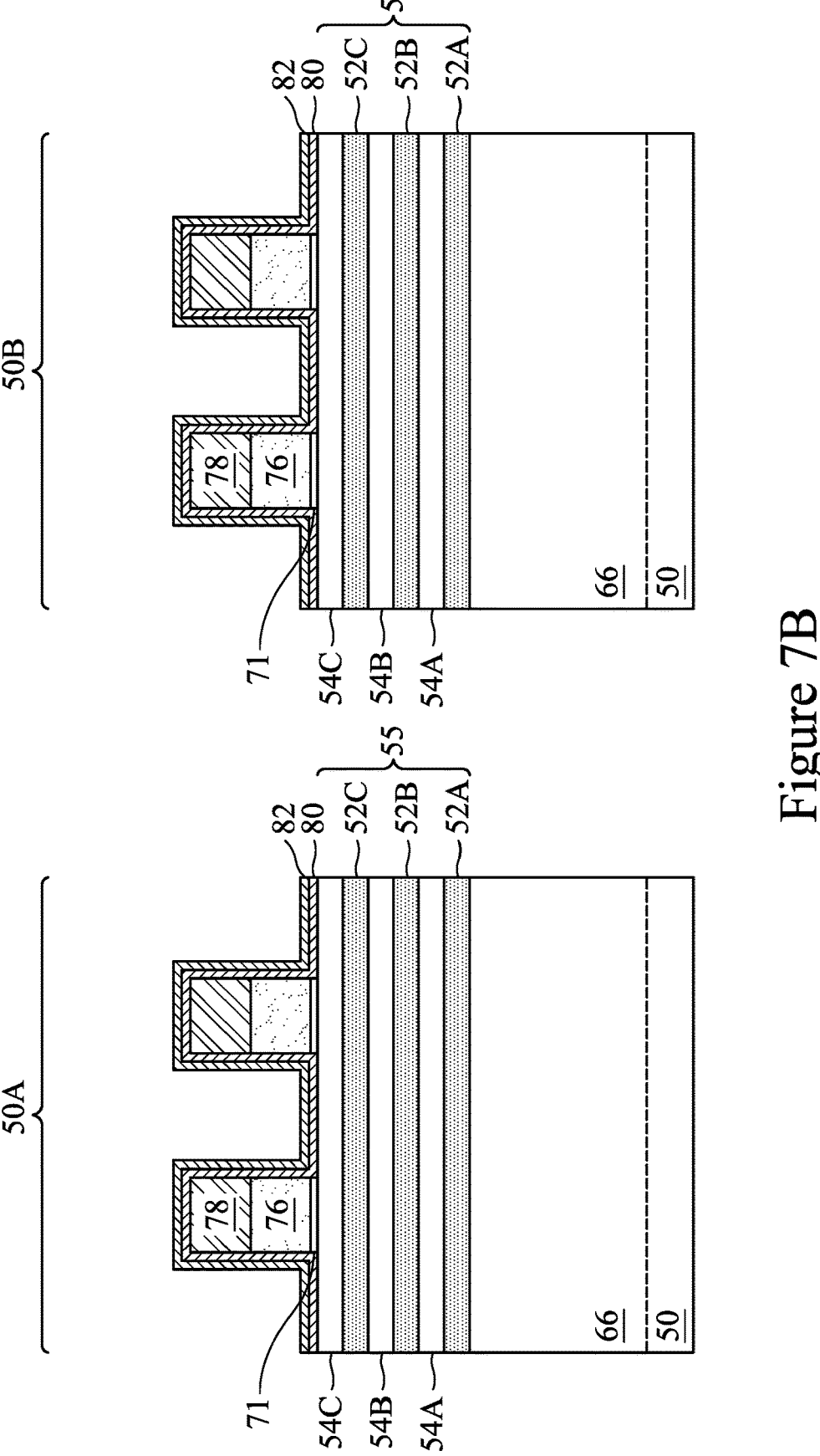

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55 and the masks 78; sidewalls of the dummy gates 76 and the dummy gate dielectrics 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After forming the first spacer layer 80 and prior to forming the second spacer layer 82, implants for lightly doped source/drain (LDD) regions (not separately illustrated) may be performed. Appropriate type impurities (e.g., n-type or p-type) may be implanted into the fins 66 and/or the nanostructures 55. The n-type impurities may be any of the n-type impurities previously described, and the p-type impurities may be any of the p-type impurities previously described. The LDD regions may have a concentration of impurities in the range of $10^{15}$ cm$^{-3}$ to $10^{19}$ cm$^{-3}$. An anneal process may be used to repair implant damage and to activate the implanted impurities.

Figure 8A:
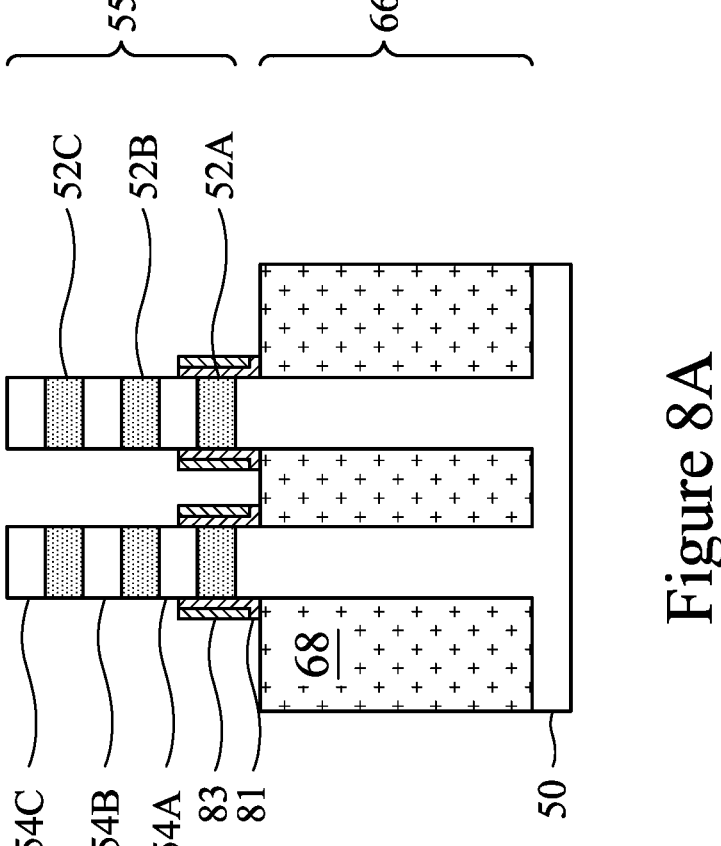
Figure 8B:
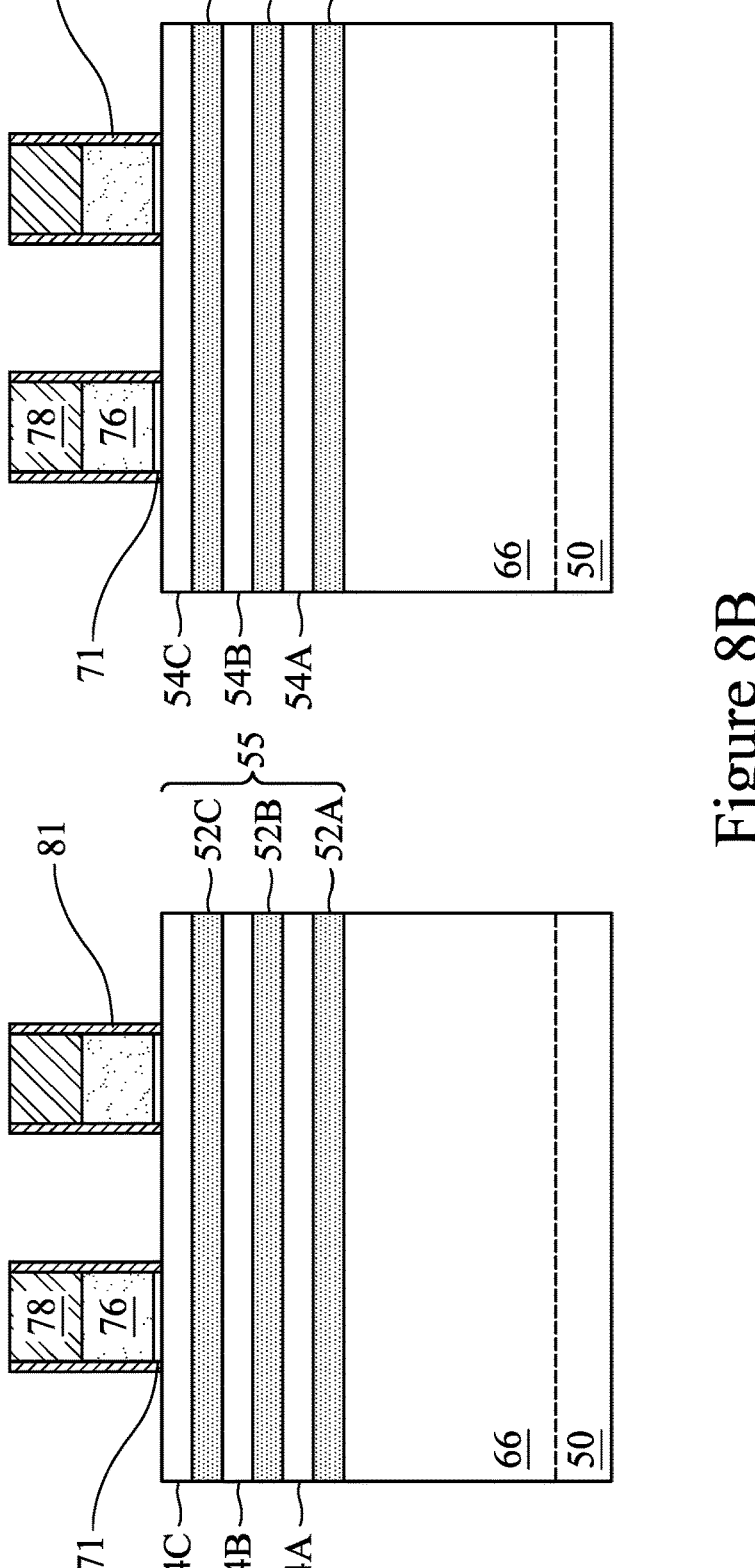

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etch process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 act as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, a different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
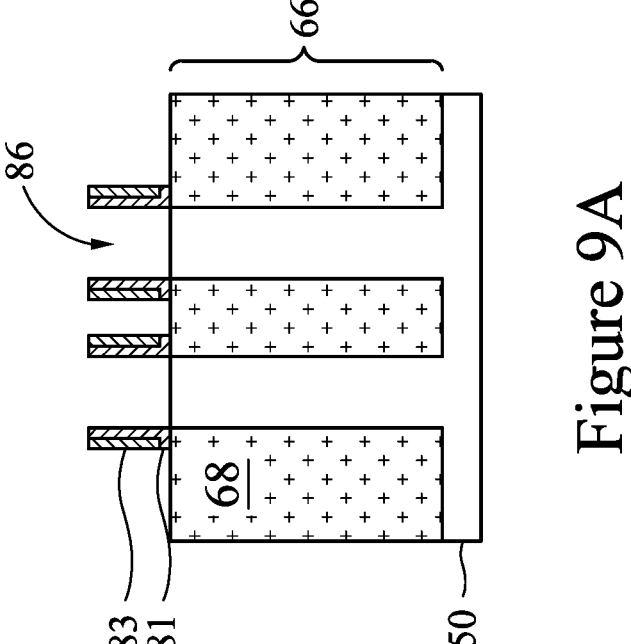
Figure 9B:
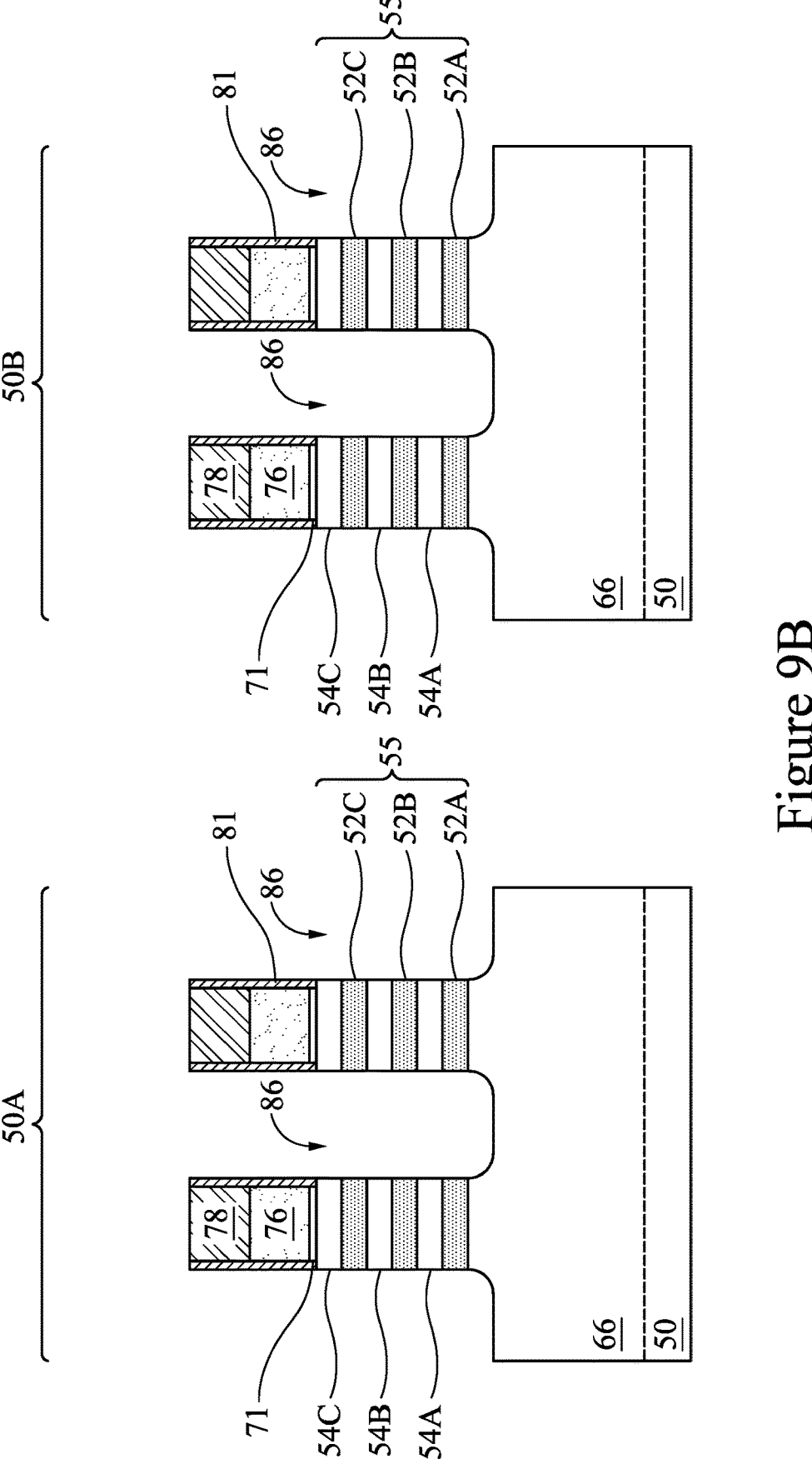

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using aniso-tropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostruc-tures 55 and/or the fins 66. Timed etch processes may be used to stop the etching of the first recesses 86 after the first recesses 86 reach a desired depth.

Figure 10A:
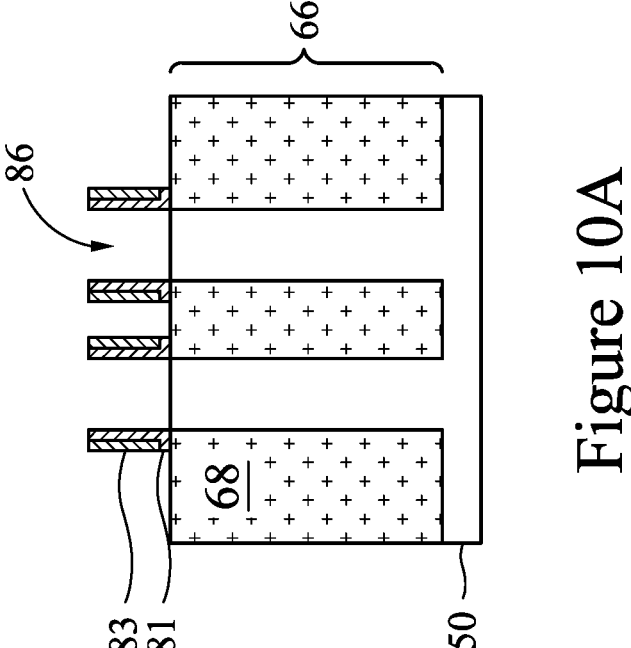
Figure 10B:
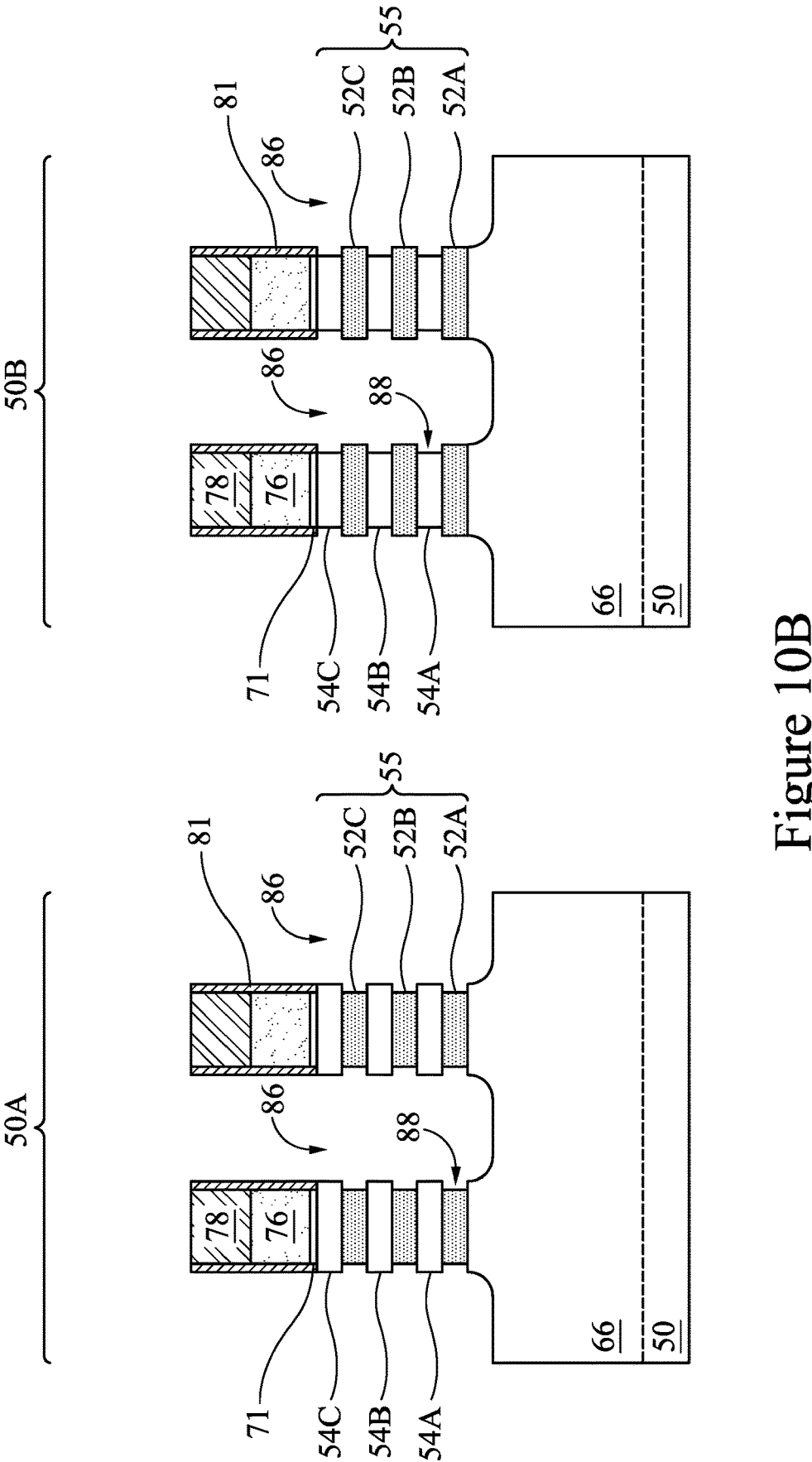

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the first region 50A and the second region 50B. Although sidewalls of the first nanostructures 52 in sidewall recesses 88 are illustrated as being straight in FIG. 10B, the sidewalls may be concave or convex. The sidewalls may be etched using isotropic etching processes, such as wet etch the like.

Figure 11A:
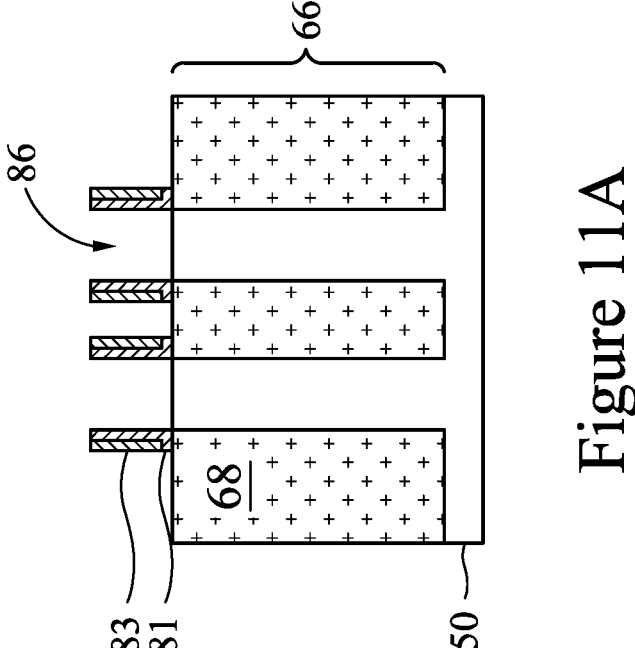
Figure 11B:
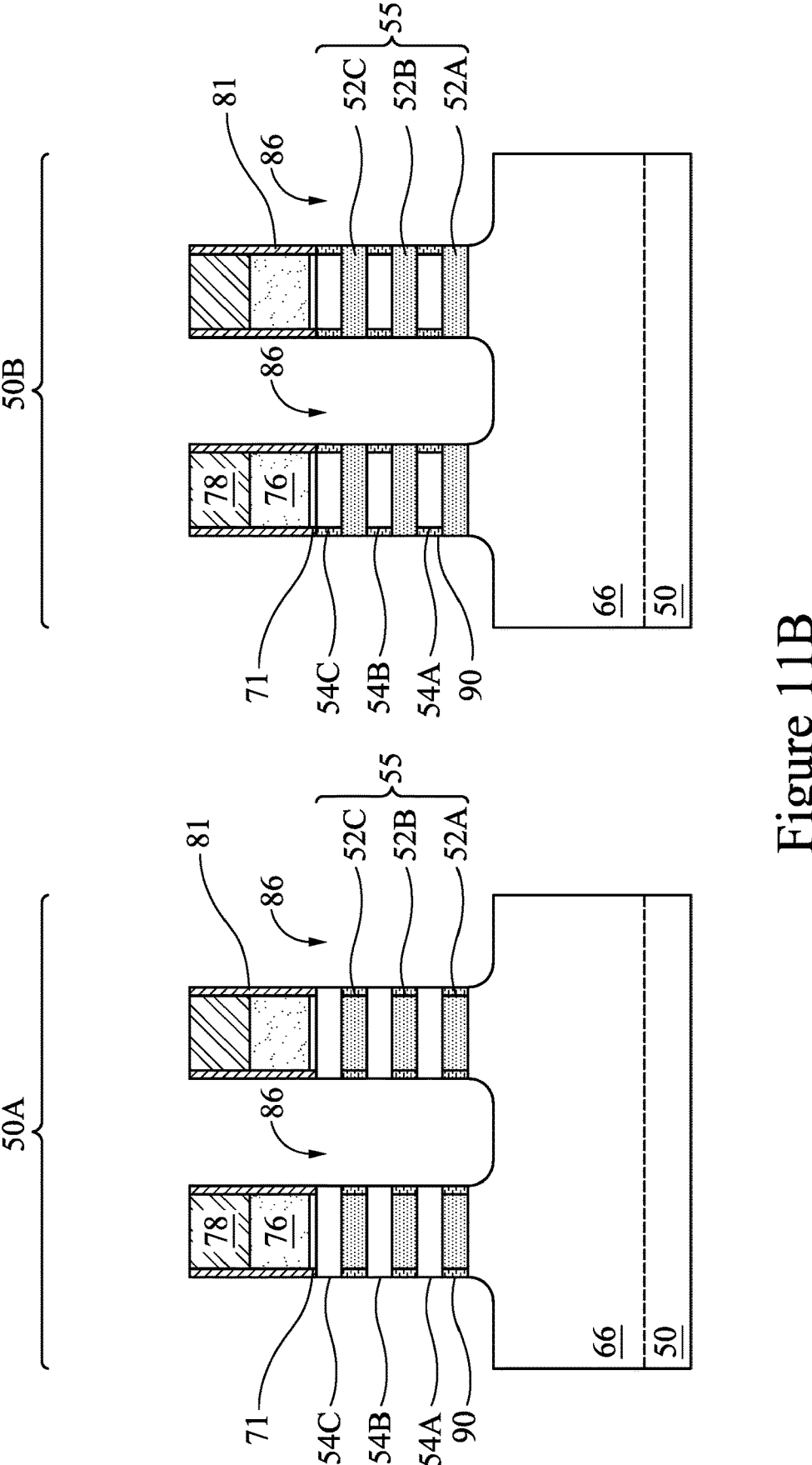
Figure 11C:
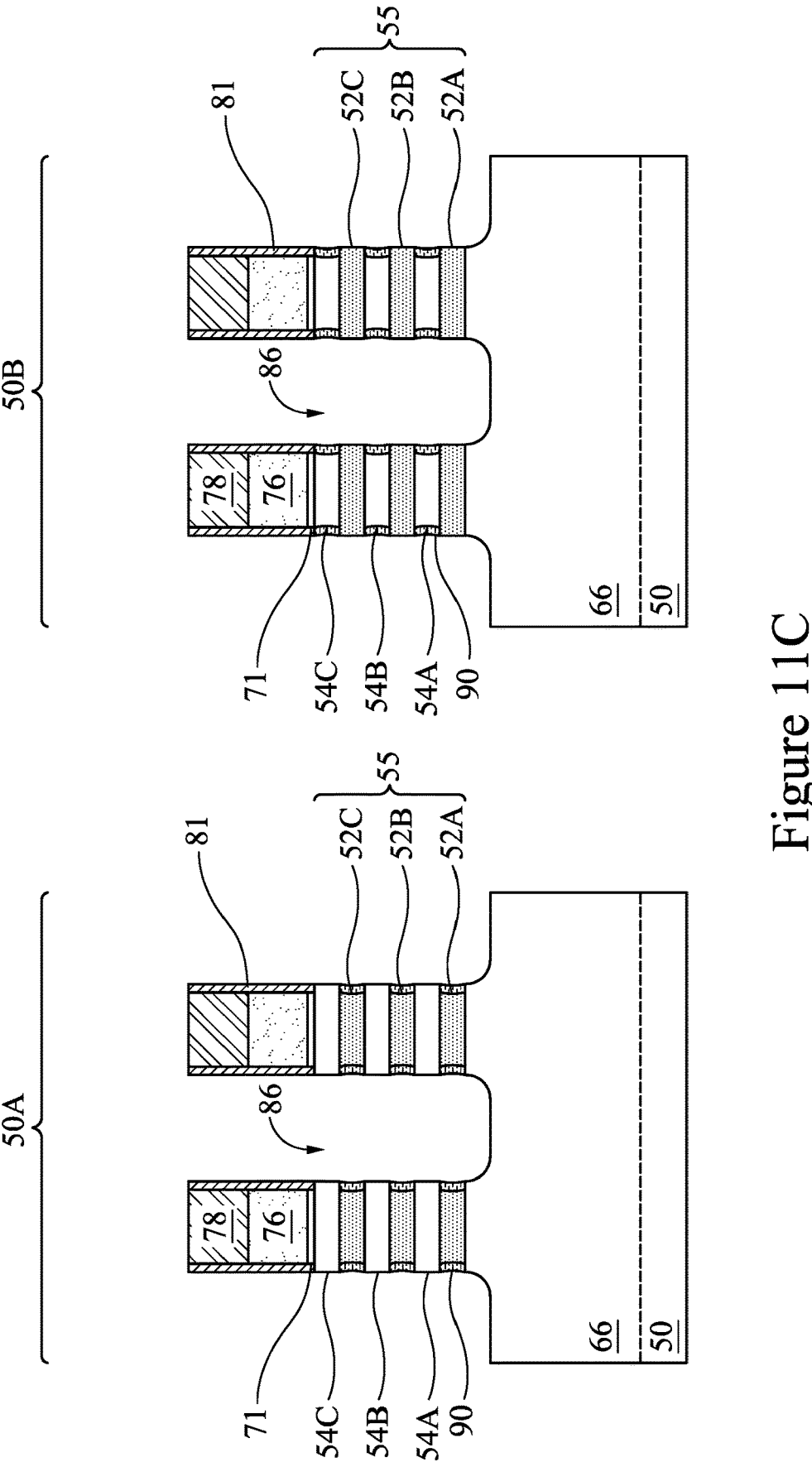

In FIGS. 11A-11C, first inner spacers 90 are formed in the sidewall recess 88. The first inner spacers 90 may be formed by depositing an inner spacer layer over the structures illustrated in FIGS. 10A and 10B. The first inner spacers 90 act as isolation features between subsequently formed source/drain regions and a gate structure. As will be dis-cussed in greater detail below, source/drain regions will be formed in the first recesses 86, while the first nanostructures 52 in the first region 50A and the second region 50B will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the first region 50A and the second region 50B, the outer sidewalls of the first inner spacers 90 may extend beyond or be recessed from sidewalls of the second nanostructures 54.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodi-ment in which sidewalls of the first nanostructures 52 are concave, outer sidewalls of the first inner spacers 90 are concave, and the first inner spacers are recessed from sidewalls of the second nanostructures 52. The inner spacer layer may be etched by an anisotropic etching process, such as RIE, NBE, or the like. The first inner spacers 90 may be used to prevent damage to subsequently formed source/drain regions (such as the epitaxial source/drain regions 92, dis-cussed below with respect to FIGS. 12A-12C) by subse-quent etching processes, such as etching processes used to form gate structures.

Figure 12A:
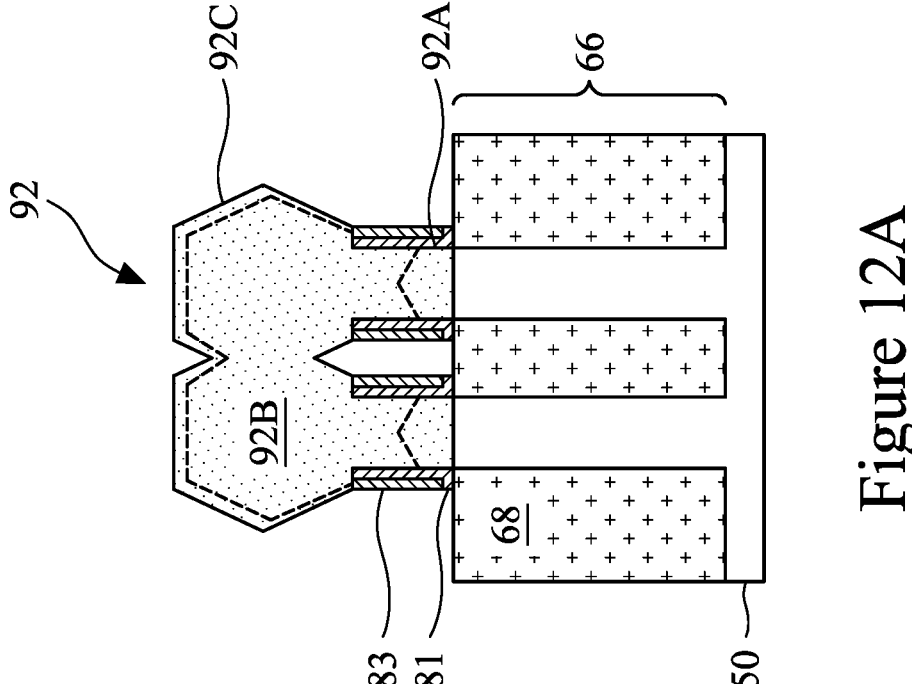
Figure 12B:
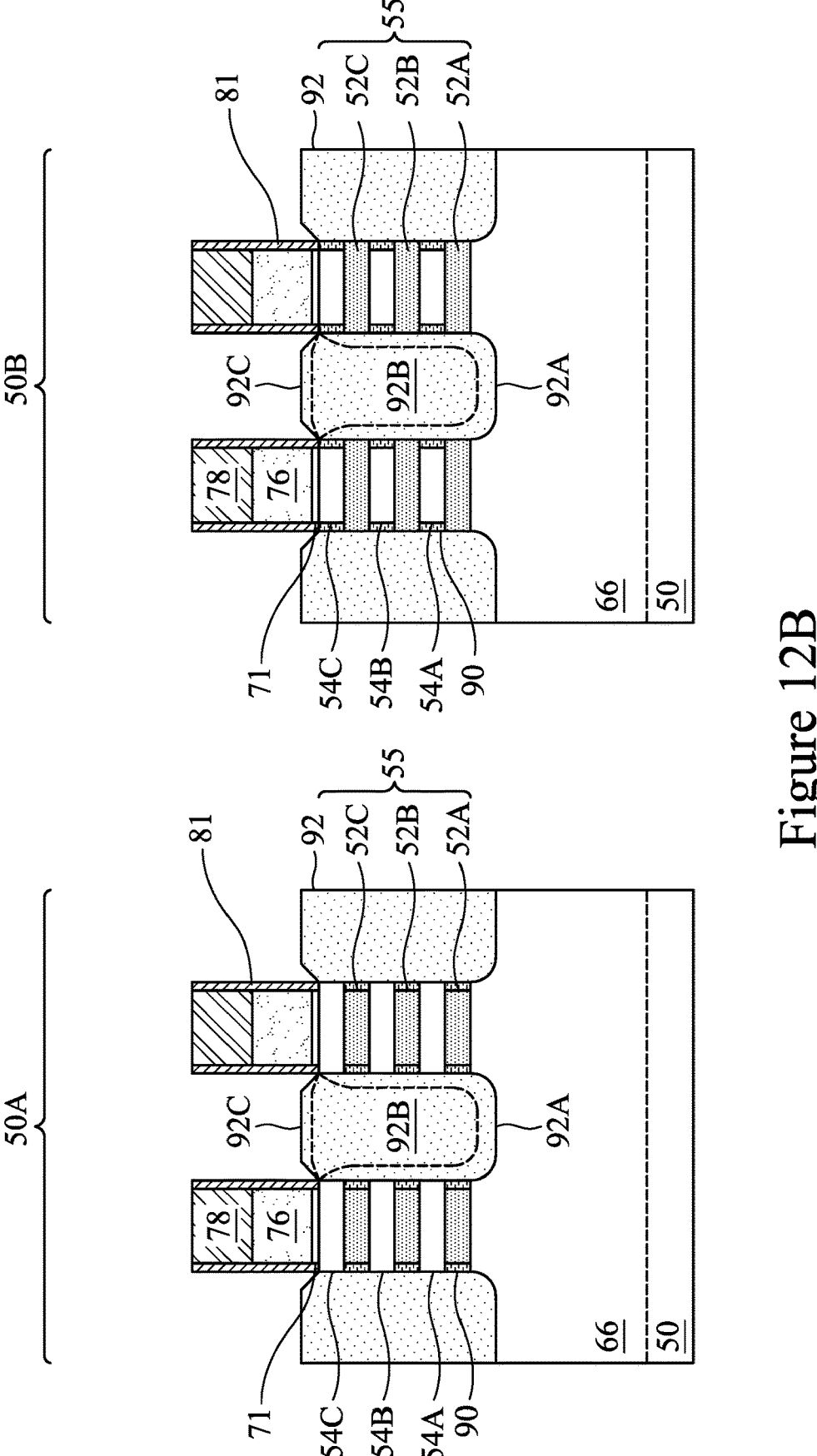
Figure 12C:
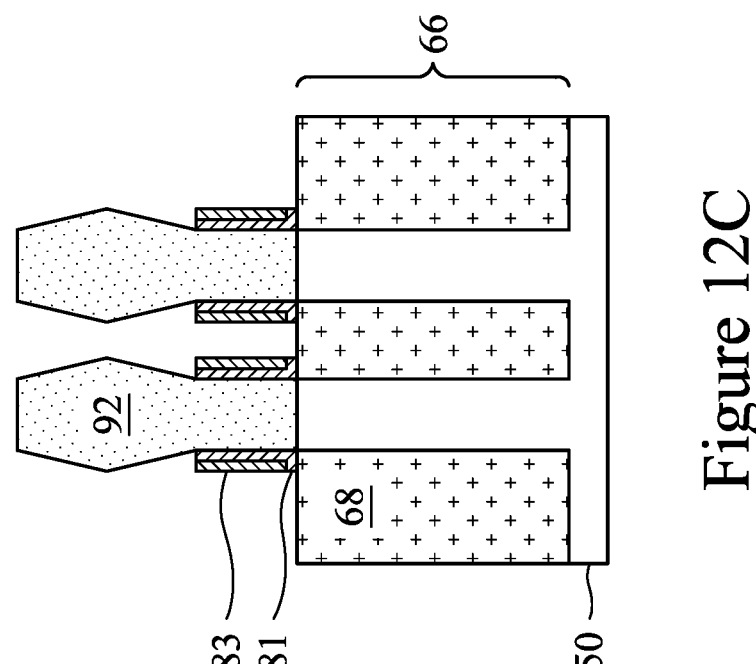

In FIGS. 12A-12C, epitaxial source/drain regions 92 are formed in the first recesses 86. In some embodiments, the epitaxial source/drain regions 92 may exert stress on the second nanostructures 54 in the first region 50A and the second region 50B, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 may include any acceptable material, such as appropriate for the n-type or p-type device. For example, when n-type devices are formed, the epitaxial source/drain regions 92 may include materials exerting a tensile strain in the channel regions, such as silicon, SiC, SiCP, SiP, or the like. Likewise, when p-type devices are formed, the epitaxial source/drain regions 92 may include materials exerting a compressive strain in the channel regions, such as SiGe, SiGeB, Ge, GeSn, or the like.

The epitaxial source/drain regions 92, the first nanostruc-tures 52, the second nanostructures 54, and/or the substrate 50 may be implanted with dopants to form source/drain regions, similar to the process previously discussed for forming lightly-doped source/drain regions, followed by an anneal process. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92, upper surfaces of the epitaxial source/drain regions 92 have facets which expand laterally outward beyond sidewalls of the nanostructures 55. In some embodiments, these facets cause adjacent epitaxial source/drain regions 92 of a same device to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68, thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semi-conductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
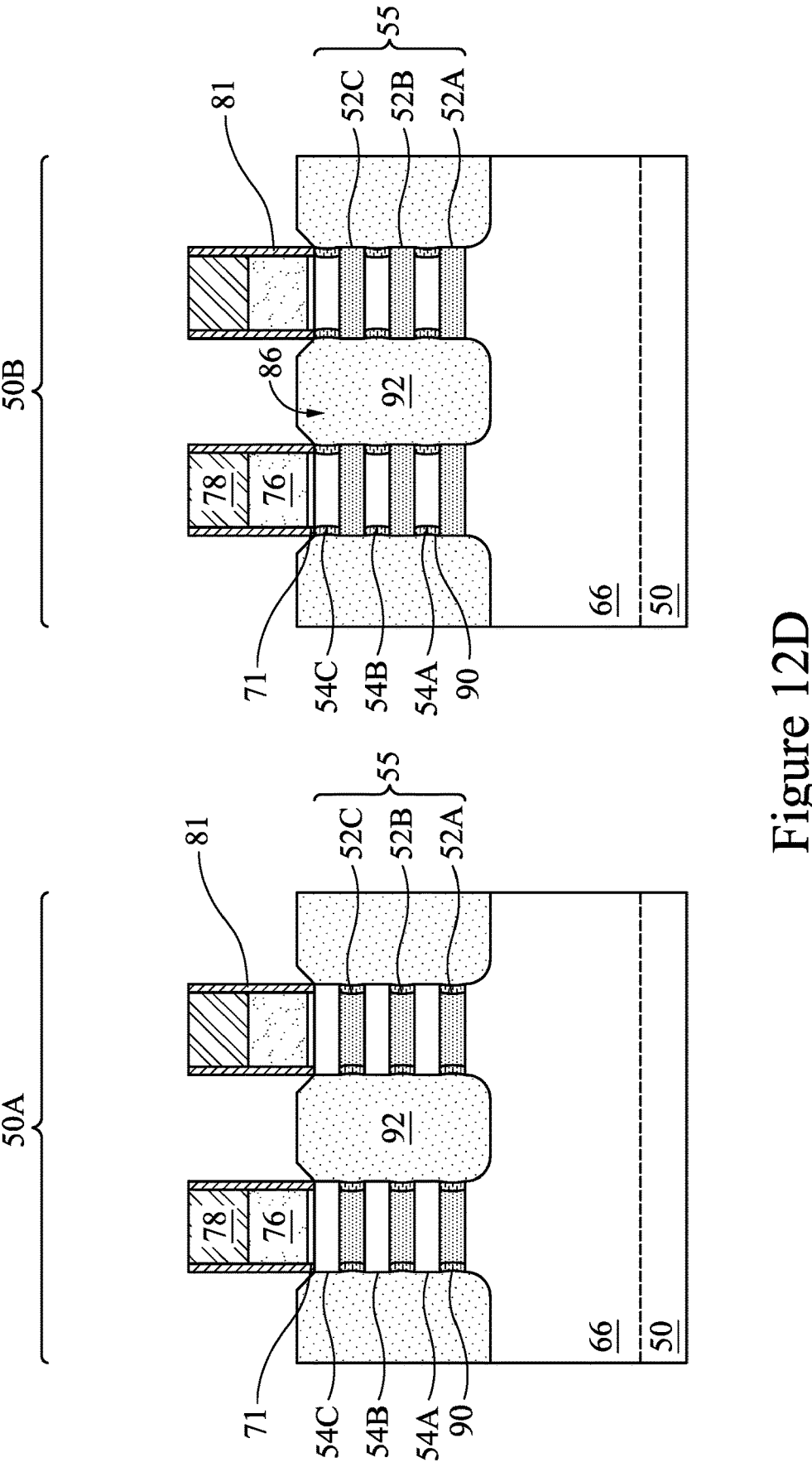

FIG. 12D illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12D, the epitaxial source/drain regions 92 may be formed in contact with the first inner spacers 90 and may extend past sidewalls of the second nanostructures 54.

Figure 13A:
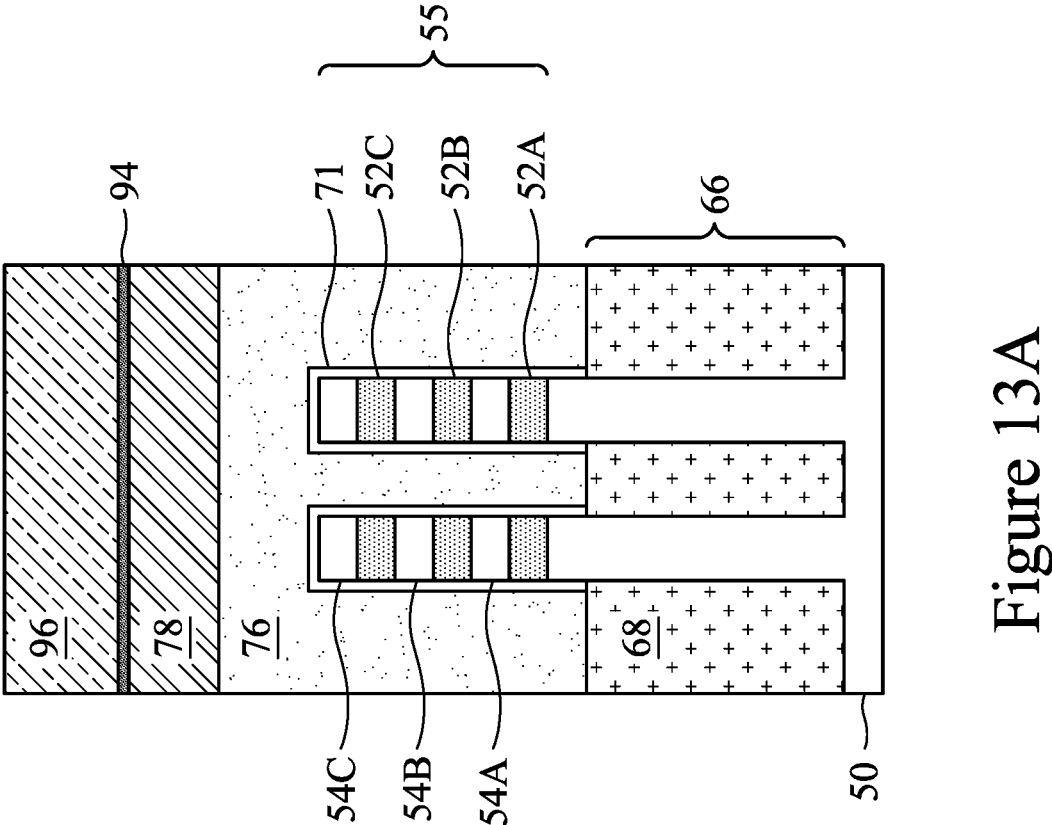
Figure 13B:
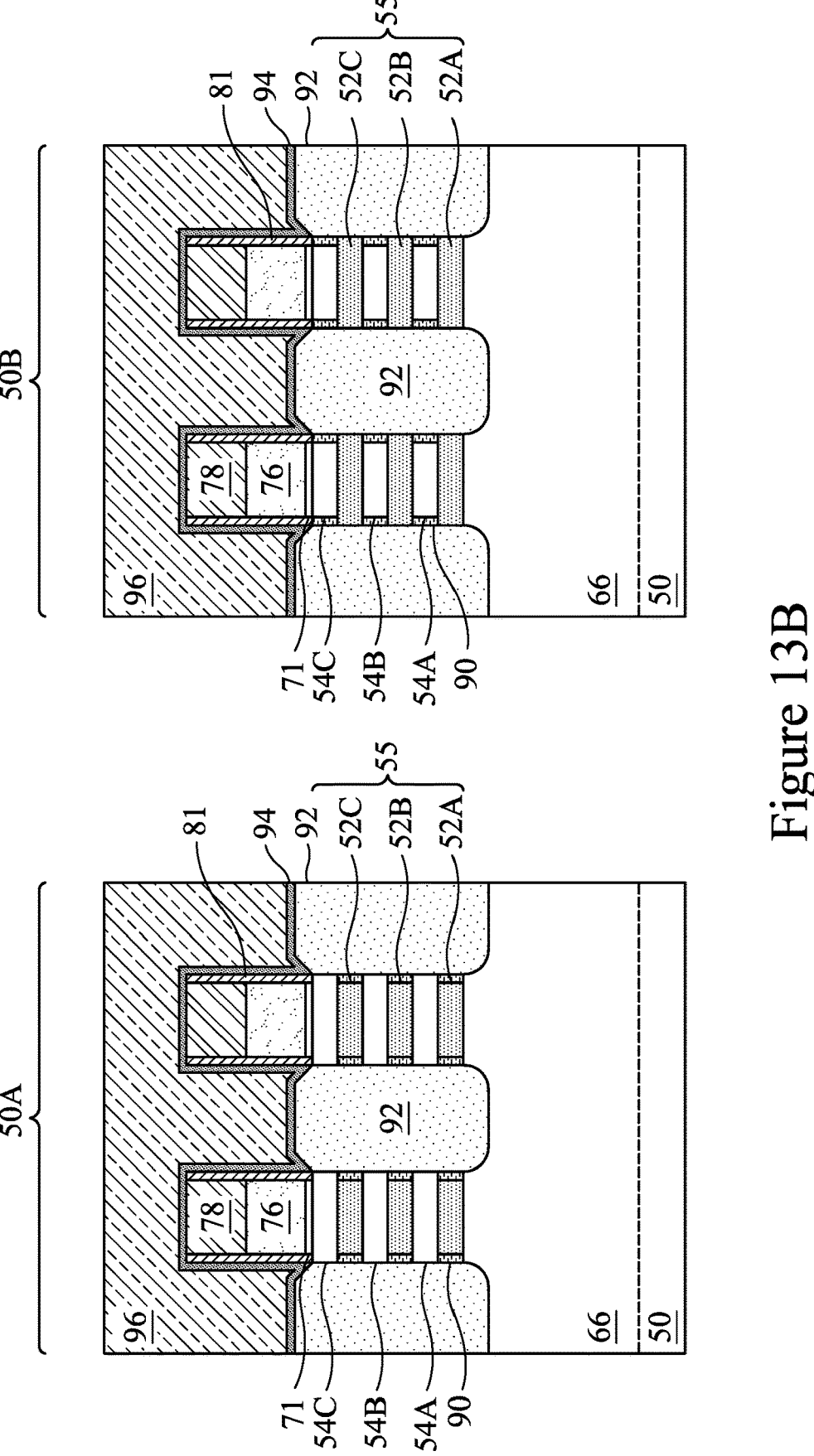
Figure 13C:
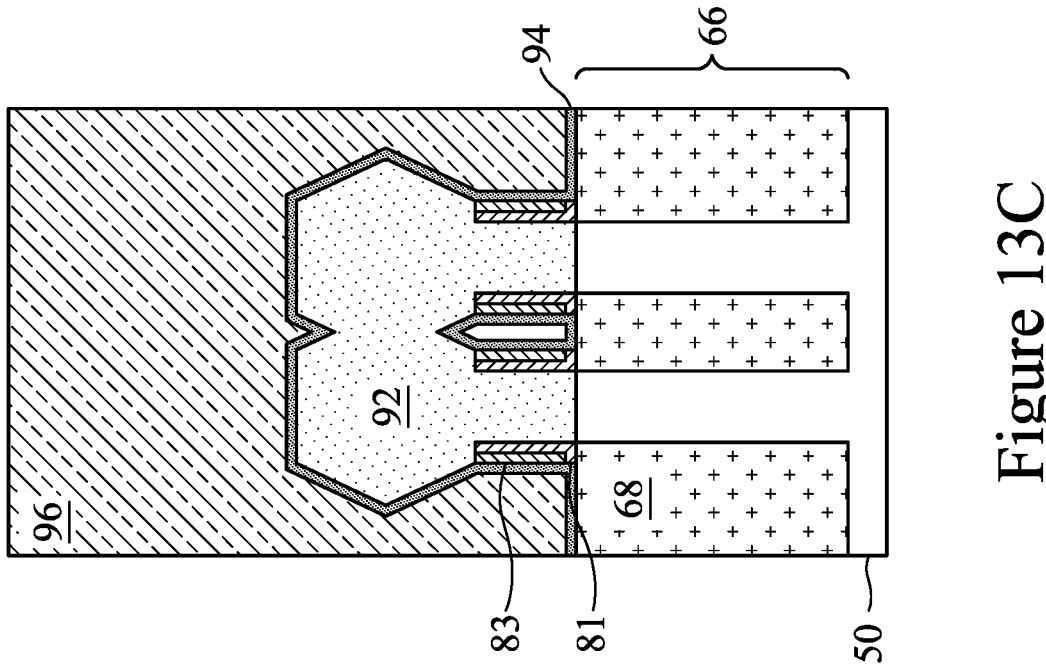

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as silicon nitride, silicon oxide, silicon oxynitride, or the like, having a different etch rate than the material of the first ILD 96.

Figure 14A:
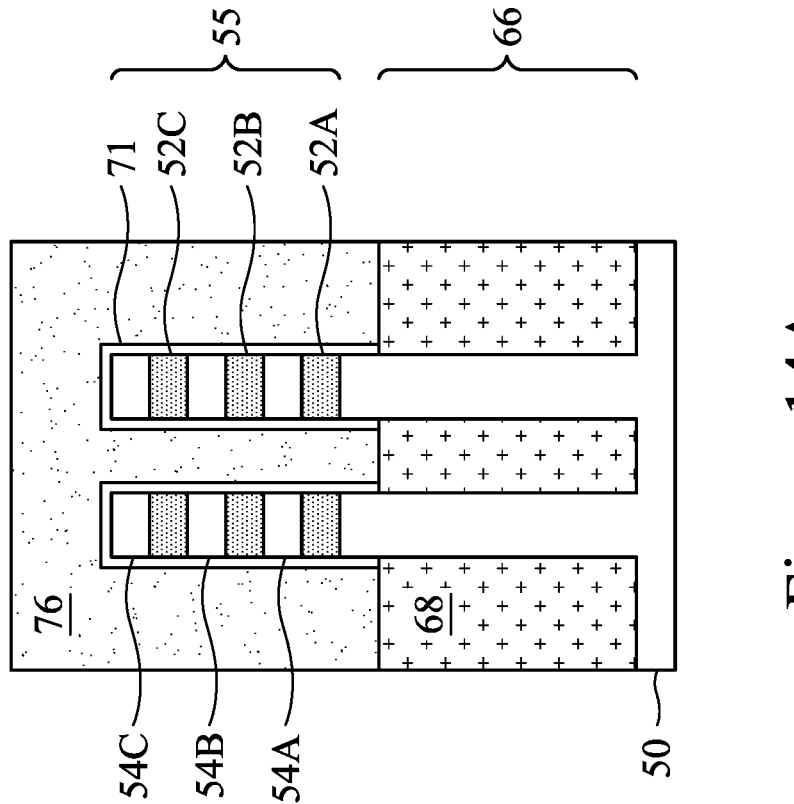
Figure 14B:
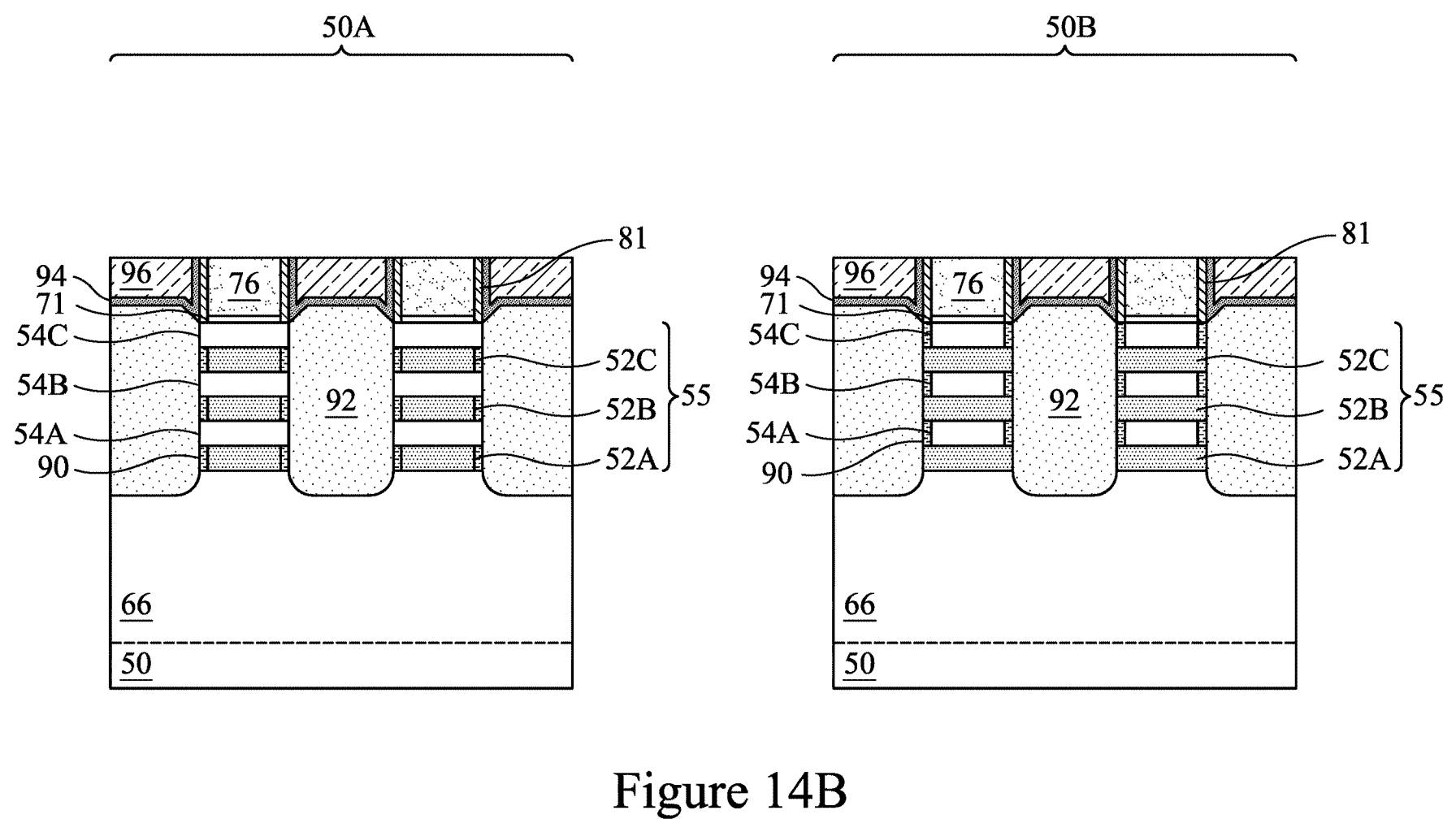

In FIGS. 14A and 14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with the top surface of the masks 78 and the first spacers 81.

Figure 15A:
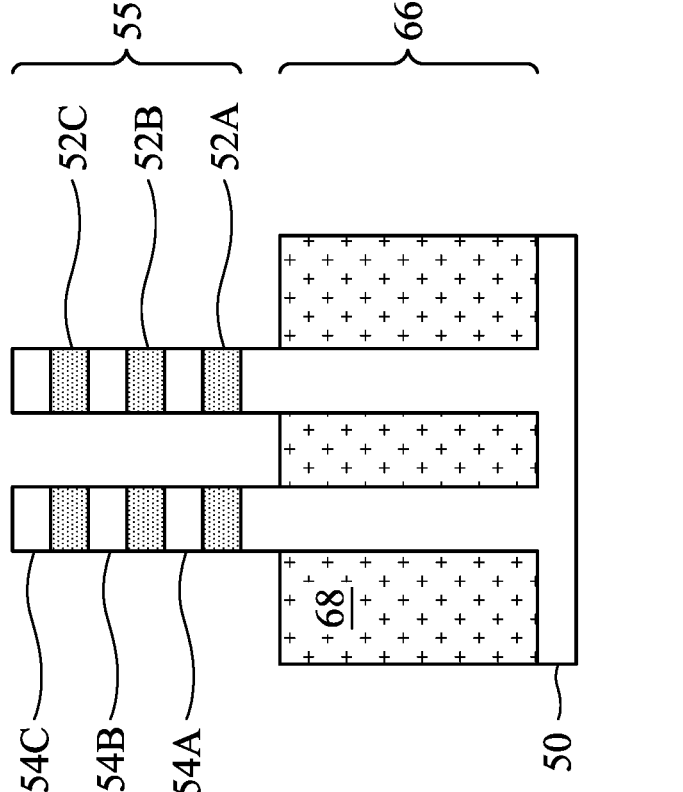
Figure 15B:
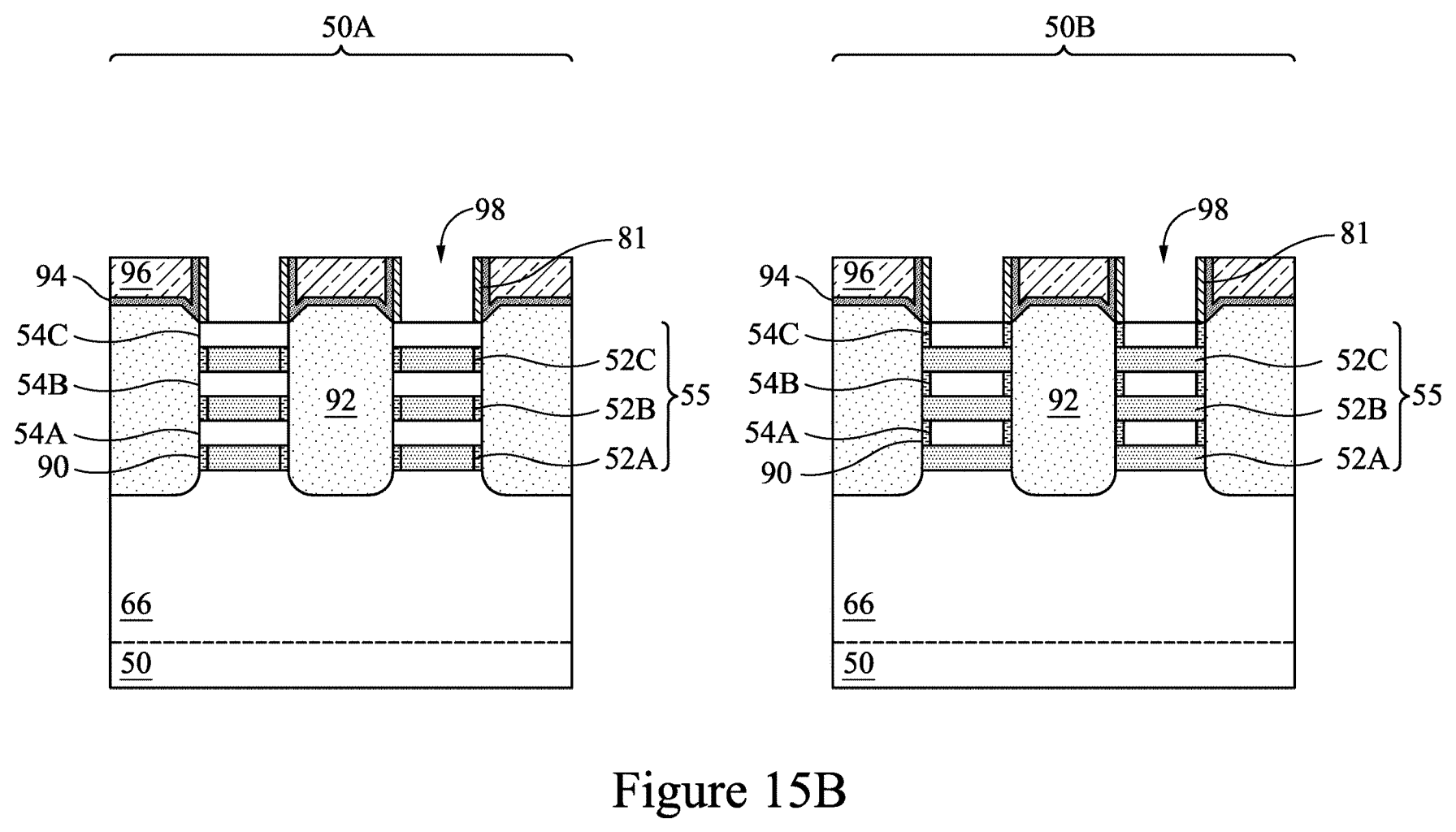

In FIGS. 15A and 15B, the dummy gates 76 and the masks 78 (if present), are removed in one or more etching steps so that second recesses 98 are formed. Portions of the dummy gate dielectrics 71 in the second recesses 98 are also removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55, which act as the channel regions, are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16A:
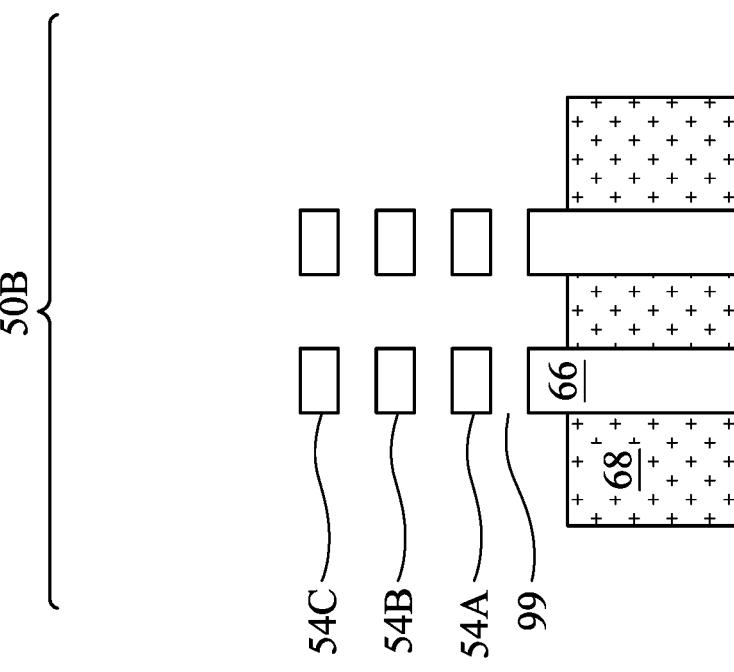
Figure 16A:
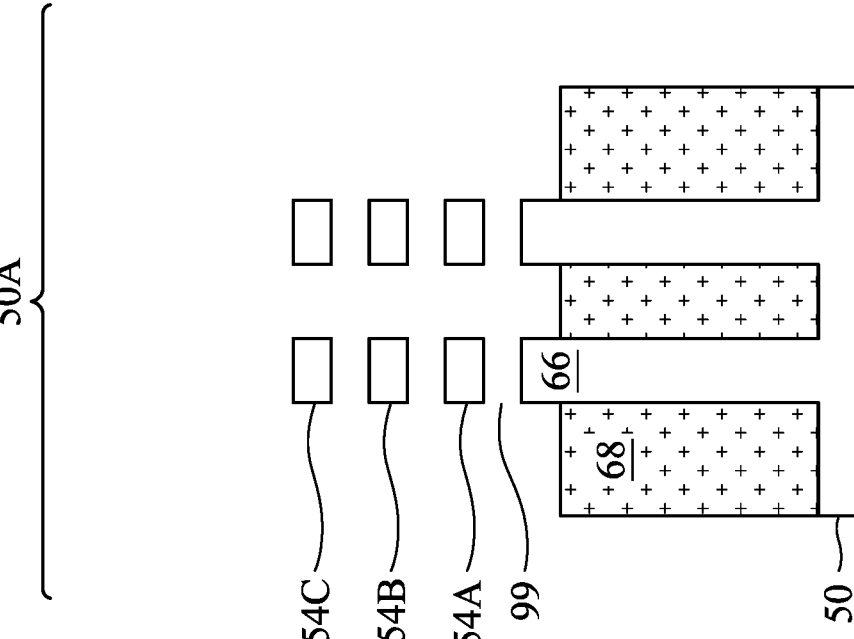
Figure 16B:
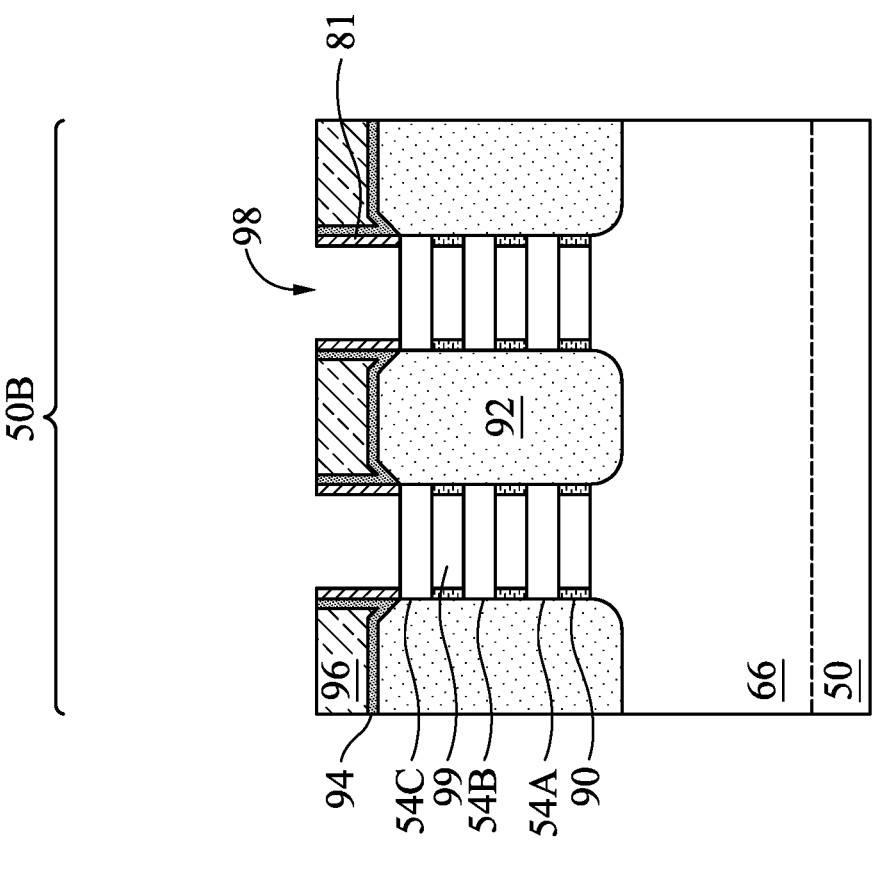
Figure 16B:
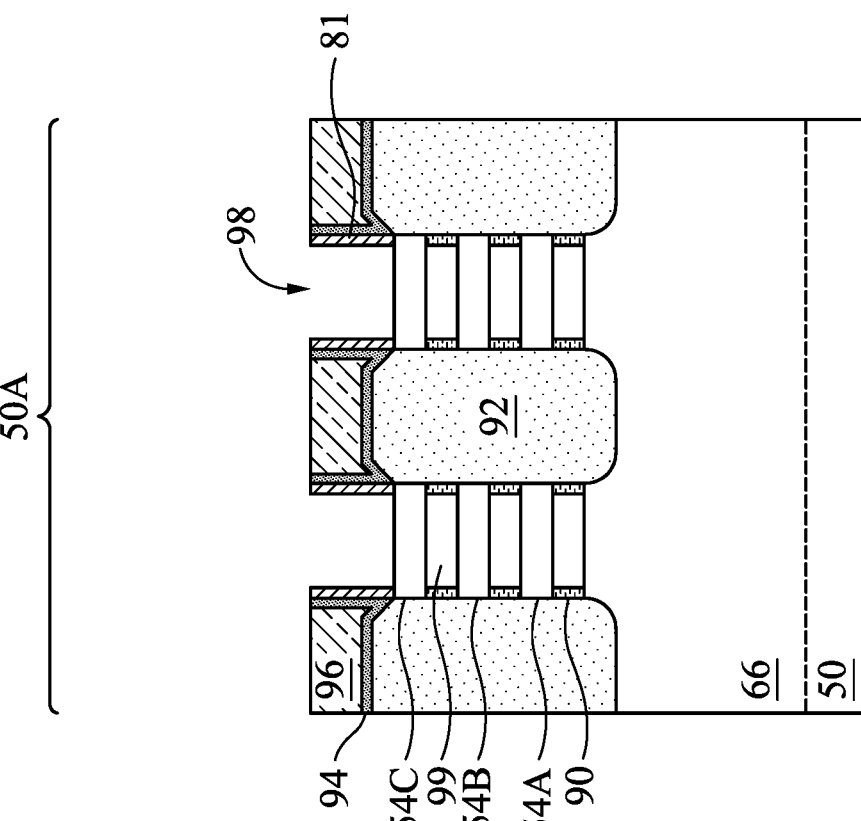

In FIGS. 16A and 16B, the first nanostructures 52 in the first region 50A and the second region 50B are removed, thereby forming openings 99 between the second nanostructures 54 and/or the fins 66. The first nanostructures 52 may be removed by an isotropic etching process such as wet etch or the like using etchants which are selective to the materials of the first nanostructures 52, while the second nanostructures 54, the substrate 50, the STI regions 68 remain relatively unetched as compared to the first nanostructures 52. In some embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52. In some embodiments in which the first nanostructures 52 include, e.g., Si or SiC, and the second nanostructures 54 include, e.g., SiGe, hydrogen fluoride, another fluorine-based etchant, or the like may be used to remove the first nanostructures 52.

In other embodiments, the first nanostructures 52 in the first region 50A and the second region 50B may comprise different materials and may be removed separately, for example, by forming a mask in the first region 50A and performing an isotropic process such as wet etch or the like using etchants which are selective to the materials of the second nanostructures 54, while the first nanostructures 52, the substrate 50, the STI regions 68 remain relatively unetched as compared to the second nanostructures 54. The first nanostructures 52 in the first region 50A may be removed by forming a mask in the second region 50B and performing an isotropic process such as wet etch or the like using etchants which are selective to the materials of the first nanostructures 52, while the second nanostructures 54, the substrate 50, the STI regions 68 remain relatively unetched as compared to the first nanostructures 52. FIGS. 36A, 36B, and 36C illustrate a structure resulting from such embodiments where the channel region in the first region 50A is provided by the second nanostructures 54 and comprises silicon or silicon carbide, and the channel region in the second region 50B is provided by the first nanostructures 52 and comprise silicon germanium, for example.

Figure 17A:
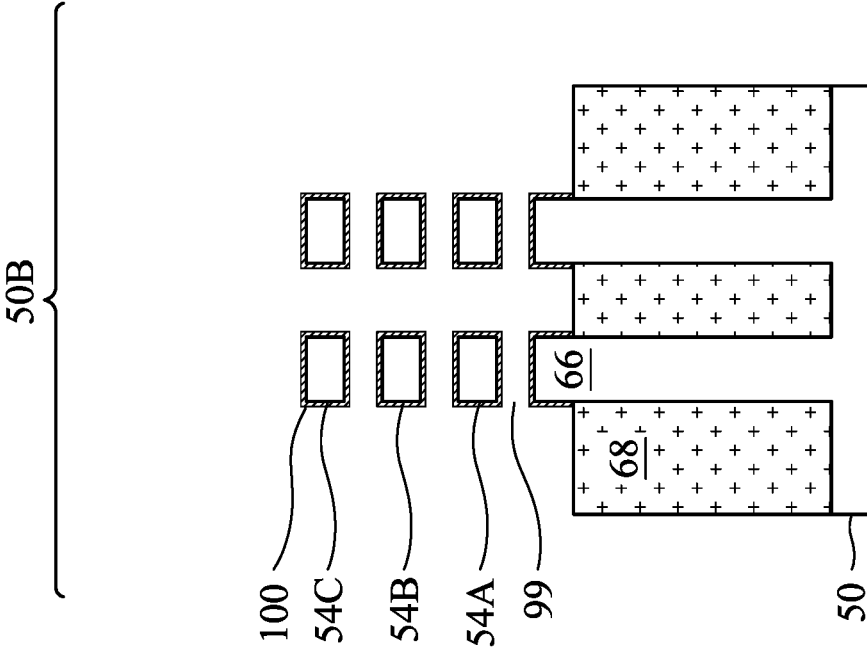
Figure 17A:
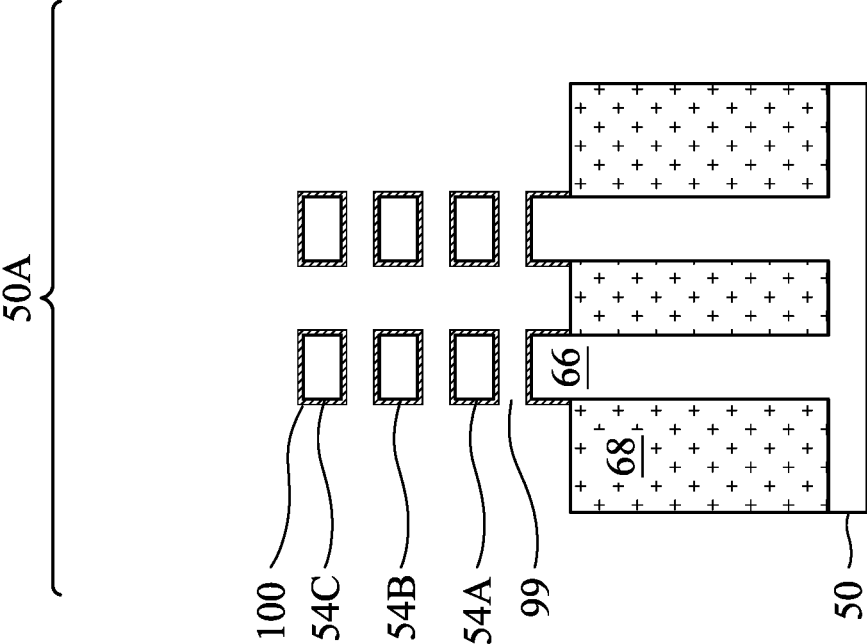
Figure 17B:
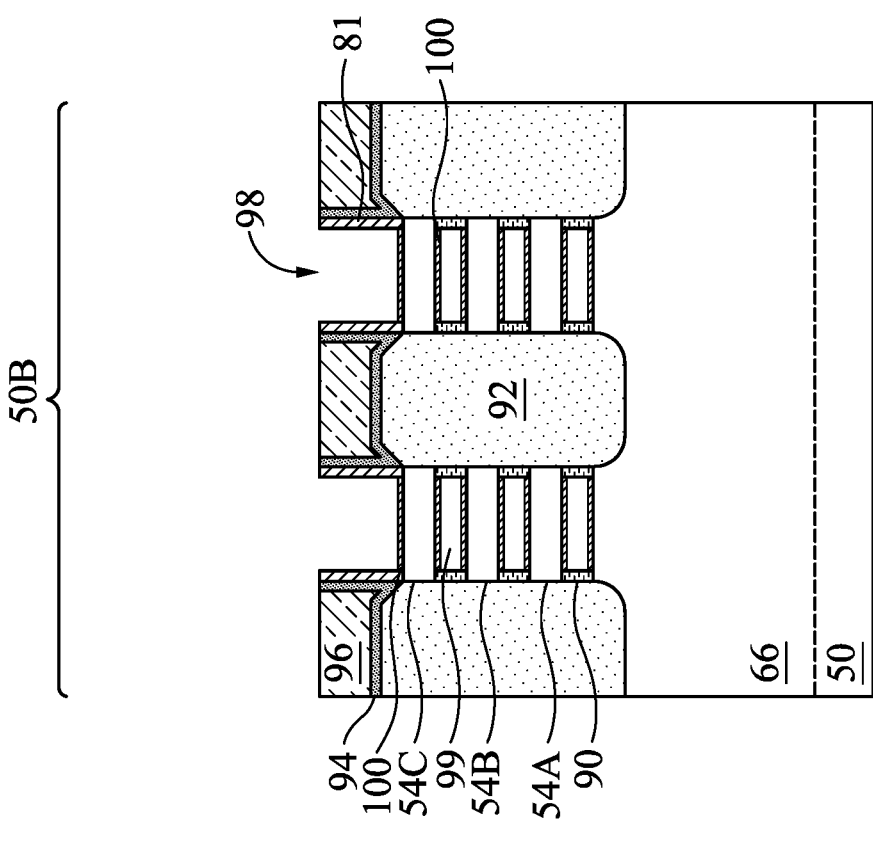
Figure 17B:
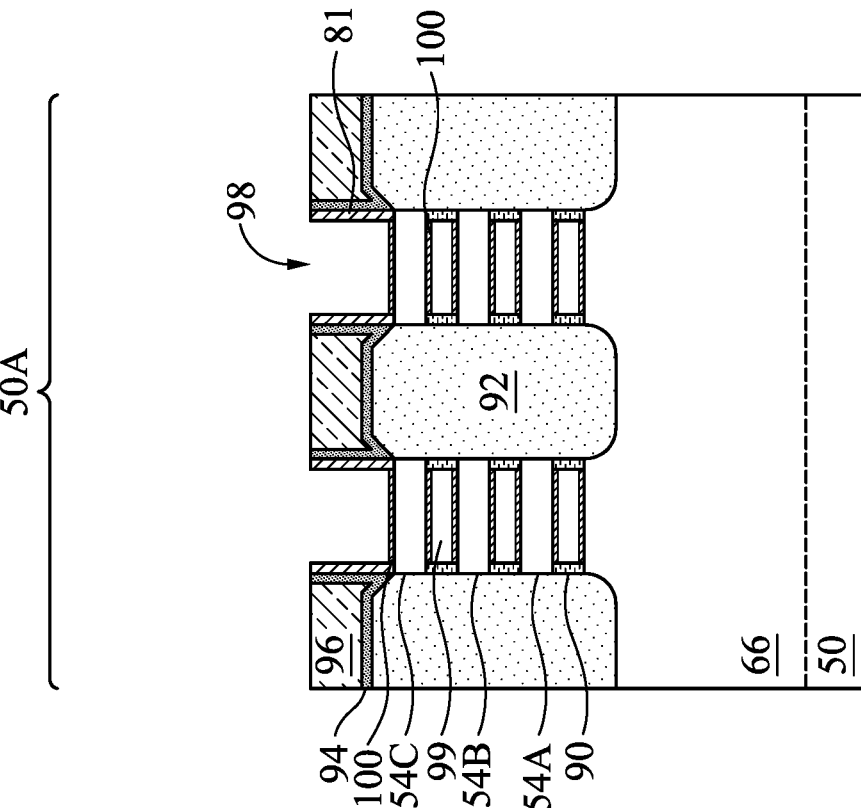

Replacement gates are formed in the second recesses 98 and the openings 99. In FIGS. 17A and 17B, an interfacial layer 100 is formed over exposed surfaces of the second nanostructures 54 and the fins 66 in accordance with some embodiments. The interfacial layer 100 may include silicon oxide. The interfacial layer 100 may have a thickness of about 10 angstroms to about 30 angstroms. In some embodiments, chemical oxidization using an oxidizing agent such as SPM (a mixture of H$_2$SO$_4$ and H$_2$O$_2$), SC1 (a mixture of NH$_4$OH and H$_2$O$_2$), or ozone-deionized water (a mixture of O$_3$ and deionized water) is performed to oxidize exterior portions of the second nanostructures 54 and the fins 66. In some embodiments, to form the interfacial layer 100, a thermal oxidization is performed by treating (e.g., soaking) the second nanostructures 54 and the fins 66 in an oxygen-containing gas source, where the oxygen-containing gas source includes, e.g., N$_2$O, O$_2$, a mixture of N$_2$O and H$_2$, or a mixture of O$_2$ and H$_2$, as examples. The thermal oxidization may be performed at a temperature between about 500° C. and about 1000° C. Note that in the illustrated embodiments, the interfacial layer 100 is formed by oxidizing the exterior portions of the second nanostructures 54 and the fins 66 into an oxide, and therefore, the interfacial layer 100 is selectively formed over the exposed surfaces of the second nanostructures 54, and the fins 66, and is not formed over other surfaces, such as the sidewalls of the first inner spacers 90 and the first spacers 81.

Figure 18A:
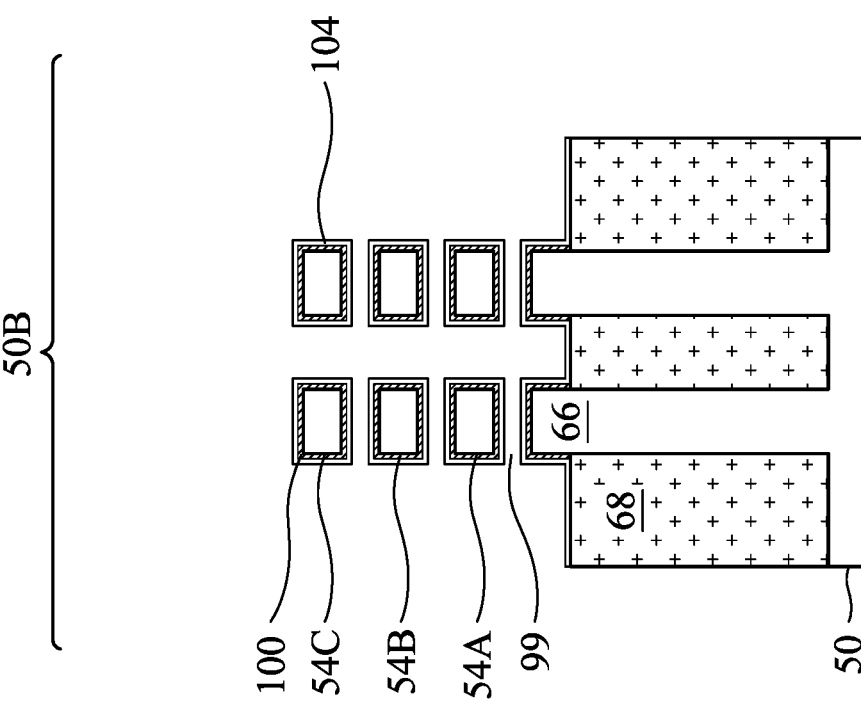
Figure 18A:
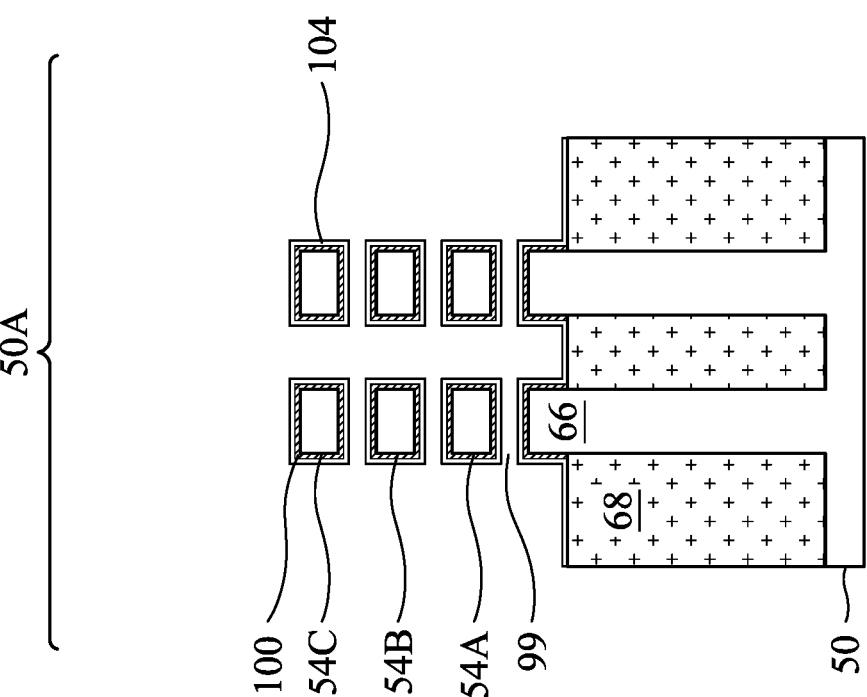
Figure 18B:
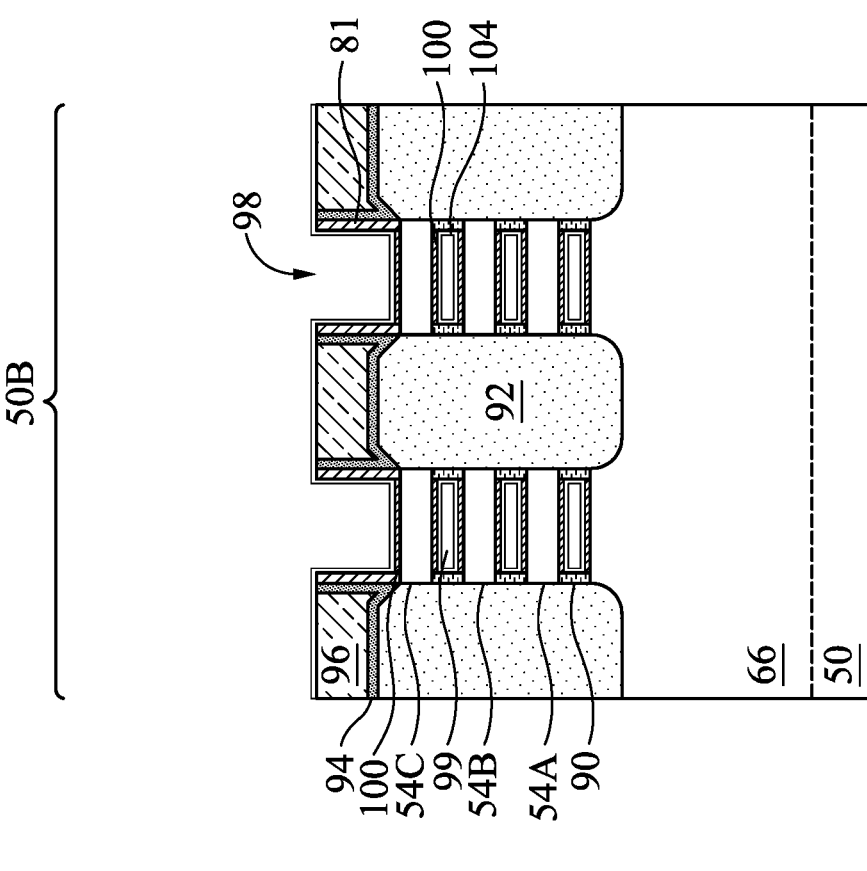
Figure 18B:
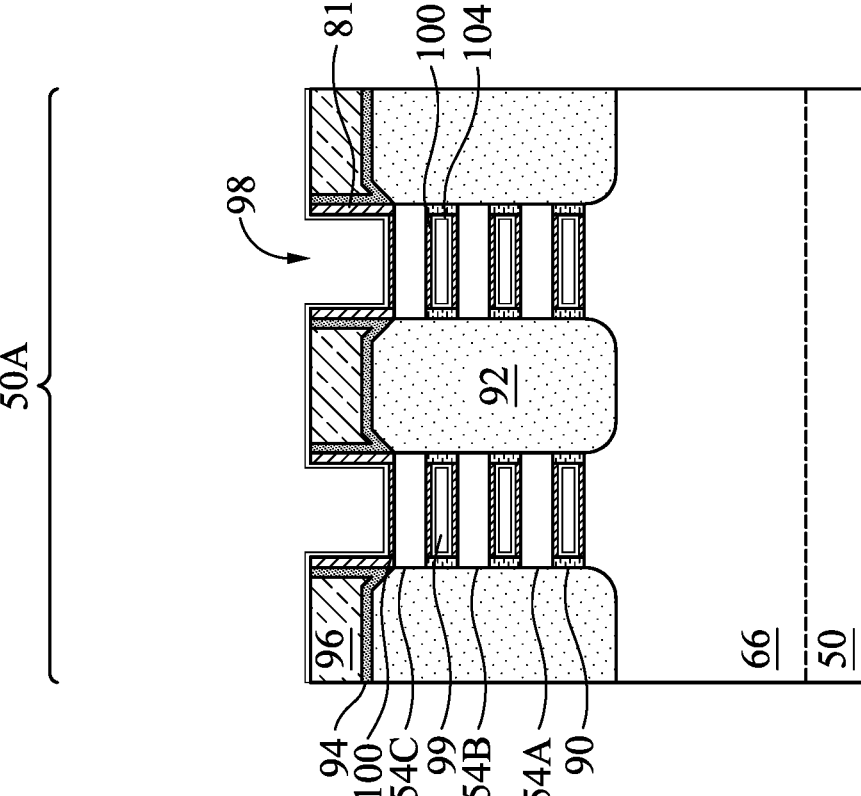

In FIGS. 18A and 18B, a dielectric layer 104 is formed in the second recesses 98 and the openings 99 in the first region 50A and the second region 50B, in accordance with some embodiments. The dielectric layer 104 may be conformally deposited over the interfacial layer 100 (e.g., wrapping around the second nanostructures 54), along sidewalls of the first spacers 81, and along the upper surface of the first ILD 96. In an example embodiment, the dielectric layer 104 may be a high-k material, for example, having a dielectric constant higher than 7.0 and may include metal oxide or metal silicate. For example, the dielectric layer 104 may include the oxide or the silicate of Hf, Zr, or the like, or a combination thereof. The dielectric layer 104 may have a thickness of about 5 angstroms to about 30 angstroms. The formation methods of the dielectric layer 104 may include Molecular-Beam Deposition (MBD), ALD, PECVD, or the like. In some embodiments, the dielectric layer 104 is formed by ALD at a temperature between about 200° C. and about 400° C.

Figure 37:
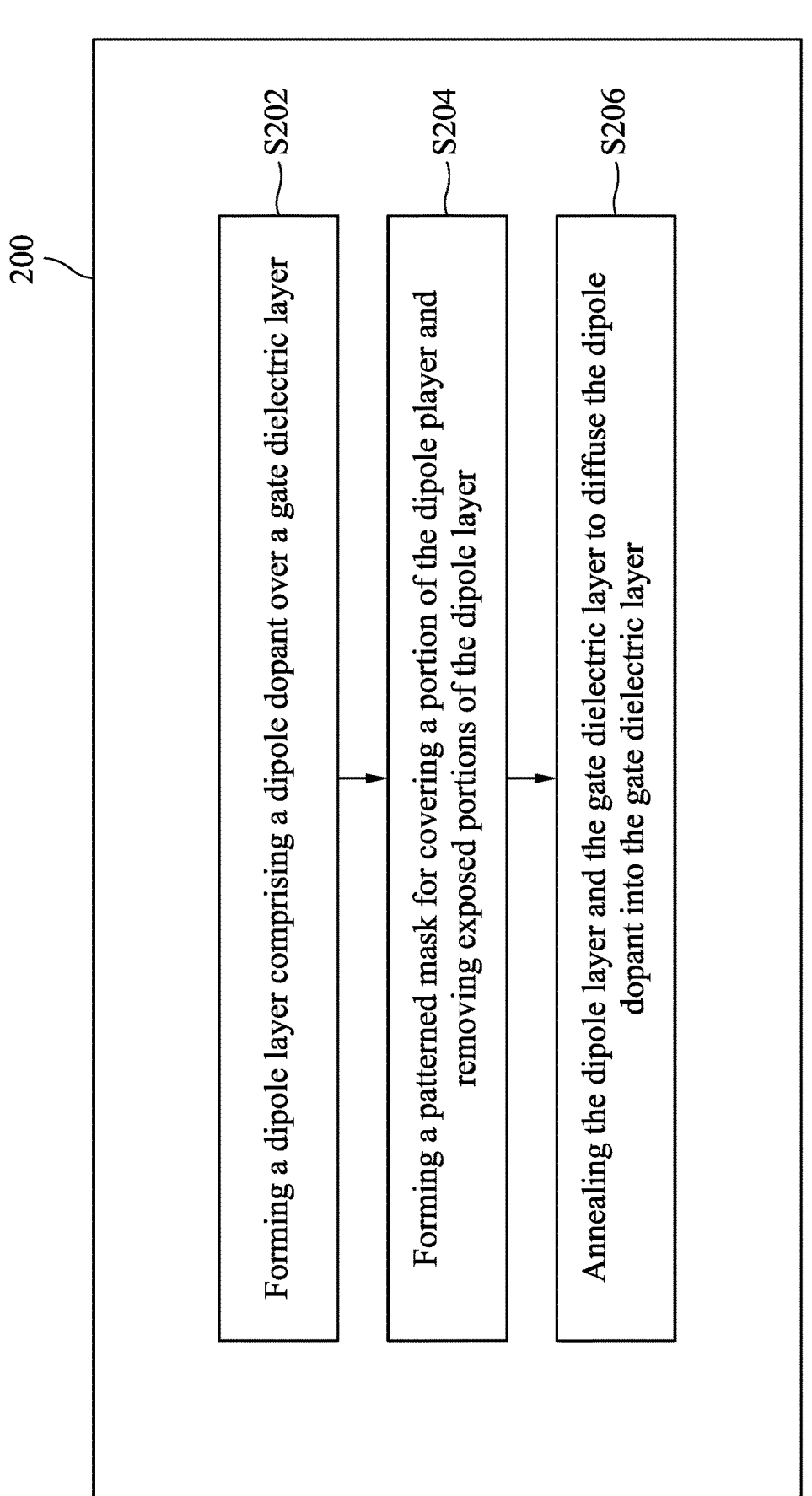
FIG. 37 is a flow chart of a doping loop of doping a dipole dopant material into a gate dielectric layer, in accordance with some embodiments.

Next, multiple doping loops (e.g., the doping loop 200 as illustrated in FIG. 37 may be performed one or more times) may be performed to dope one or more dipole dopant materials into a respective gate dielectric layer in one or more device regions. The dipole dopant materials may create differentials in the electrical potential of gate structures and thus may affect the threshold voltages Vt of the gate structures. In some embodiments, a gate dielectric layer may be doped with two or more dipole dopant materials by performing the doping loop two or more times. Doping two or more dipole dopant materials in the gate dielectric layer may provide more combinations to fine-tune the threshold voltage Vt of a gate structure than doping single dipole dopant material. In some embodiments, each of the doping loops is individual to each other, for example, including individual dipole layer formation and anneal process, and the concentration (e.g., sufficient amounts) and concentration profiles of each dipole material in the respective gate dielectric layer may be individually controlled.

Figure 19A:
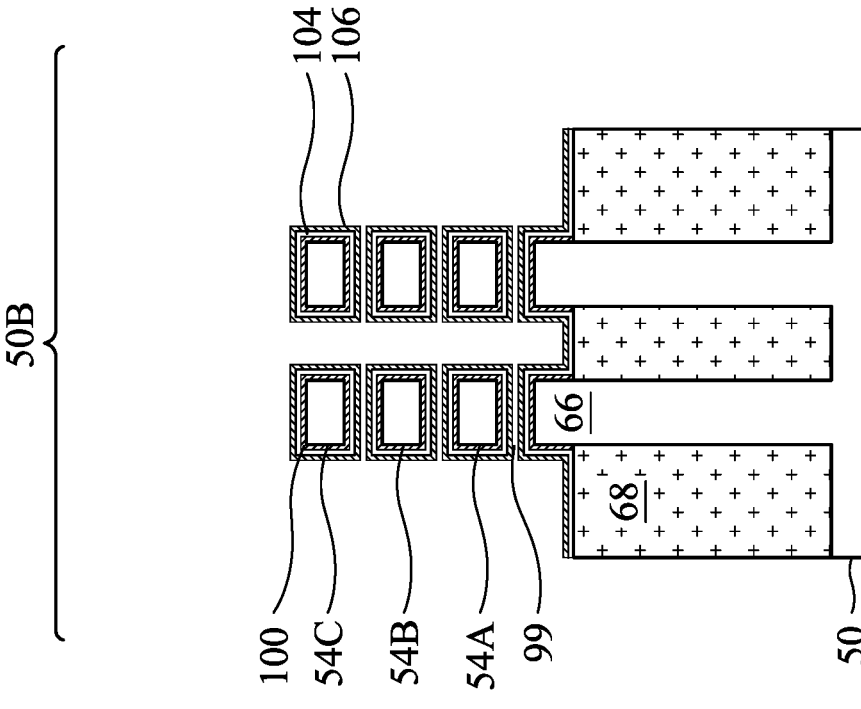
Figure 19A:
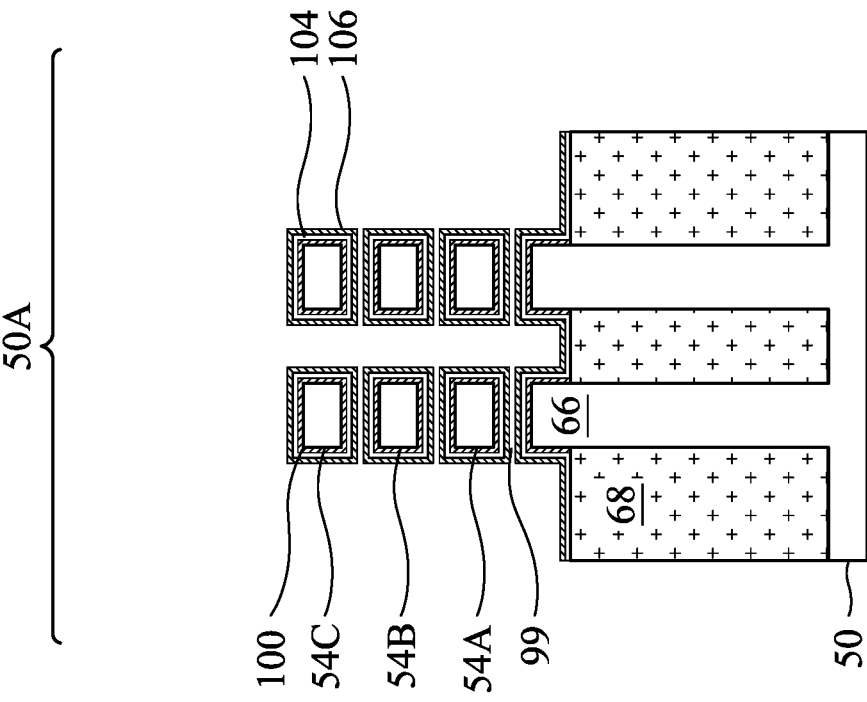
Figure 19B:
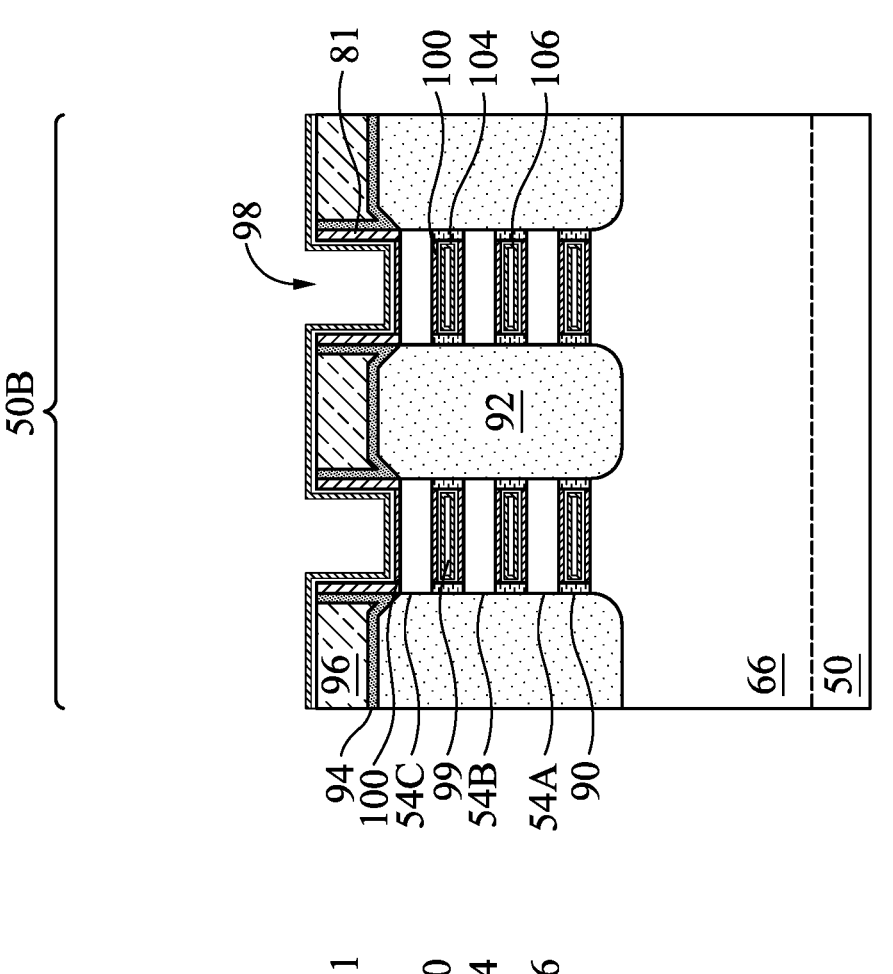
Figure 19B:
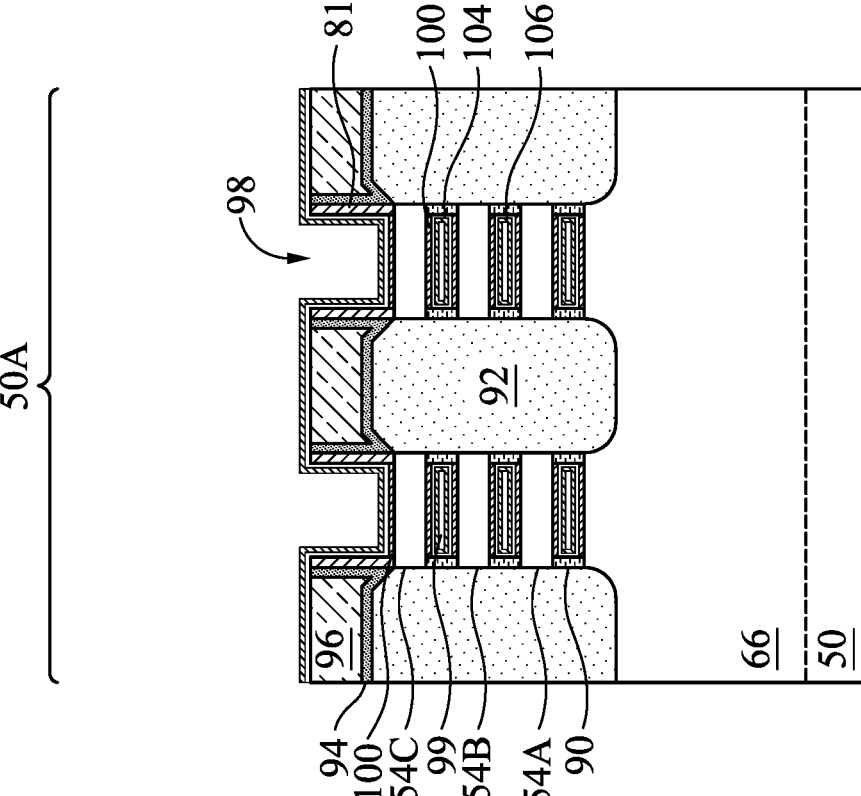

Referring to FIGS. 19A to 21C, a first doping loop (e.g., the doping loop 200 as illustrated in FIG. 37) is performed to form a doped dielectric layer 112 (see below, FIGS. 21A and 21B) in the first region 50A. In FIGS. 19A and 19B, step S202 is performed. A first dipole layer 106 is conformally formed over the dielectric layer 104 in accordance with some embodiments. The first dipole layer 106 may be an oxide or a nitride of a first dipole dopant. In some embodiments, the first dipole layer 106 may include $La_2O_3$, MgO, SrO, $Y_2O_3$, or the like, and the first dipole dopant in the first dipole layer 106 may be an n-type dipole dopant material such as La, Mg, Sr, Y, an element having an electronegativity smaller than Hf, or the like. In some embodiments, the first dipole layer 106 may include $TiO_2$, $Al_2O_3$, AlN, $Ga_2O_3$, $In_2O_3$, $Nb_2O_5$, $ZnO_2$, or the like, and the first dipole dopant in the first dipole layer 106 may be a p-type dopant material such as Ti, Al, Ga, In, Nb, Zn, an element having an electronegativity greater than Hf, or the like. The dipole dopant material doped in a gate dielectric layer may form dipole moments with the material of the interfacial layer 100, thereby creating differentials in the electrical potential of the overall gate structure, and thus the threshold voltage Vt of the gate structure may be adjusted. The n-type dipole dopant may decrease the threshold voltage Vt of a gate structure (for either an NMOS device or a PMOS device), and the p-type dipole dopant may increase the threshold voltage Vt of a gate structure (for either an NMOS device or a PMOS device). The first dipole layer 106 may be formed any suitable deposition methods such as ALD or CVD. A thickness of the first dipole layer 106 may be less than about 1 nm, for example, between about 1 angstrom and about 9 angstroms.

Figure 20A:
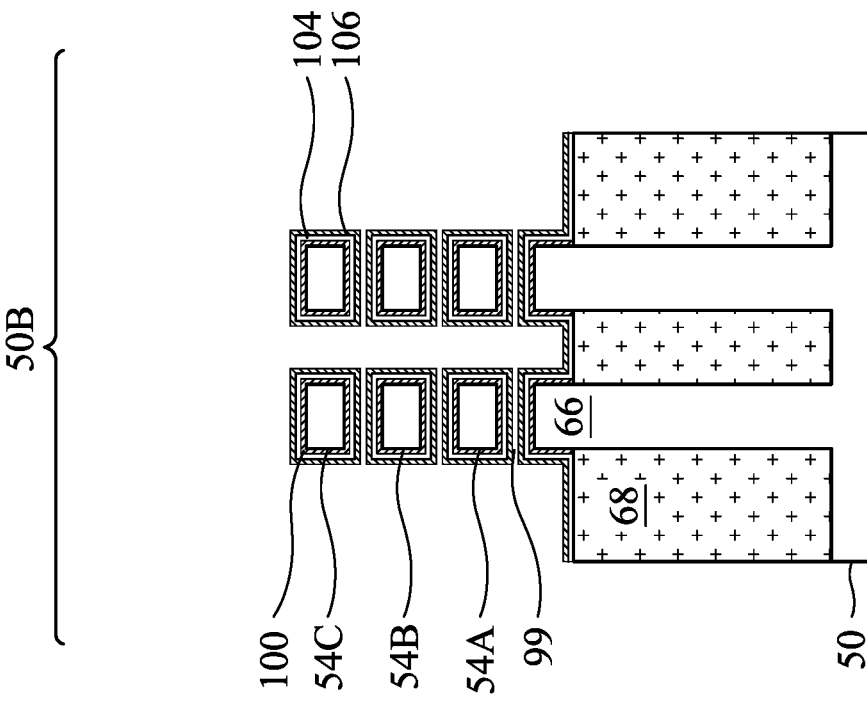
Figure 20A:
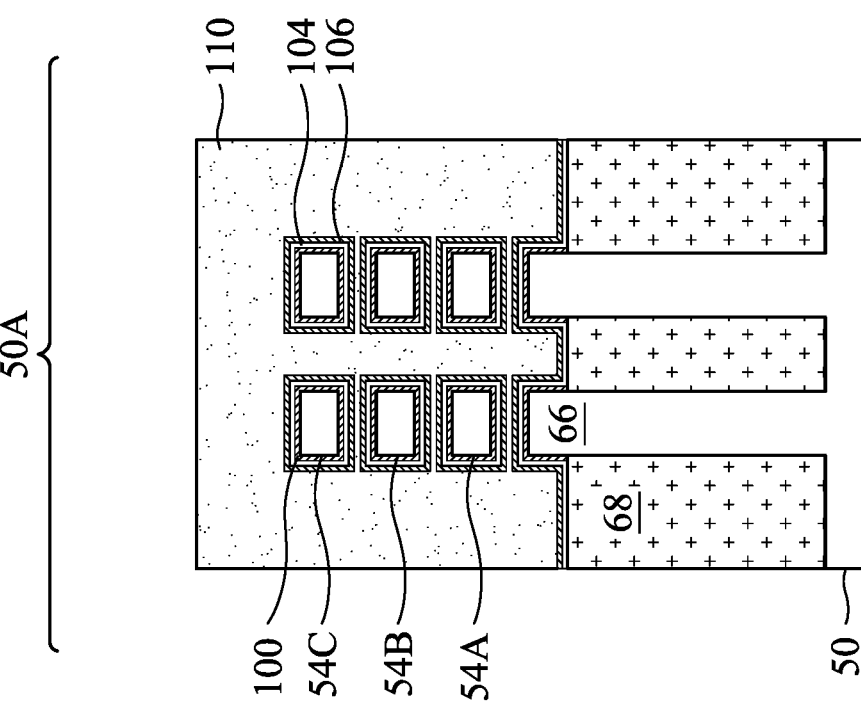
Figure 20B:
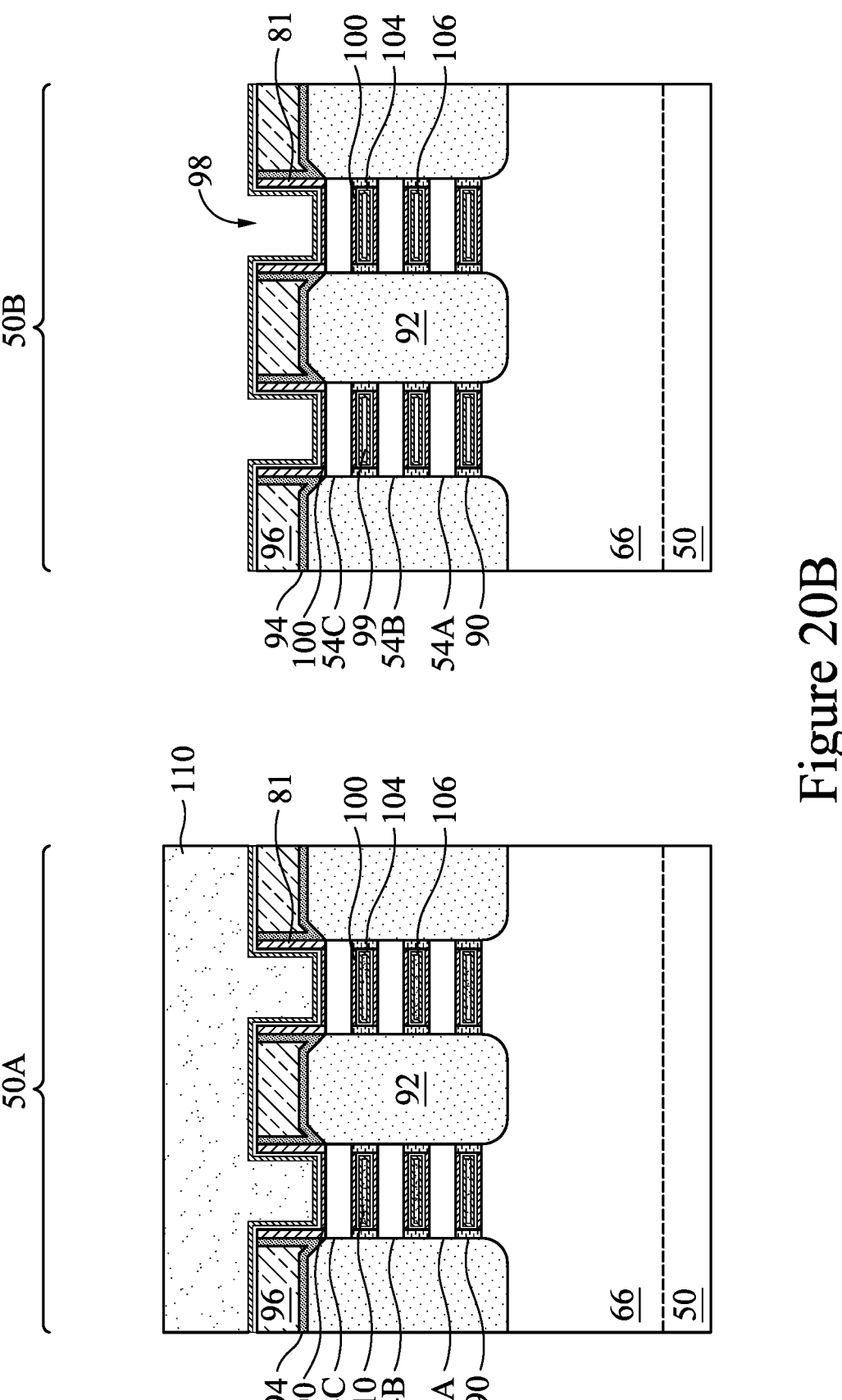

In FIGS. 20A and 20B, step S204 is performed. A patterned mask 110 is formed to cover the first region 50A and expose the second region 50B, and the first dipole layer 106 is removed in the second region 50B in accordance with some embodiments. For example, the patterned mask 110 is formed and patterned to expose the first dipole layer 106 in the second region 50B while shielding (e.g., protecting) the first dipole layer 106 in the first region 50A from removal. In some embodiments, the patterned mask 110 is formed by a mask layer covering the first dipole layer 106 in the first region 50A and the first dipole layer 106 in the second region 50B, and removing the mask layer to expose the first dipole layer 106 in the second region 50B. The mask layer may be patterned using a photoresist layer formed over the mask layer in the first region 50A and the second region 50B and patterning the photoresist layer such that portions of the photoresist layer disposed in the second region 50B are removed to expose portions of the mask layer in the second region 50B. Portions of the mask layer in the second region 50B are then etched, thereby forming the patterned mask 110 as illustrated in FIGS. 20A and 20B. The photoresist layer is removed after the mask layer in the second region 50B is removed by an ashing process and/or a wet clean process. The patterned mask 110 may include an oxide layer (e.g., $TiO_2$, $SiO_2$, $Al_2O_3$), a nitride layer (e.g., TiN), an organic bottom anti-reflective coating (BARC), or a combination thereof. In some embodiments, the patterned mask 110 may be omitted, and the first dipole layer 106 in the first region 50A may be protected directly by a patterned photoresist layer while removing the first dipole layer 106 in the second region 50B.

The first dipole layer 106 in the second region 50B is removed by a suitable etching process, such as a wet etch. After the first dipole layer 106 in the second region 50B is removed, the patterned mask 110 may be removed by a suitable process, for example, by a wet etch process that uses an etchant having a higher etch rate for the material of the patterned mask 110 than etch rates of the materials of the dielectric layer 104 and the first dipole layer 106.

Figure 21A:
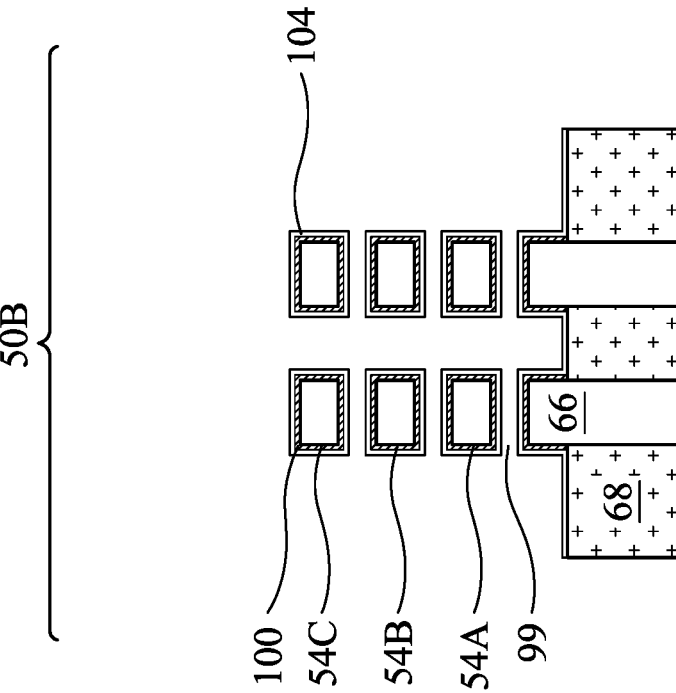
Figure 21A:
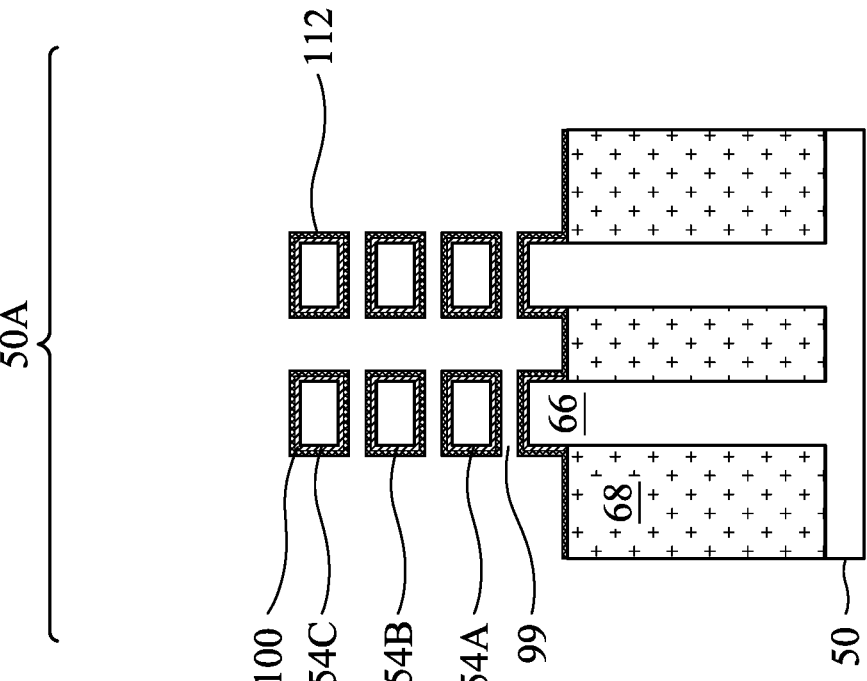
Figures 21B, 21C:
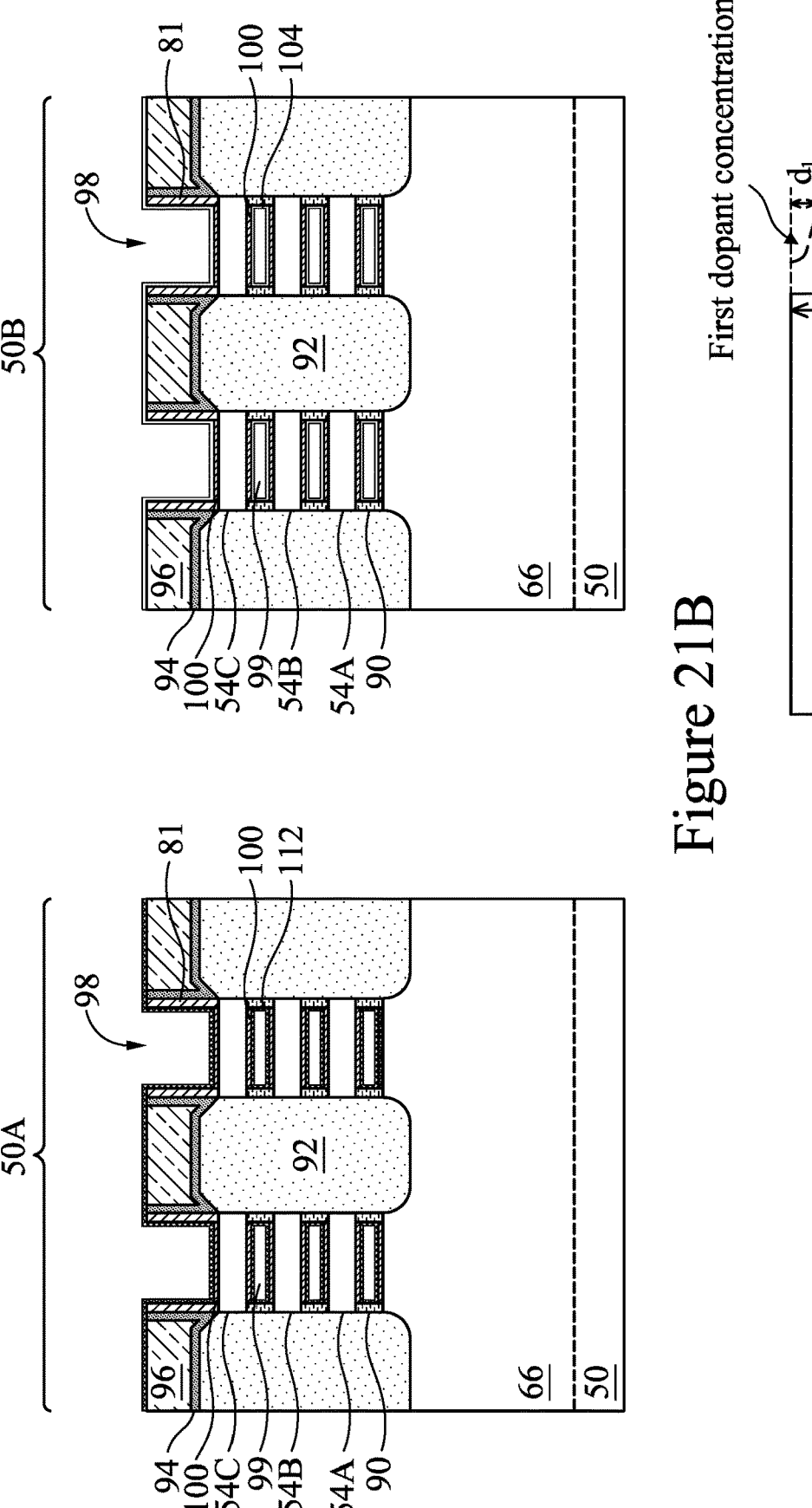

In FIGS. 21A and 21B, step S206 is performed. A first anneal process is performed to diffuse the first dipole dopant in the first dipole layer 106 into the dielectric layer 104, thereby forming a doped dielectric layer 112 in the first region 50A in accordance with some embodiments. In some embodiments, the first anneal process is a soak anneal. The soak anneal may include applying a fixed temperature of about 450° C. to about 950° C. for about 5 seconds to 300 seconds in an ambient environment of $N_2$, $NH_3$, $O_2$, $N_2O$, or a combination thereof. In some embodiments, the first anneal process may be a spike anneal. The spike anneal may include applying a fixed temperature of about 450° C. to about 750° C. for about 5 seconds to about 120 seconds and rapidly raising the temperature to a peak temperature of about 1050° C. and sustaining the peak temperature in a short period, such as about 0.5 seconds to about 5 seconds, after which the temperature is rapidly reduced.

The first dipole dopant is dispersed in the doped dielectric layer 112. FIG. 21C illustrates a concentration profile of the first dipole dopant in the doped dielectric layer 112 along a thickness direction of the doped dielectric layer 112. As illustrated in FIG. 21C, the first dipole dopant may have a concentration peak at a depth $d_1$ from the upper surface of the doped dielectric layer 112. In an embodiment that the first dipole dopant is La, the depth $d_1$ is about 1 angstrom to about 20 angstroms, and a ratio between the depth $d_1$ and the thickness T of the doped dielectric layer 112 is about 0.1 to about 0.9. In some embodiments, sufficient amounts of the first dipole dopant may be in the doped dielectric layer 112 because the first dipole dopant is diffused from the first dipole layer 106 that is in direct contact with the dielectric layer 104 (e.g., no other interposing layers). In some embodiments, the doped dielectric layer 112 may have an average atomic concentration of the first dipole dopant of about 1E12 atoms/cm$^2$ to about 1E16 atoms/cm$^2$. After the first anneal process is applied, the remaining portions of the first dipole layer 106 in the first region 50A are removed. The first dipole layer 106 may be removed by a suitable etching method, for example, by a wet etch process that etches the first dipole layer 106 at a faster rate than the doped dielectric layer 112 in the first region 50A and the dielectric layer 104 in the second region 50B.

Figure 22A:
Figure 22A:
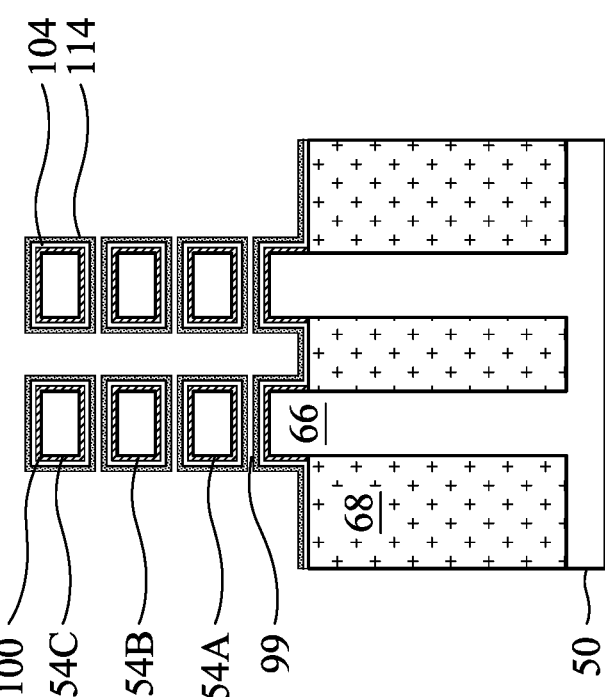
Figure 22A:
Figure 22A:
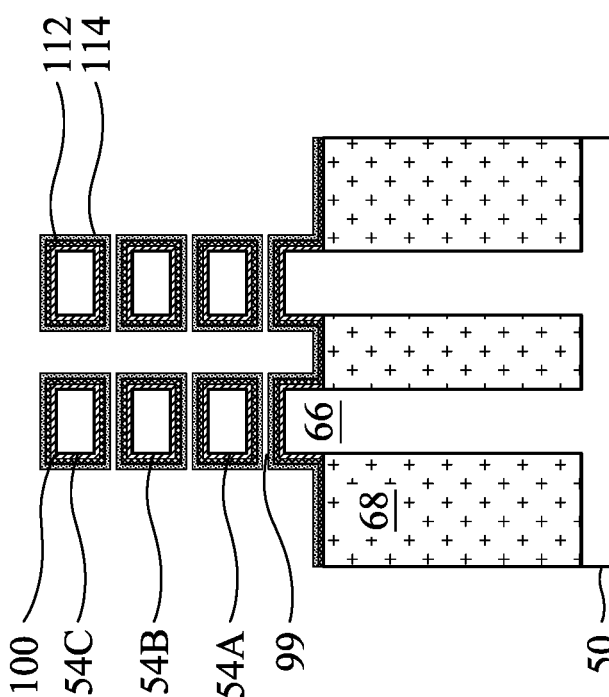
Figure 22B:
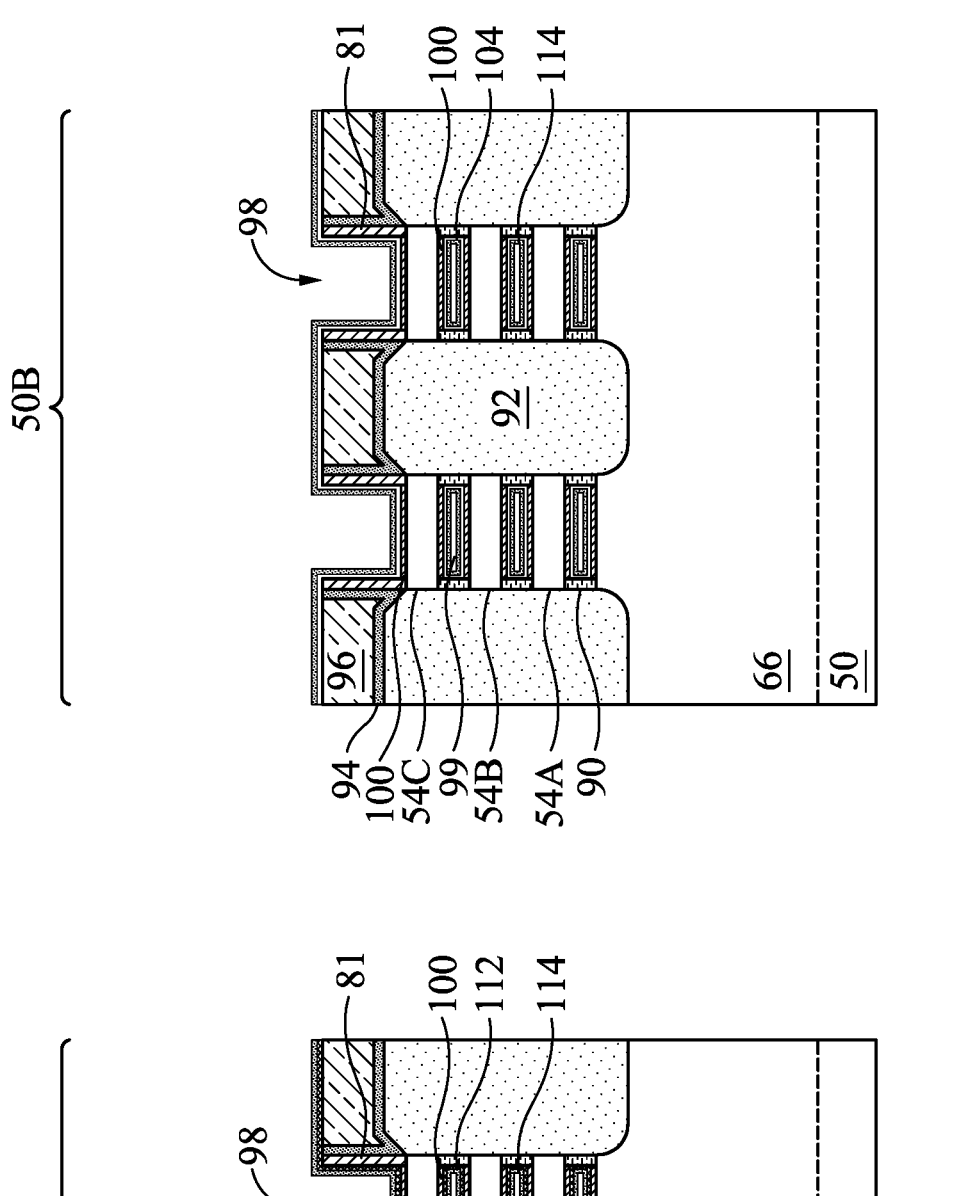
Figure 22B:
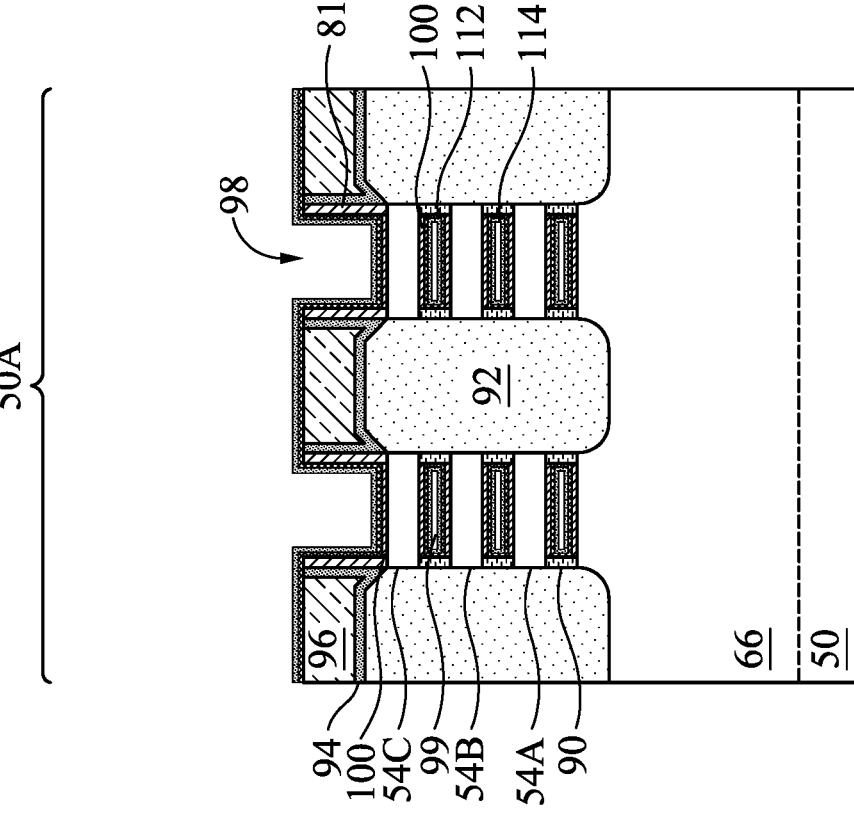

Next, referring to FIGS. 22A to 24C, a second doping loop (e.g., repeat the doping loop 200 as illustrated in FIG. 37 with a second dipole dopant) is performed to form a first gate dielectric layer 118 (see below, FIGS. 24A and 24B) in the first region 50A, in accordance with some embodiments. In FIGS. 22A and 22B, a second dipole layer 114 may be conformally formed over the doped dielectric layer 112 in the first region 50A and the dielectric layer 104 in the second region 50B. In some embodiments, the second dipole layer 114 may be an oxide or a nitride of a second dipole dopant. In some embodiments, the second dipole layer 114 includes La$_2$O$_3$, MgO, SrO, Y$_2$O$_3$, or the like, and the second dipole dopant in the second dipole layer 114 may be an n-type dipole dopant material such as La, Mg, Sr, Y, or the like. In some embodiments, the second dipole layer 114 includes TiO$_2$, Al$_2$O$_3$, AlN, Ga$_2$O$_3$, In$_2$O$_3$, Nb$_2$O$_5$, ZnO$_2$, or the like, and the second dipole dopant in the second dipole layer 114 may be a p-type dipole dopant material such as Ti, Al, Ga, In, Nb, Zn, or the like. In some embodiments, the first dipole layer 106 and the second dipole layer 114 are a same material. In some embodiments, the first dipole dopant in the first dipole layer 106 and the second dipole dopant in the second dipole layer 114 are different dipole dopant materials of the same or different types (e.g., n-type that increase the threshold voltage or p-type that may decrease the threshold voltage). The threshold voltage Vt of the overall gate structure (see below, e.g., the gate structure 152A) may be adjusted by a combination of the dipole moments created between the first dipole dopant and the material of the interfacial layer 100 and the dipole moments created between the second dipole dopant and the material of the interfacial layer 100. Accordingly, adding the second dipole dopant may further fine-tune the threshold voltage Vt of the overall gate structure (see below, e.g., the gate structure 152A). As will be discussed below, in some embodiments, the first dipole dopant may be annealed one or more times more than the second dipole dopant. The first dipole dopant may be chosen from a material having less thermal diffusivity (or requires higher energy to activate the diffusion) than the second dipole dopant, which may help control the concentration profile of the first dipole dopant in the first gate dielectric layer 118 in a suitable range. In such embodiment, the first dipole dopant may be Al, and the second dipole dopant may be La.

The second dipole layer 114 may be formed by any suitable deposition methods, such as ALD or CVD. A thickness of the second dipole layer 114 may be less than about 1 nm, for example, between about 1 angstrom and about 9 angstroms. In some embodiments, the second dipole layer 114 has a thickness thicker than the first dipole layer 106 if the first gate dielectric layer 118 needs a concentration of the second dipole dopant greater than that of the first dipole dopant. Nevertheless, the second dipole layer 114 may have a thickness thinner than or equal to the first dipole layer 106.

Figure 23A:
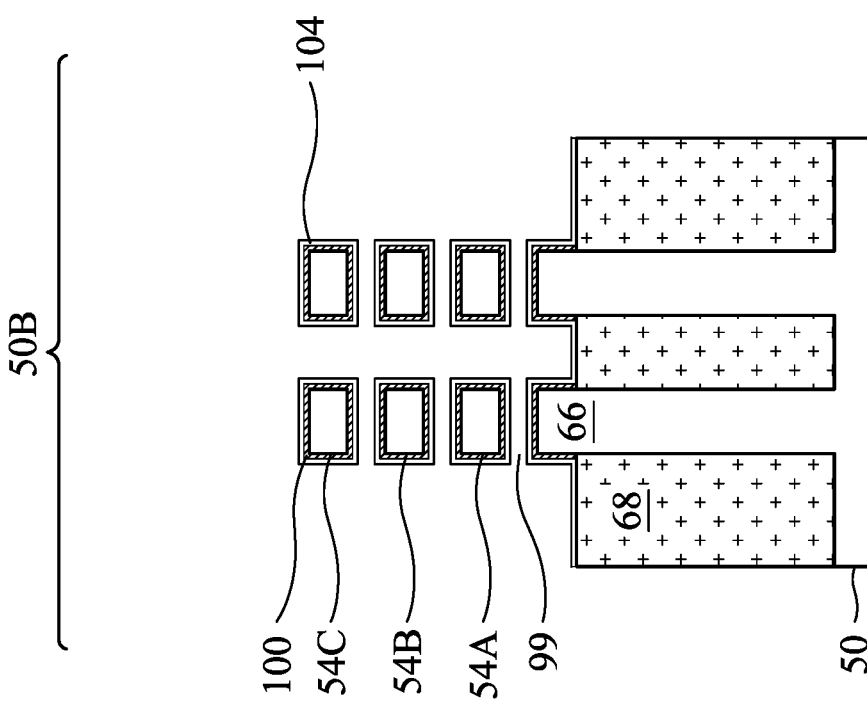
Figure 23A:
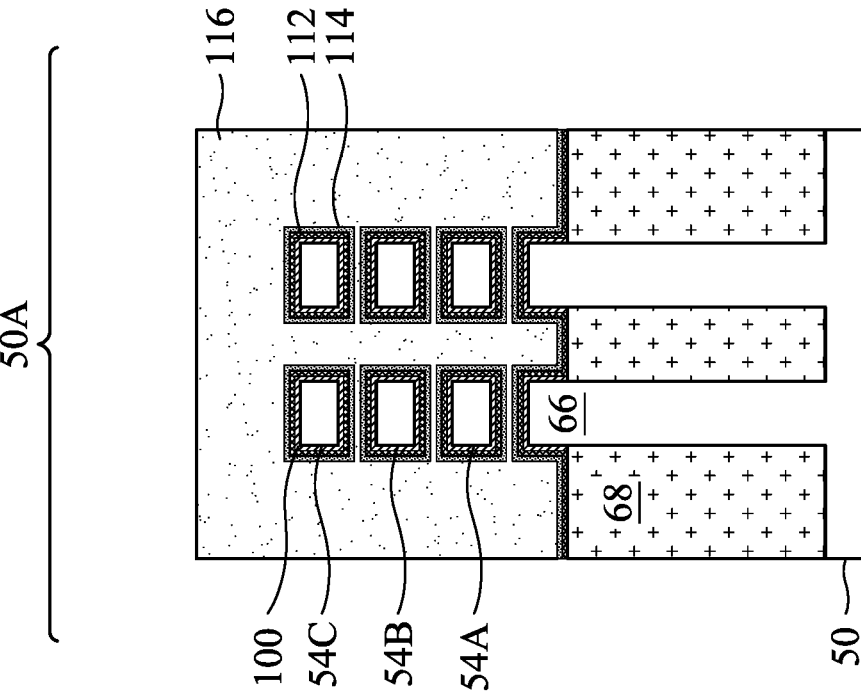
Figure 23B:
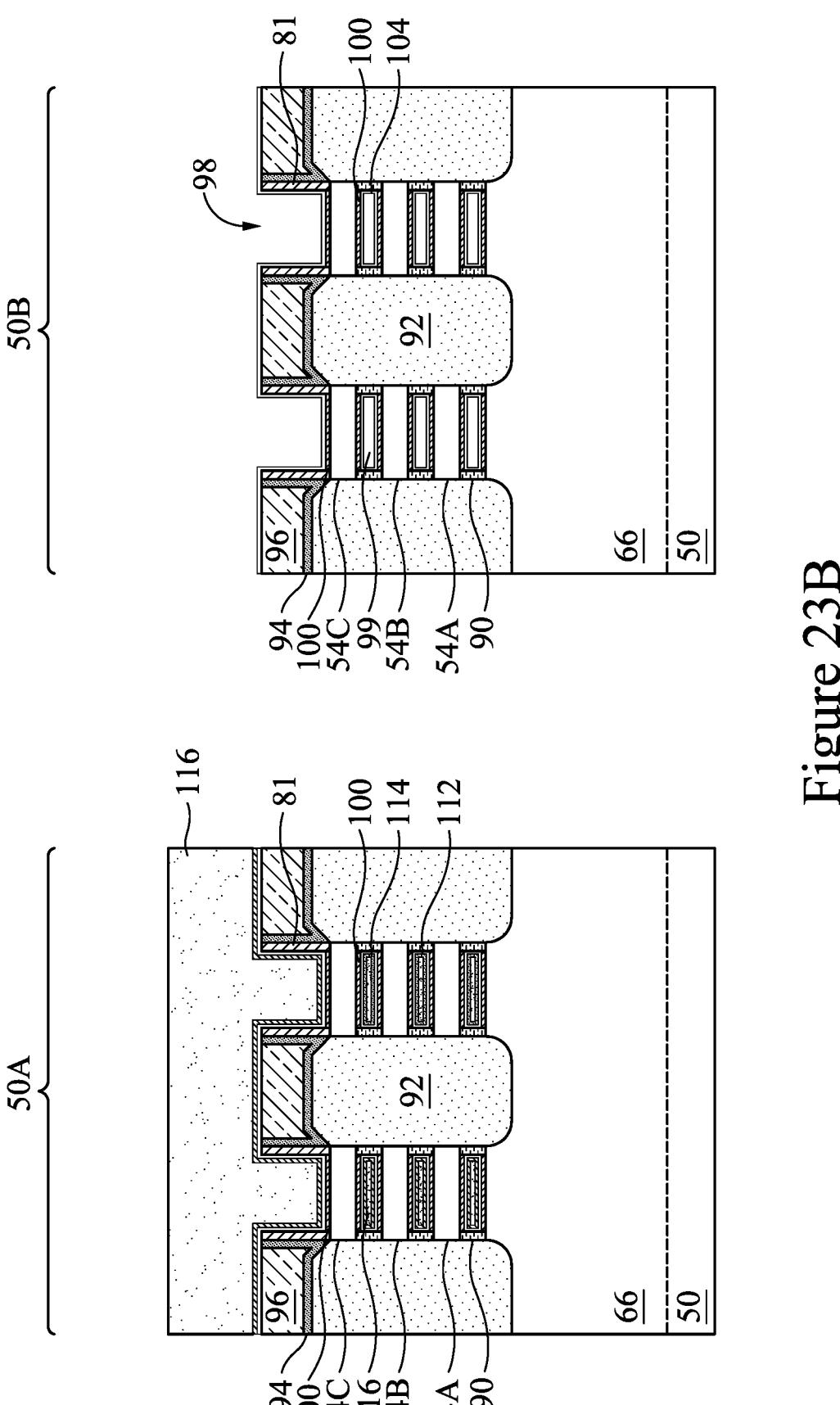

In FIGS. 23A and 23B, a patterned mask layer 116 is formed to cover the first region 50A and expose the second region 50B, and the second dipole layer 114 in the second region 50B is removed, in accordance with some embodiments. The patterned mask layer 116 may be formed of a same or similar material as the patterned mask 110 using a same or similar formation method. A suitable etching process, such as a wet etch, may be performed to remove the second dipole layer 114 in the second region 50B, while the patterned mask layer 116 shields (e.g., protects) the first region 50A from the etching process. After the second dipole layer 114 in the second region 50B is removed, the patterned mask layer 116 may be removed by a suitable process, for example, by a wet etch process that uses an etchant having a higher etch rate for the material of the patterned mask layer 116 than etch rates of materials of the second dipole layer 114 and the dielectric layer 104.

Figure 24A:
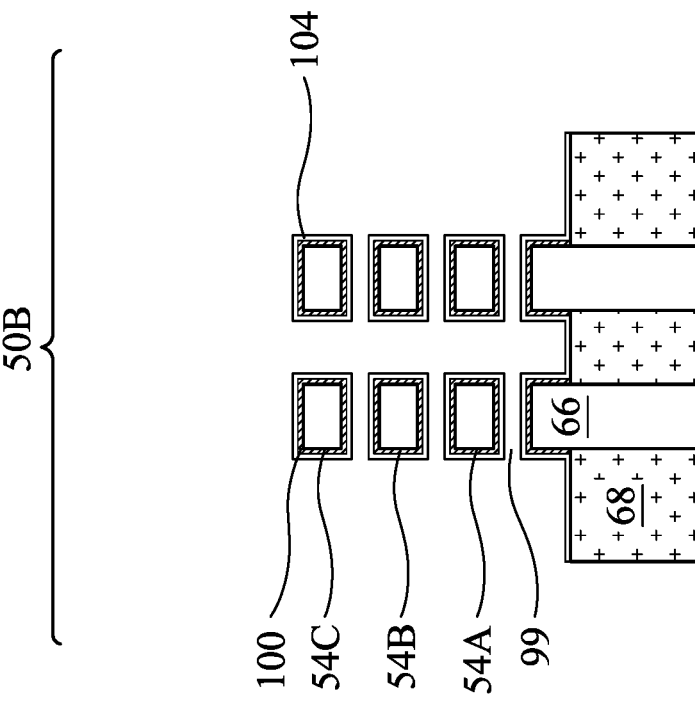
Figure 24A:
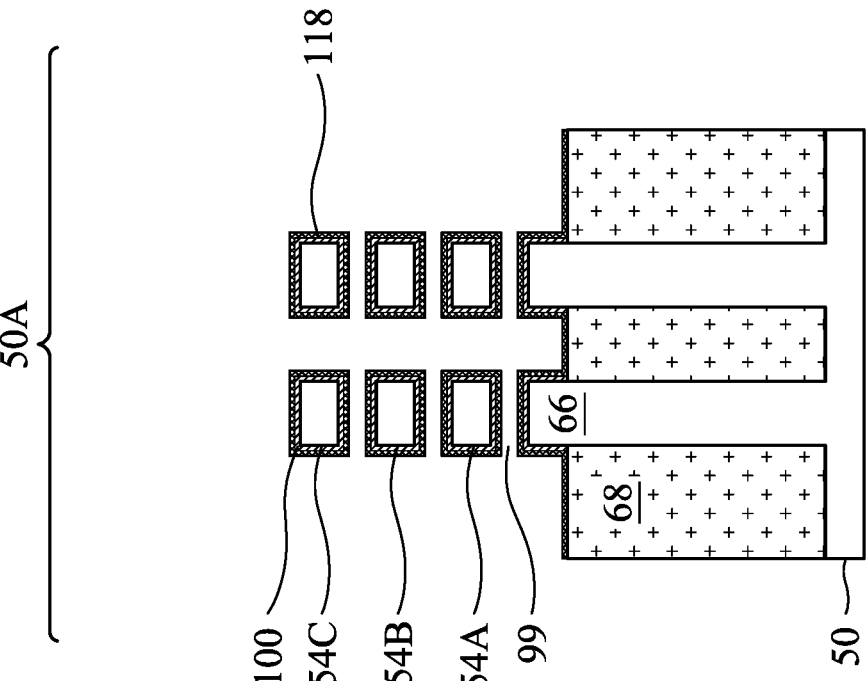
Figures 24B, 24C:
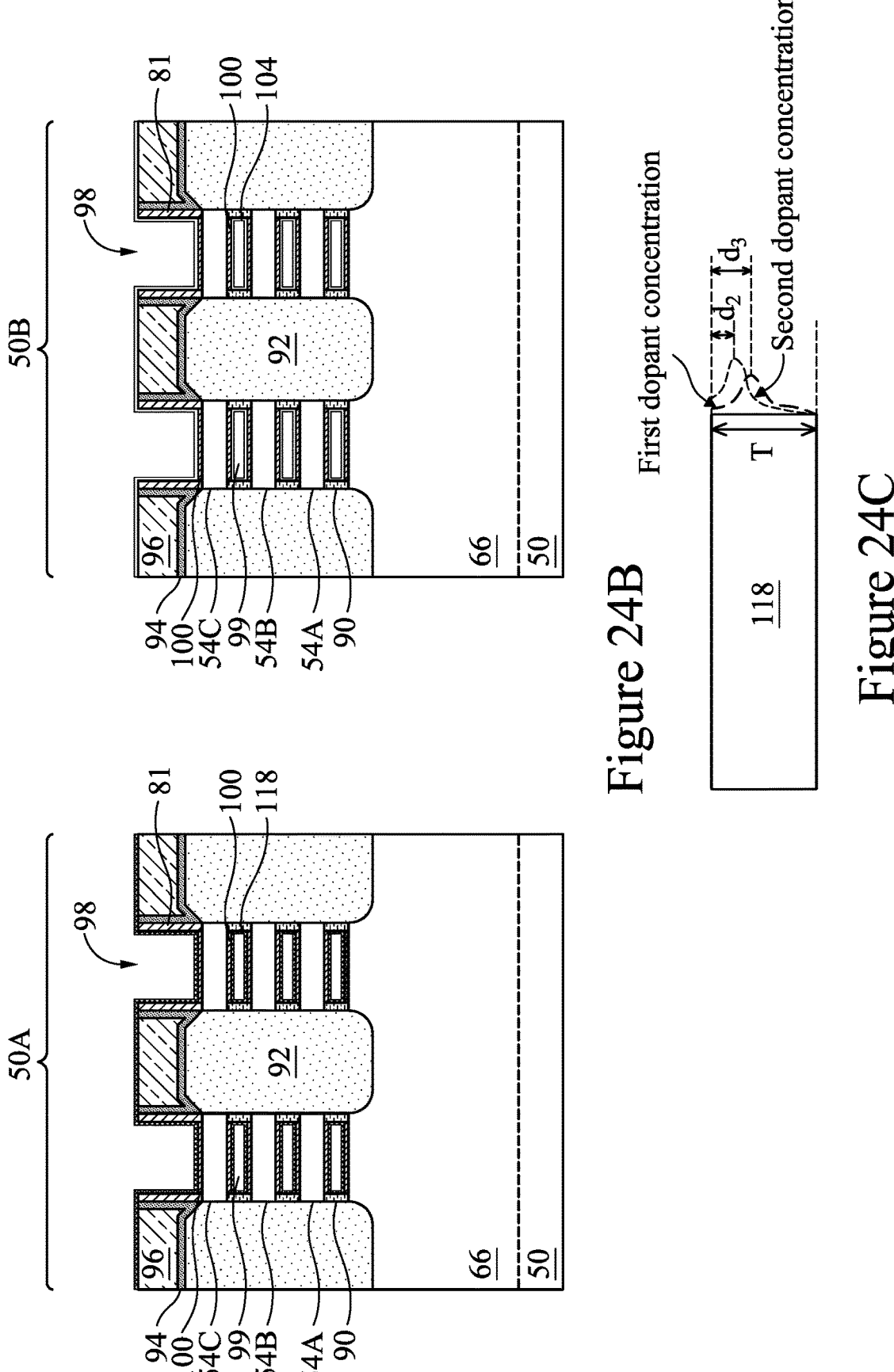

In FIGS. 24A and 24B, a second anneal process is then performed to diffuse the second dipole dopant in the second dipole layer 114 into the doped dielectric layer 112, thereby forming a first gate dielectric layer 118 in the first region 50A, in accordance with some embodiments. For example, the exemplary material of the first gate dielectric layer 118 may be La:HfO, La:ZrO, La:Mg:HfO, La:Mg:ZrO, Al:HfO, Al:ZrO, or a combination thereof. The second anneal process may be the soak anneal or the spike anneal. In some embodiment, the second anneal process may be different from the first anneal process, depending on the material of the second dipole dopant. For example, the second anneal process may have a lower temperature or a shorter period of time so as to bring less impact to the first dipole dopant in the doped dielectric layer 112. In some embodiments, sufficient amounts of the second dipole dopant may be in the first gate dielectric layer 118 because an individual doping loop (e.g., the second doping loop) is performed, where the second dipole layer 114 is in direct contact with the doped dielectric layer 112, and the thickness of the second dipole layer 114 and parameters of the second anneal process (e.g., temperature and time period) may be individually controlled. For example, the first gate dielectric layer 118 may have an average atomic concentration of the second dipole dopant about 1E12 atoms/cm$^2$ to about 1E16 atoms/cm$^2$. In some embodiments, the first gate dielectric layer 118 may have an average atomic concentration of the second dipole dopant greater than an average atomic concentration of the first dipole dopant. In some embodiments, the first gate dielectric layer 118 may have an average atomic concentration of the second dipole dopant less than or equal to an average atomic concentration of the first dipole dopant.

FIG. 24C illustrates concentration profiles of the first dipole dopant and the second dipole dopant in the first gate dielectric layer 118 along a thickness direction of the first gate dielectric layer 118. As illustrated in FIG. 24C, the second dipole dopant may have a concentration peak at a depth d2 from the upper surface of the first gate dielectric layer 118. In an embodiment that the second dipole dopant is La, the depth d2 is about 1 angstrom to about 20 angstroms. In some embodiments in which the first dipole dopant and the second dipole dopant are the same material, the depth d2 may be equal to the depth d1, and in some embodiments the dipole dopant profile may exhibit multiple peaks of varying concentrations. In some embodiments, at least a portion of the first dipole dopant in the doped dielectric layer 112 also moves away from the upper surface of the doped dielectric layer 112 in the second anneal process. Accordingly, the concentration peak of the first dipole dopant in the first gate dielectric layer 118 may move to a depth d3 from the upper surface of the first gate dielectric layer 118. For example, in the illustrated embodiments, the first dipole dopant in the first gate dielectric layer 118 is annealed twice, and the second dipole dopant in the first gate dielectric layer 118 is annealed once. The depth d3 may be greater than depth d1 and may also be greater than the depth d2. In some embodiments in which the first dipole dopant is La and the second dipole dopant is La, a ratio of the depth d2 to the depth d1 is 0.2 to 1, and a ratio of depth d3 to the depth d1 is 10 to 1.1.

After the second anneal process is applied, the remaining portions of the second dipole layer 114 in the first region 50A are removed in accordance with some embodiments. The second dipole layer 114 may be removed by a suitable etching method, for example, by a wet etch process that etches the second dipole layer 114 at a faster rate than the first gate dielectric layer 118 in the first region 50A and the dielectric layer 104 in the second region 50B.

FIGS. 19A-24C illustrate two doping loops to form the first gate dielectric layer 118 for illustrative purposes. The illustrated doping loop may be performed any number of times with the same or different dipole dopants to adjust the threshold voltage as needed for a particular device.

Figure 25A:
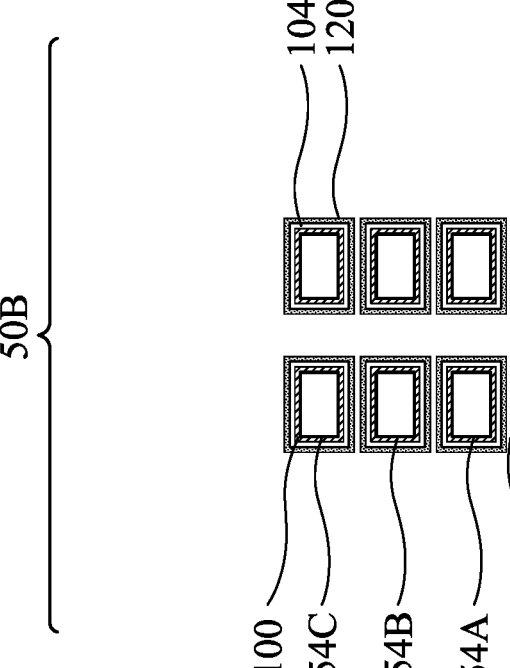
Figure 25A:
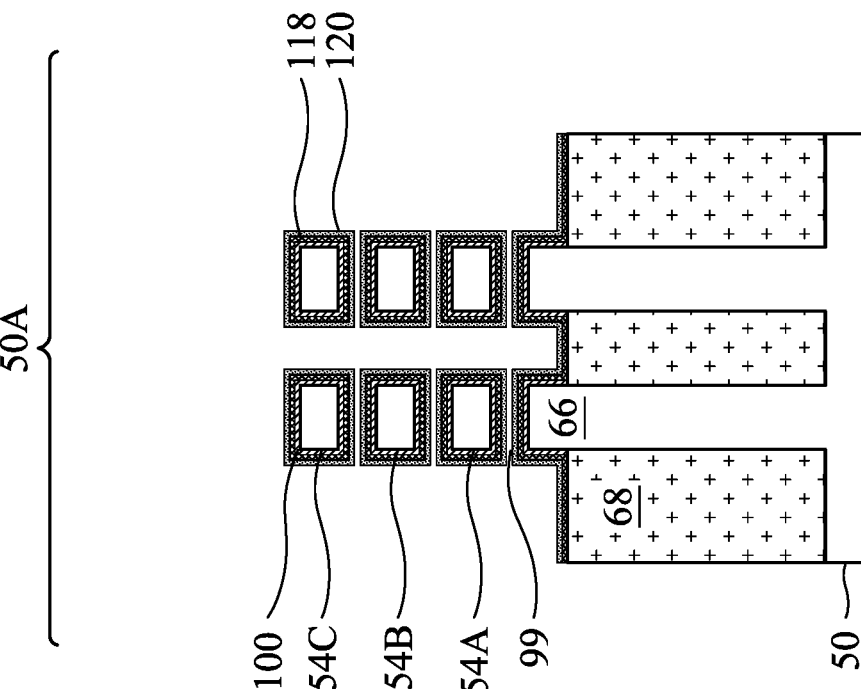
Figure 25B:
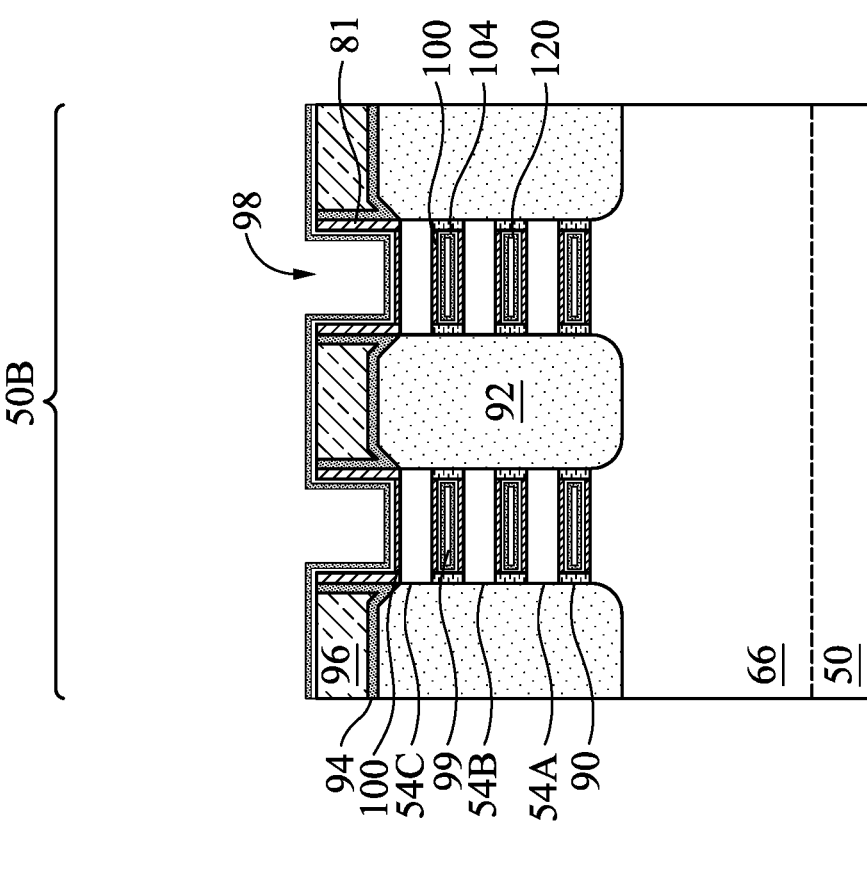
Figure 25B:
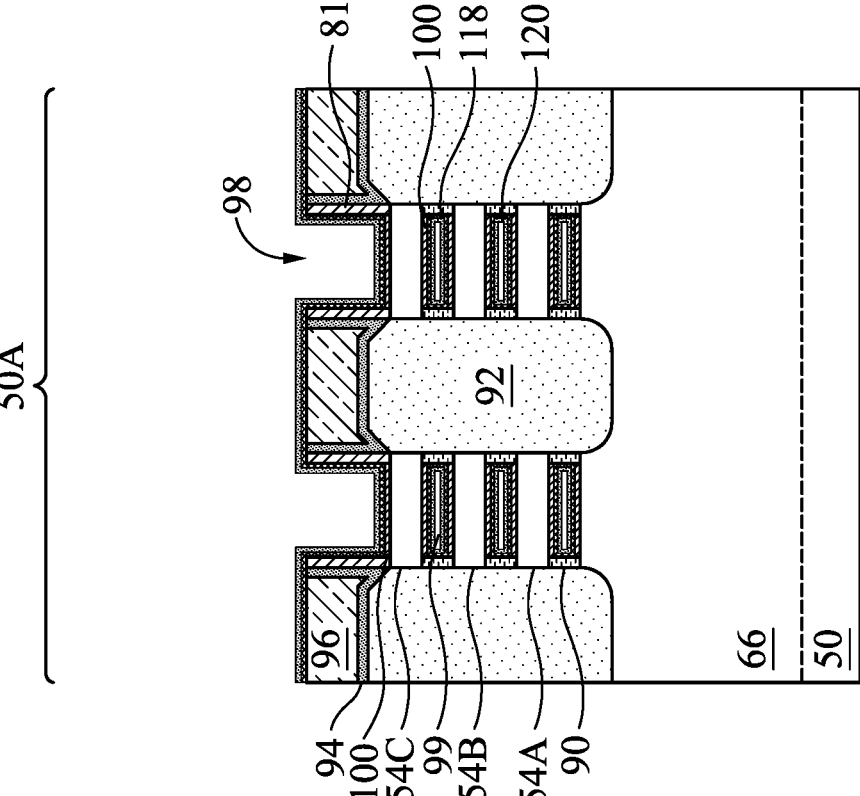

Referring to FIGS. 25A to 27B, a third doping loop (e.g., repeat the doping loop 200 as illustrated in FIG. 37 with a third dipole dopant) is performed to form a second gate dielectric layer 126 (see below, FIGS. 27A and 27B) in the second region 50B, in accordance with some embodiments. In FIGS. 25A and 25B, a third dipole layer 120 is conformally formed over the first gate dielectric layer 118 in the first region 50A and the dielectric layer 104 in the second region 50B. In some embodiments, the third dipole layer 120 may be an oxide or a nitride of the third dipole dopant and may be a material similar to the first dipole layer 106 and/or the second dipole layer 114. In some embodiments, the third dipole dopant may be the same material as one or both of the first dipole dopant and the second dipole dopant. In some embodiments, the third dipole layer is a material different from one or both of the first dipole dopant and the second dipole dopant and may have a type (e.g., n-type or p-type) the same as or different from the type of one or both of the first dipole dopant and the second dipole dopant.

Figure 26A:
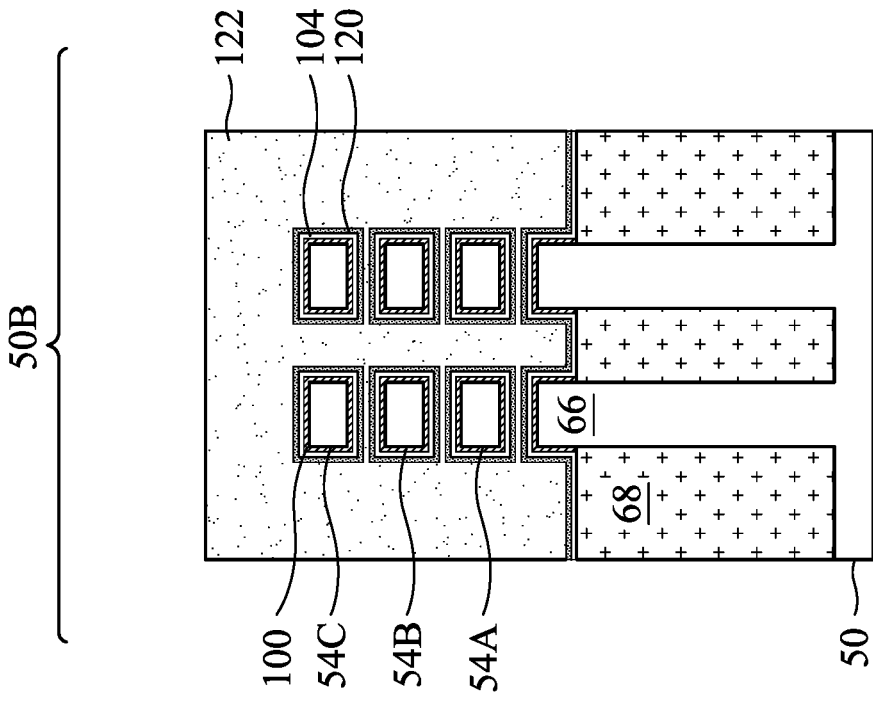
Figure 26A:
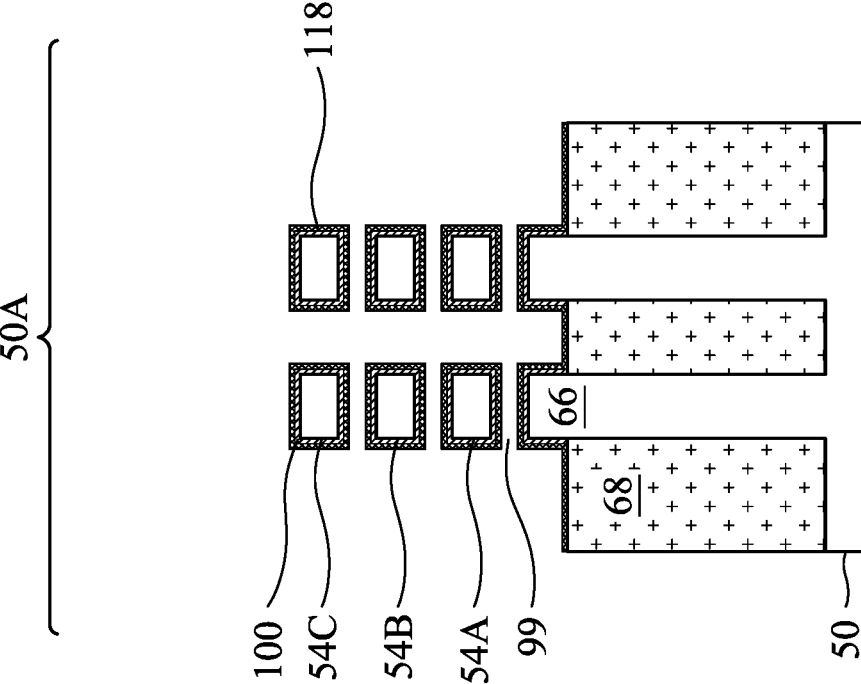
Figure 26B:
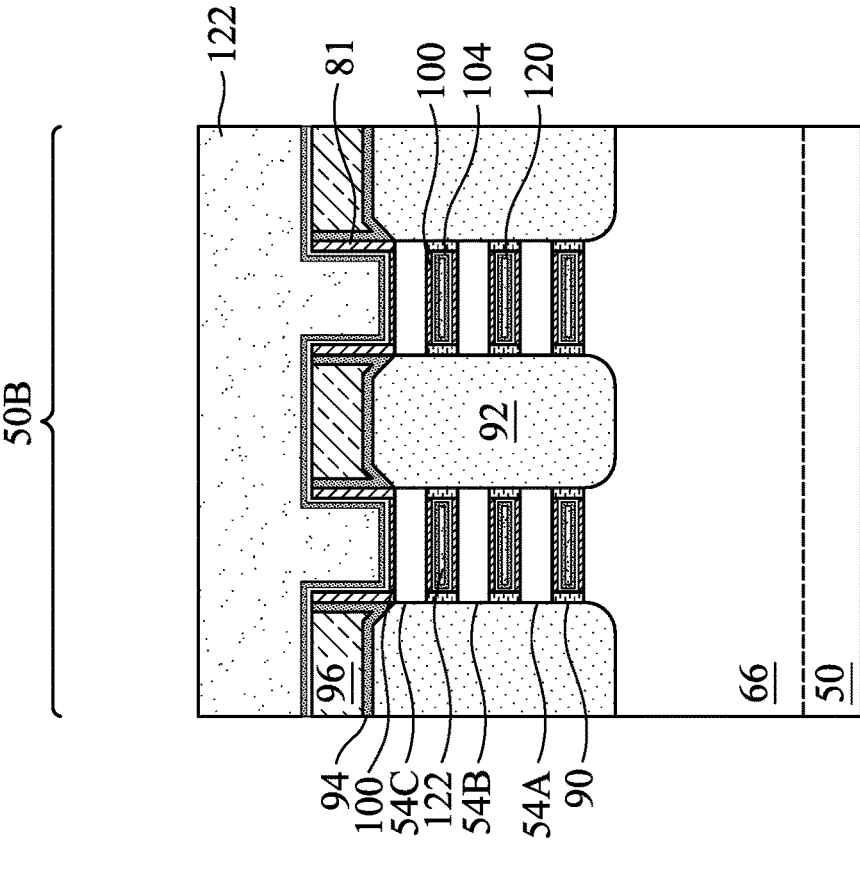
Figure 26B:
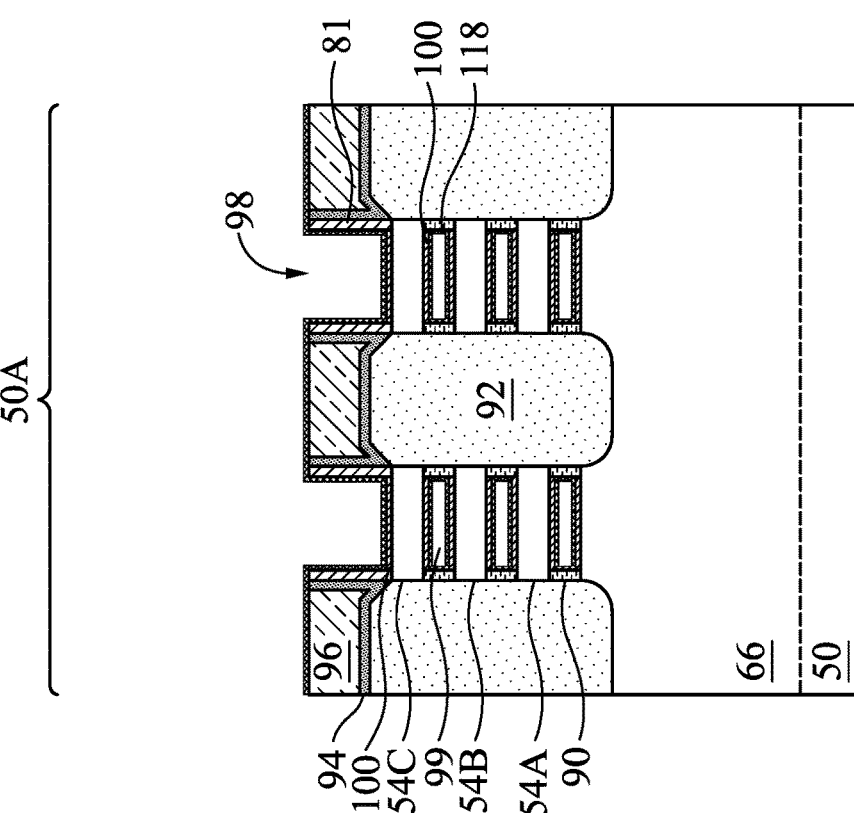

In FIGS. 26A and 26B, a patterned mask layer 122 is formed to cover the second region 50B and expose the first region 50A, and the third dipole layer 120 in the first region 50A is removed, in accordance with some embodiments. The patterned mask layer 122 may be formed of a same or similar material as the patterned mask 110 using a same or similar formation method, where the patterned mask layer 122 covers the second region 50B and exposes the first region 50A. In FIGS. 26A and 26B, the third dipole layer 120 in the first region 50A is removed, in accordance with some embodiments. A suitable etching process, such as a wet etch, may be performed to remove the third dipole layer 120 in the first region 50A, while the patterned mask layer 122 shields (e.g., protects) the second region 50B from the etching process. After the third dipole layer 120 in the first region 50A is removed, the patterned mask layer 122 may be removed by a suitable process, for example, by a wet etch that uses an etchant having a higher etch rate for the material of the patterned mask layer 122 than etch rates of the materials of the first gate dielectric layer 118 and the third dipole layer 120.

Figure 27A:
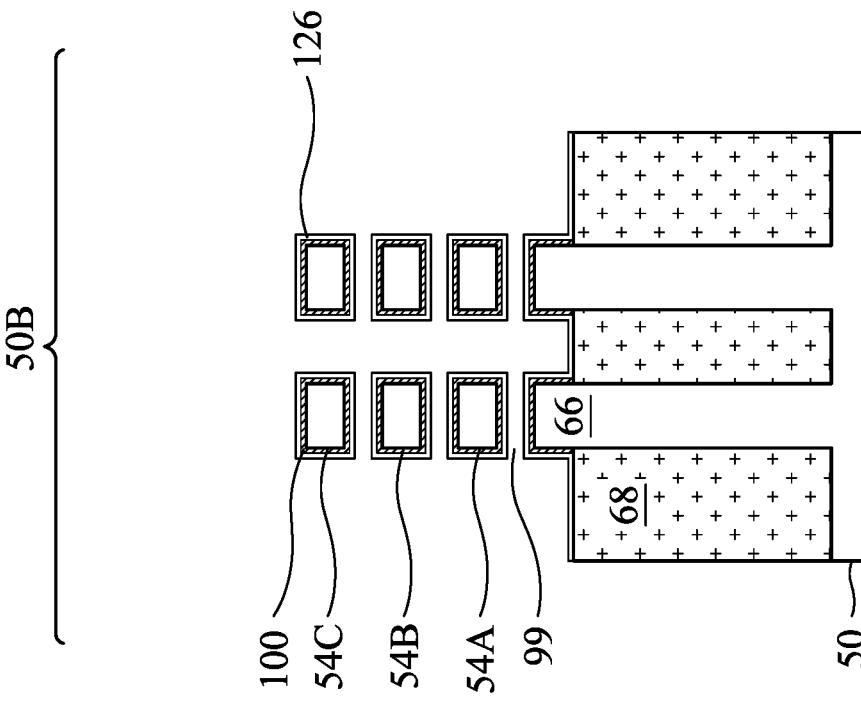
Figure 27A:
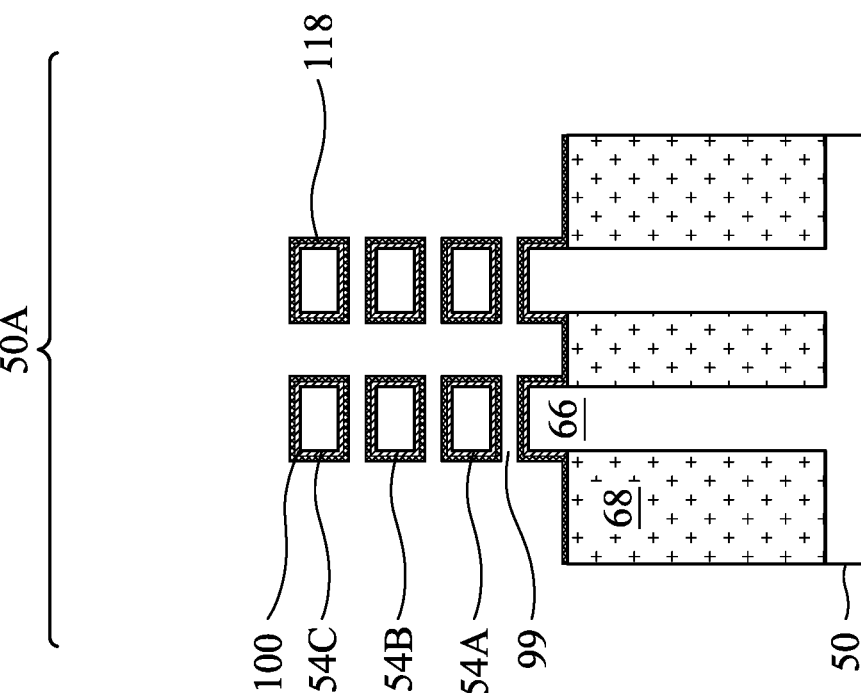
Figure 27B:
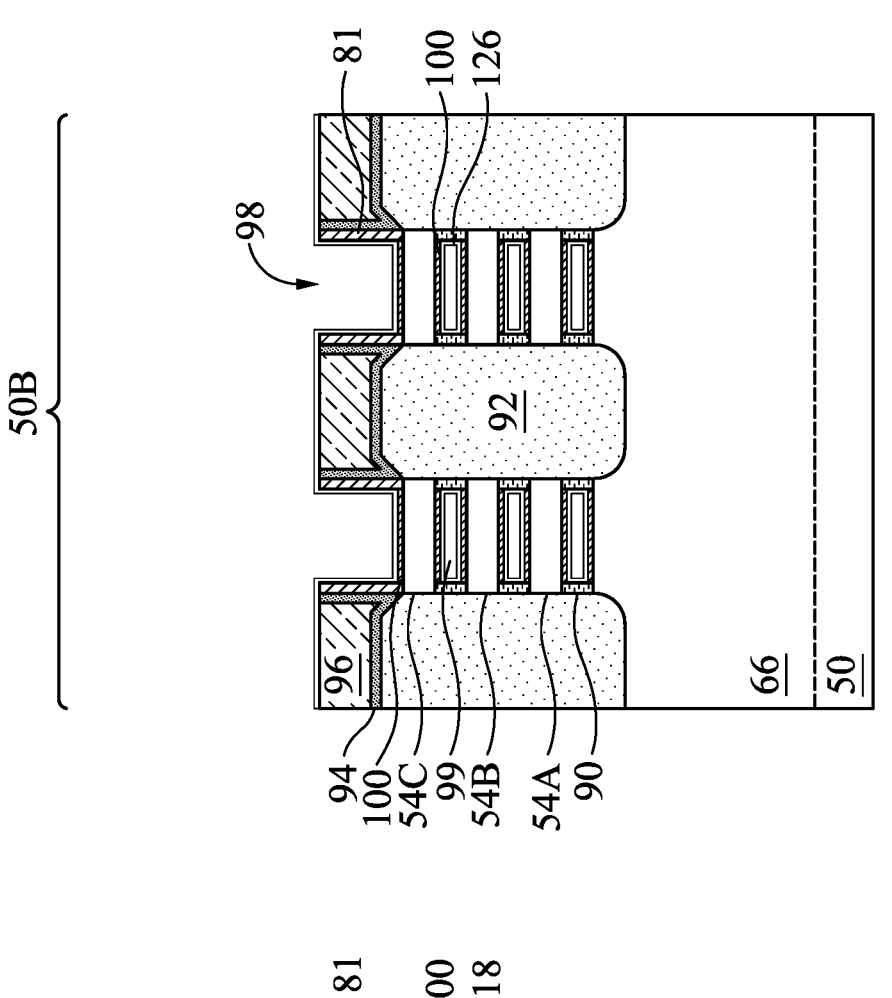
Figure 27B:
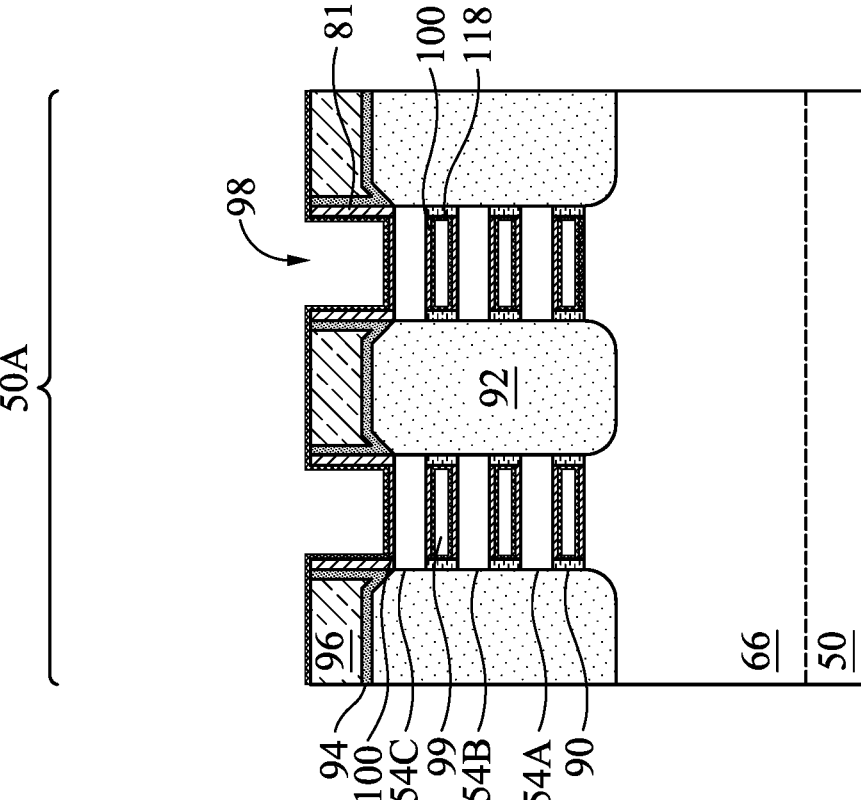

In FIGS. 27A and 27B, a third anneal process is performed to diffuse the third dipole dopant in the third dipole layer 120 into the dielectric layer 104 in the second region 50B, thereby forming a second gate dielectric layer 126 in the second region 50B, in accordance with some embodiments. The third anneal process may be the soak anneal or the spike anneal. In some embodiments, sufficient or targeted amounts of the third dipole dopant may be in the second gate dielectric layer 126 because an individual doping loop (e.g., the third doping loop) is performed, where the third dipole layer 120 may be in direct contact with the dielectric layer 104, and the thickness of the third dipole layer 120 and parameters of the third anneal process (e.g., temperature and time period) may be individually controlled. For example, the second gate dielectric layer 126 may have an average atomic concentration of the third dipole dopant of about $1E12$ atoms/cm$^2$ to about $1E16$ atoms/cm$^2$. In some embodiments, the third dipole dopant along a thickness direction of the second gate dielectric layer 126 may have a concentration peak at a depth $d_4$ (not shown) from the upper surface of the second gate dielectric layer 126. In an embodiment in which the first dipole dopant and the third dipole dopant are a same material, the depth $d_4$ may be about the same as the depth $d_1$, although the depth may be individually controlled and adjusted to be different by adjusting the anneal process (e.g., adjusting the process, time, temperature, or the like).

In the third anneal process, the first dipole dopant and the second dipole dopant may further diffuse into the first gate dielectric layer 118, and their concentration peak along the thickness direction of the first gate dielectric layer 118 may further move away from the upper surface of the first gate dielectric layer 118, such as being located at depths $d_5$ (not shown, greater than depth $d_3$) and $d_6$ (not shown, greater than depth $d_2$), respectively. In some embodiments, because the first dipole dopant and the second dipole dopant in the first gate dielectric layer 118 are annealed more times than the third dipole dopant in the second gate dielectric layer 126, the depths $d_5$ and $d_6$ may be greater than the depth $d_4$. In some embodiments, the depth $d_5$ is about 1 angstrom to about 20 angstroms, and the depth $d_6$ is about 1 angstrom to about 20 angstroms.

After the third anneal process is applied, the remaining portions of the third dipole layer 120 in the second region 50A are removed in accordance with some embodiments. The third dipole layer 120 may be removed by a suitable etching method, for example, by a wet etch process that etches the third dipole layer 120 at a faster rate than the first gate dielectric layer 118 in the first region 50A and the second gate dielectric layer 126 in the second region 50B.

It is noted that the sequence of the doping loops may not be limited and can be arranged in any suitable order. For example, the second doping loop and the third doping loop may be exchanged. In such embodiments, the second dipole dopant in the first gate dielectric layer 118 is annealed once, and the third dipole dopant in the second gate dielectric layer 126 is annealed twice. Thus, in such embodiments, the depth $d_4$ (e.g., the depth of concentration peak of the third dipole dopant from the upper surface of the second gate dielectric layer 126) may be greater than the depth $d_6$ (e.g., the depth of concentration peak of the second dipole dopant from the upper surface of the first gate dielectric layer 118).

After the third anneal process is applied, the remaining portions of the third dipole layer 120 in the second region 50B are removed, in accordance with some embodiments. The third dipole layer 120 may be removed by a suitable etching method, for example, by a wet etch process that etches the third dipole layer 120 at a faster rate than the first gate dielectric layer 118 in the first region 50A and the second gate dielectric layer 126 in the second region 50B.

One or more additional doping loops may be performed to dope various kinds of dipole dopants to various regions. In some embodiments, any number of the additional doping loops may be performed to one or both of the first region 50A and the second region 50B and is not limited by the narrow space between the nanostructures 55 because each of the dipole layers is removed in each doping loop. For example, a fourth doping loop may be applied to diffuse a fourth dipole dopant to the first region 50A, the second region 50B, or other regions. FIGS. 28A to 30B illustrate a fourth doping loop that diffuses the fourth dipole dopant into the second gate dielectric layer 126 in the second region 50B and forms a third gate dielectric layer 136, in accordance with some embodiments. However, in some embodiments, the gate dielectric layer in the second region 50B may be doped only with the third dipole dopant, such as the second gate dielectric layer 126 as illustrated in FIGS. 27A and 27B.

Figure 28A:
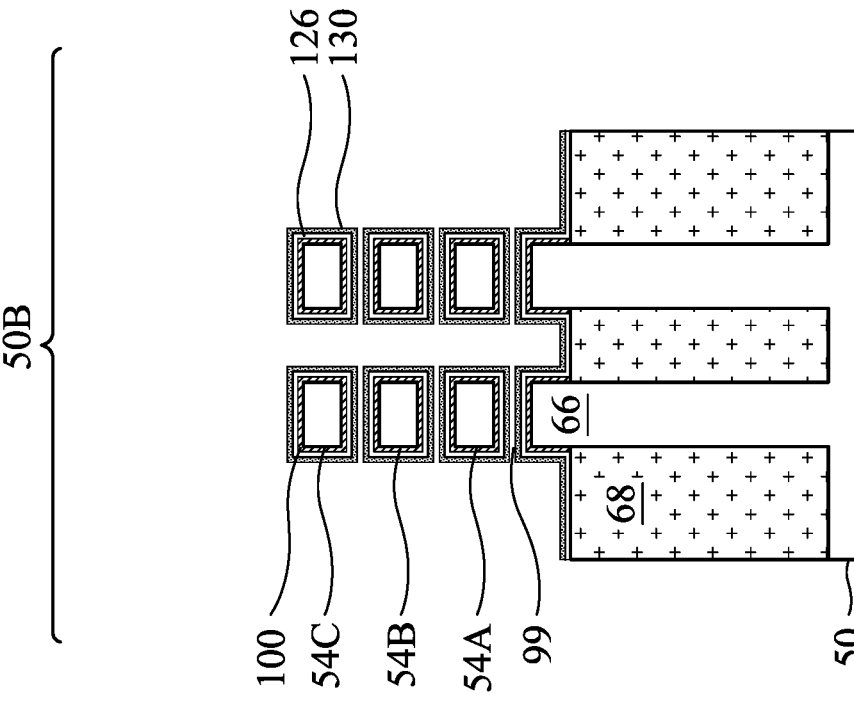
Figure 28A:
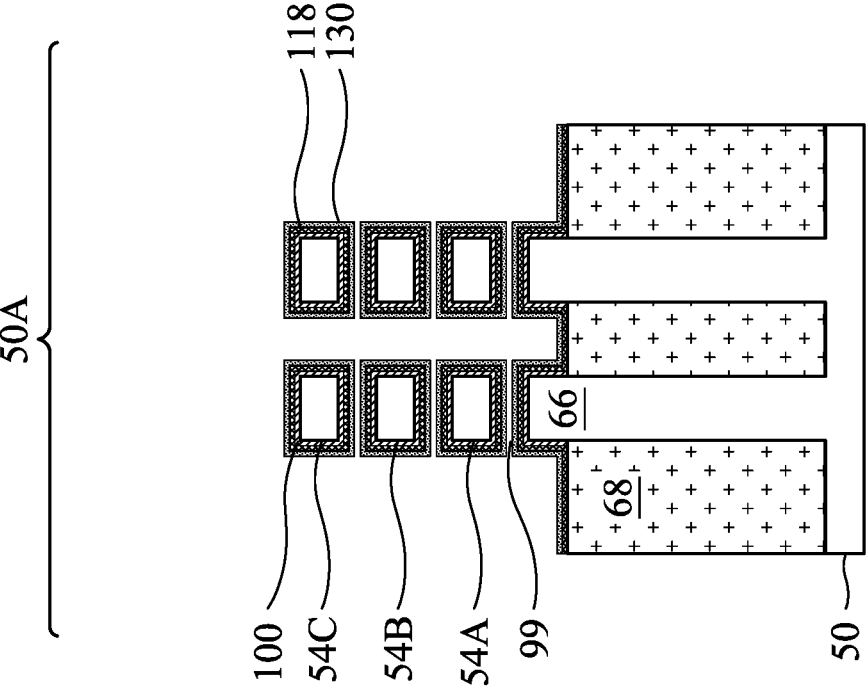
Figure 28B:
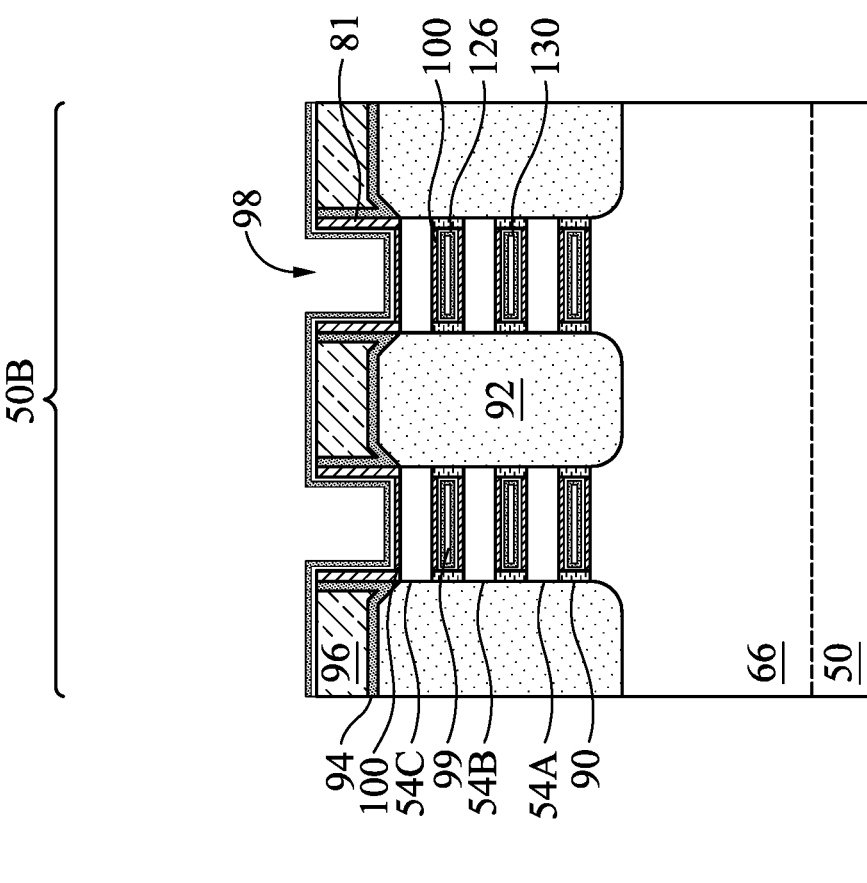
Figure 28B:
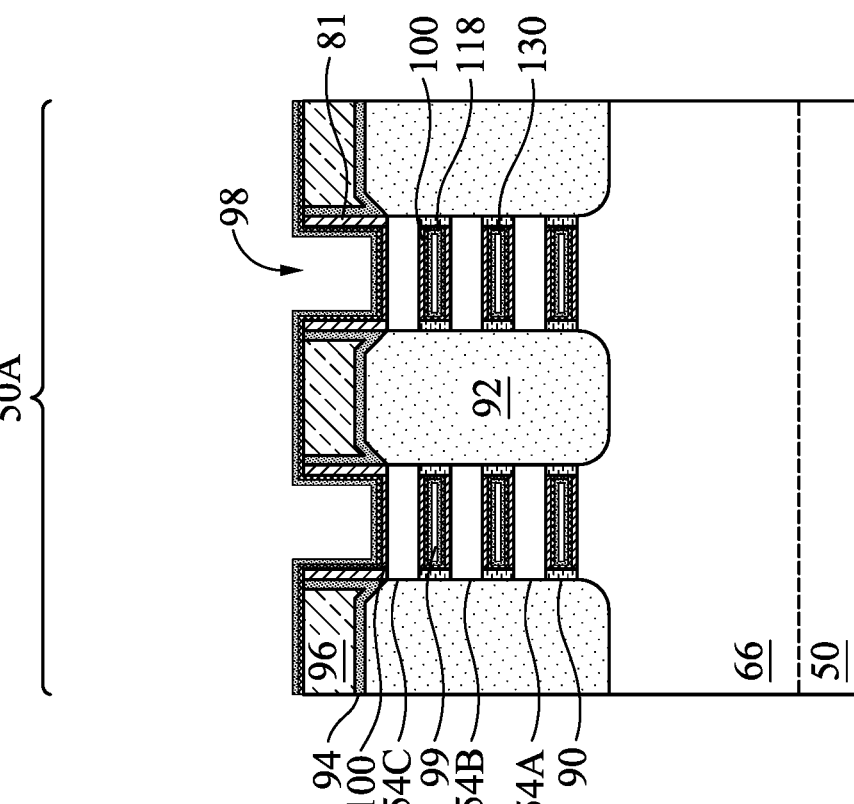

In FIGS. 28A and 28B, a fourth dipole layer 130 is conformally formed over the first gate dielectric layer 118 in accordance with some embodiments. In some embodiments, the fourth dipole layer 130 may include a fourth dipole dopant and may have a material the same or similar to one or more of the first dipole layer 106, the second dipole layer 114, or the third dipole layer 120, or different from them. The fourth dipole layer 130 may be formed by any suitable deposition methods such as ALD or CVD. A thickness of the fourth dipole layer 130 may be less than about 1 nm, for example, between about 1 angstrom and about 9 angstroms.

Figure 29A:
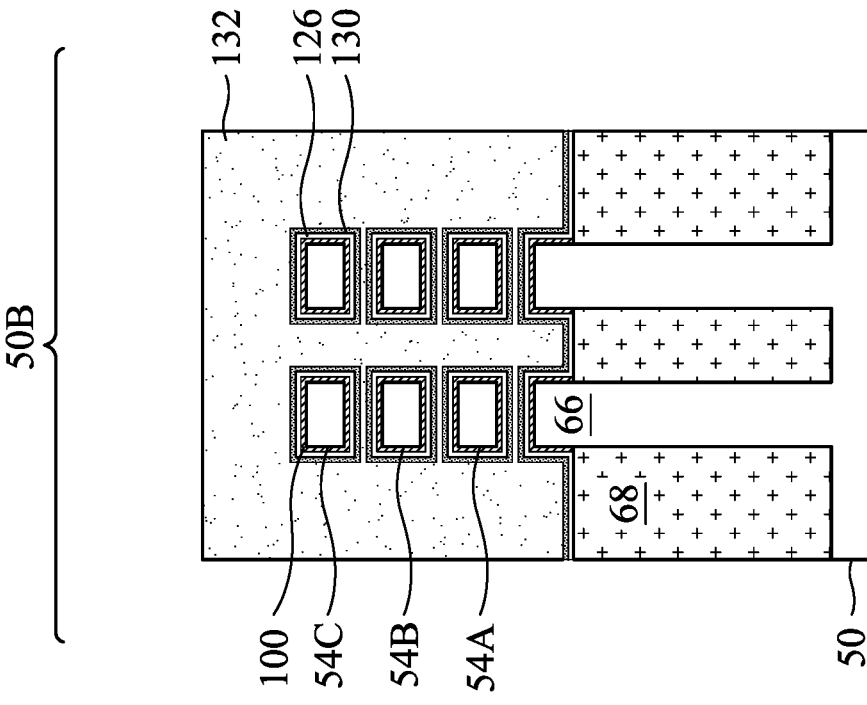
Figure 29A:
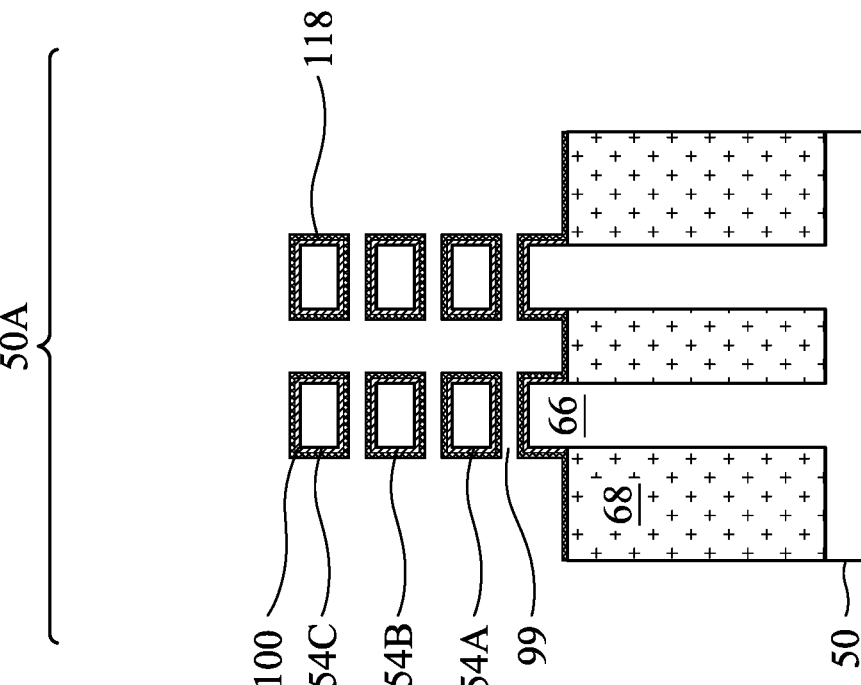
Figure 29B:
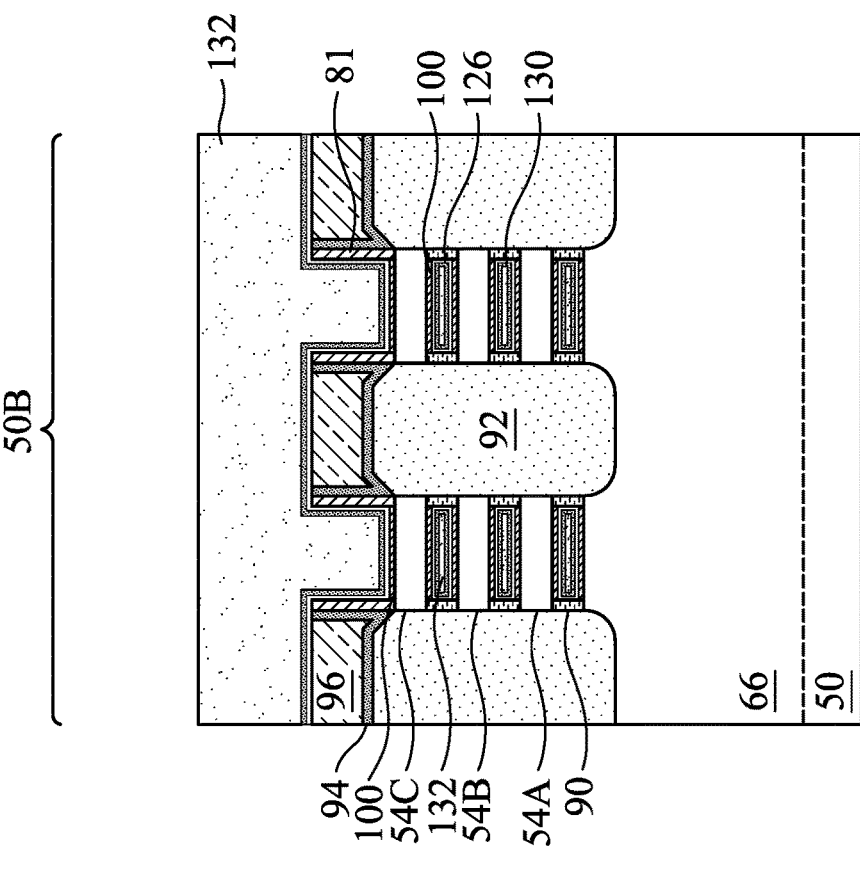
Figure 29B:
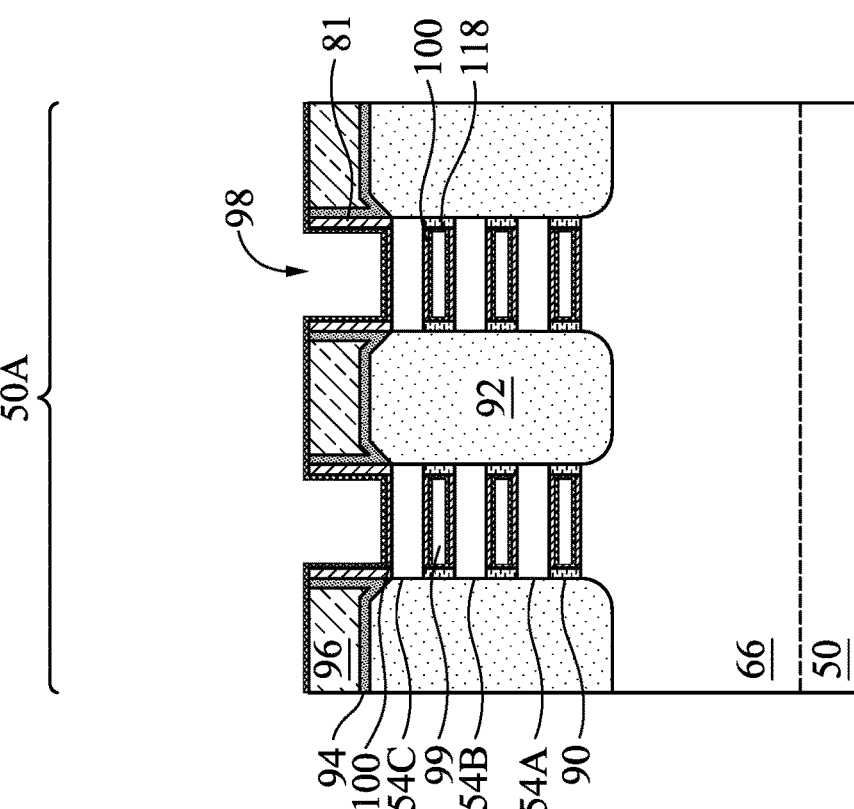

In FIGS. 29A and 29B, a patterned mask layer 132 is formed, in accordance with some embodiments. The patterned mask layer 132 may be formed of a same or similar material as the patterned mask layer 122 using a same or similar formation method. The fourth dipole layer 130 in the first region 50A is removed by a suitable etching process, while the fourth dipole layer 130 in the second region 50B is protected by the patterned mask layer 132. After the fourth dipole layer 130 in the first region 50A is removed, the patterned mask layer 132 may be removed by a suitable process.

Figure 30A:
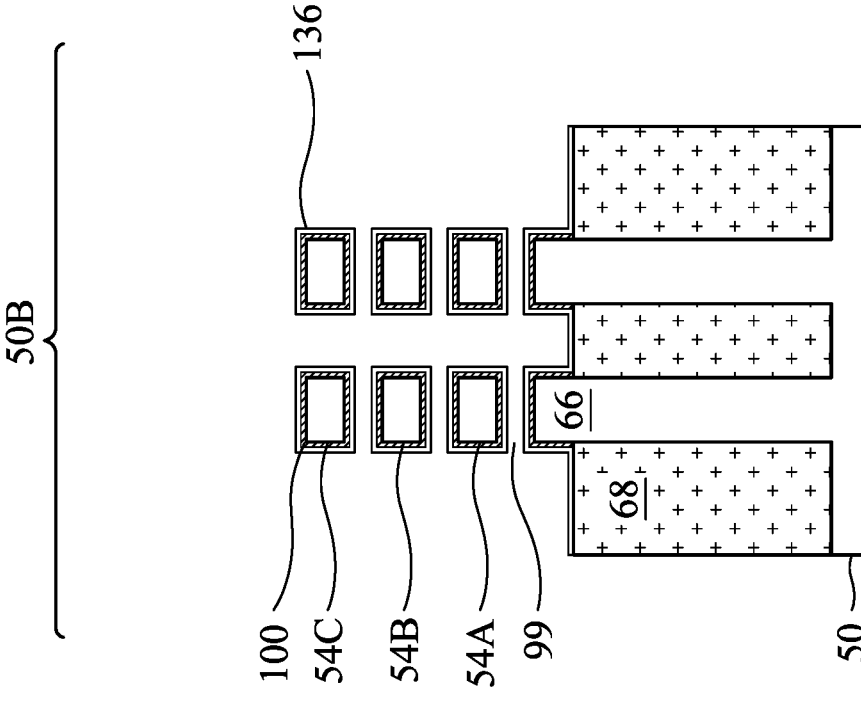
Figure 30A:
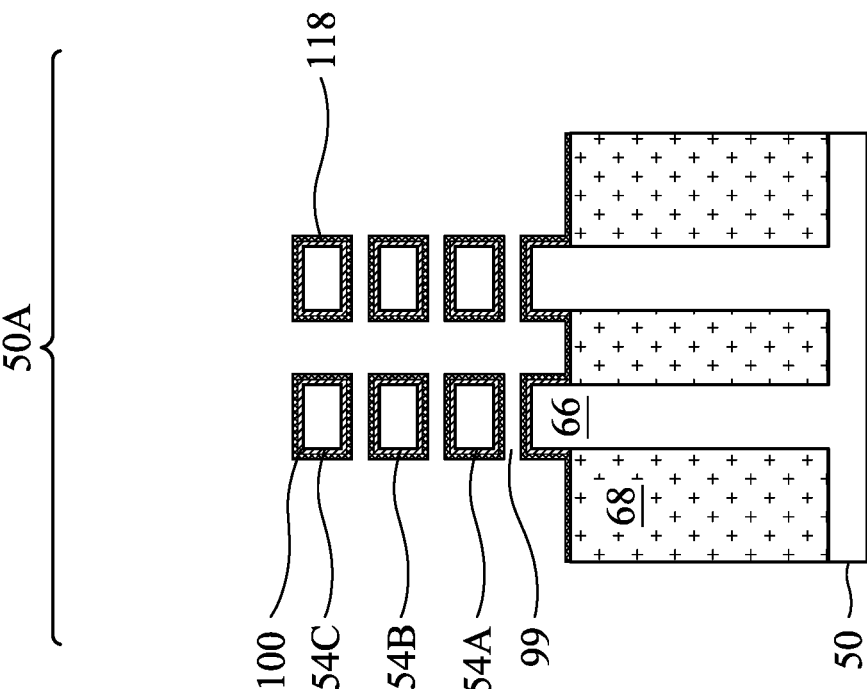
Figure 30B:
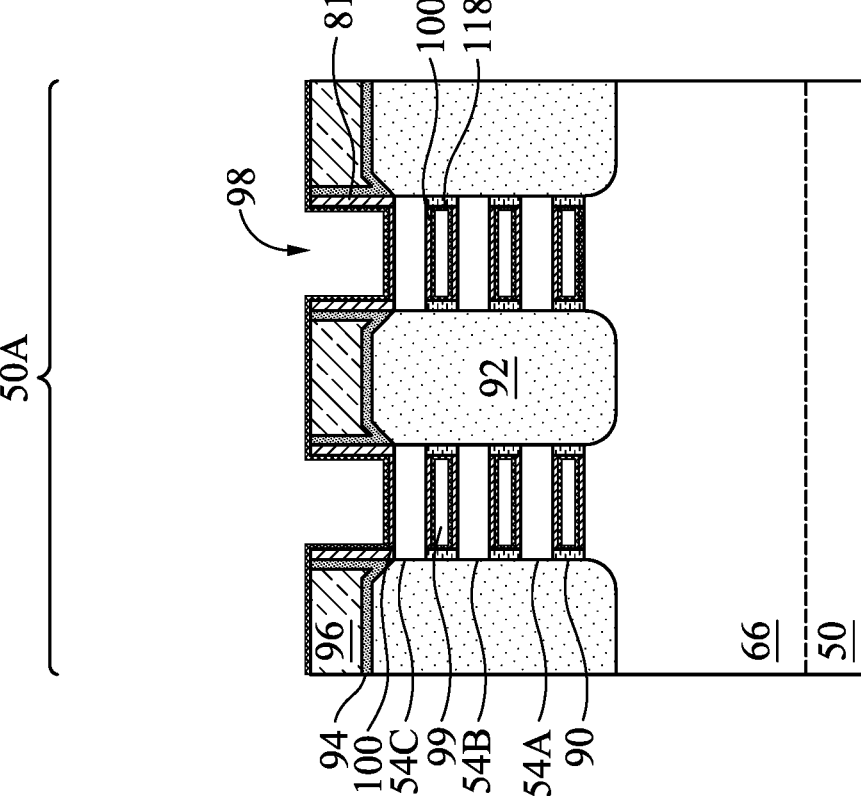

In FIGS. 30A and 30B, a fourth anneal process is performed to diffuse the fourth dipole dopant in the fourth dipole layer 130 into the second gate dielectric layer 126 in the second region 50B, thereby forming a third gate dielectric layer 136 in the second region 50B, in accordance with some embodiments. In some embodiments, the third gate dielectric layer 136 may have a concentration of the fourth dipole dopant greater than a concentration of the third dipole dopant. In some embodiments, the third gate dielectric layer 136 may have a concentration of the fourth dipole dopant less than or equal to a concentration of the third dipole dopant.

Also, in the fourth anneal process, the concentration peak of the third dipole dopant along the thickness direction of the second gate dielectric layer 126 may further move away from the upper surface of the second gate dielectric layer 126, in accordance with some embodiments. Thus, the concentration peak of the fourth dipole dopant along the thickness direction of the third gate dielectric layer 136 may be located between the upper surface of the third gate dielectric layer 136 and the concentration peak of the third dipole dopant along the thickness direction of the third gate dielectric layer 136. After the fourth anneal process is applied, the remaining portions of the fourth dipole layer 130 in the second region 50B are removed by a suitable etching method in accordance with some embodiments.

Figure 38:
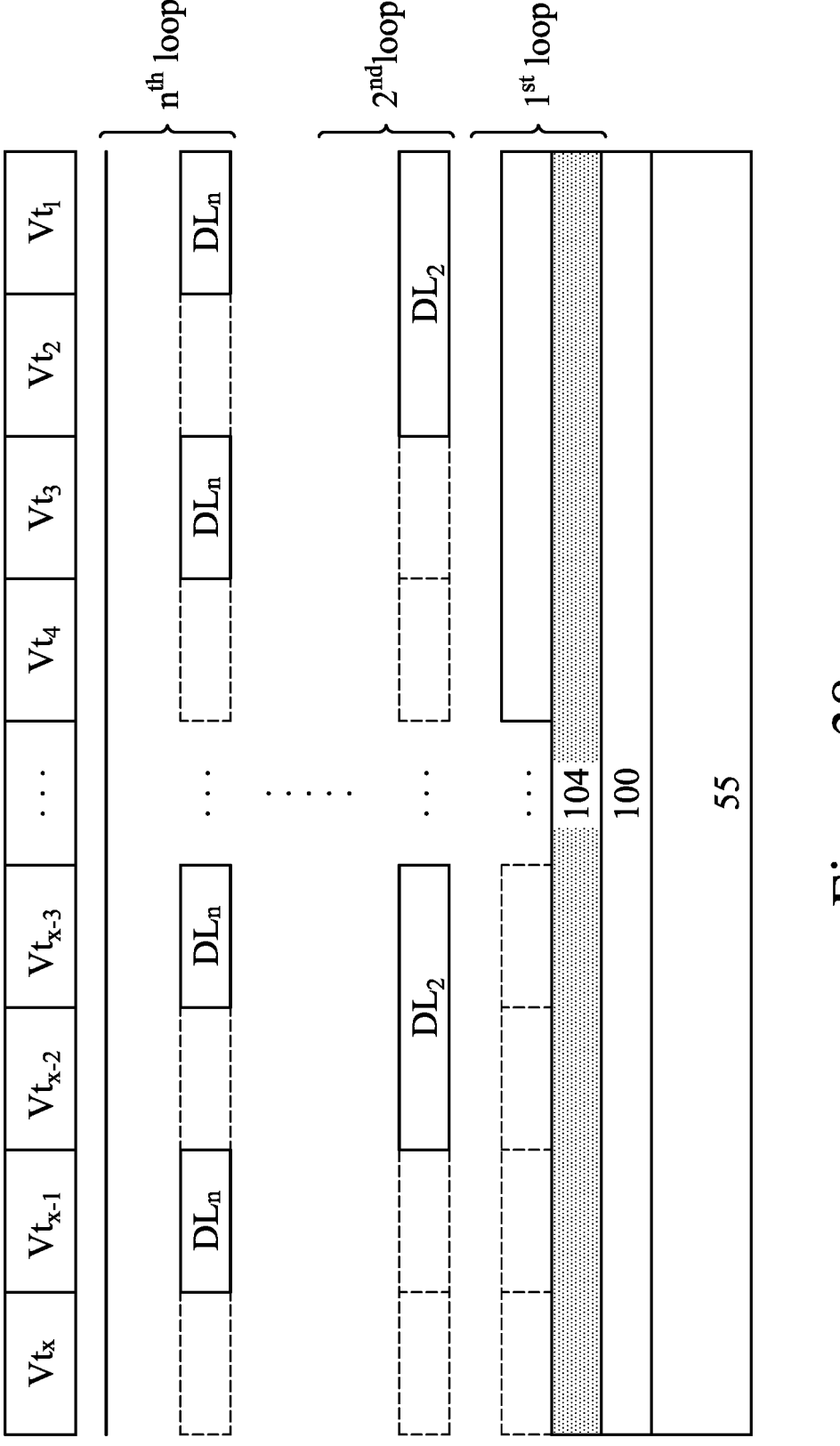
FIG. 38 illustrates a chart showing transistors having various gate threshold voltages are created by repeating doping loops, in accordance with some embodiments.

One or more doping loops may be performed to dope various dipole dopants in various regions in accordance with some embodiments. For example, as illustrated in FIG. 38, the doping loops may be to repeated n times, wherein each of the doping loops includes a dipole layer deposition, anneal, and removal of the remaining portions of the dipole layer. The example illustrated in FIG. 38 illustrates x device regions represented by Vt1-Vtx, wherein each of the Vt1-Vtx represents a device region having one or more transistors having a threshold voltage corresponding to Vt1-Vtx. The first loop includes using a first dipole layer DL1 (such as the first dipole layer 106 discussed above) deposited over the device regions Vt1-Vt4 to dope an underlying layer (such as the dielectric layer 104 discussed above), with the device regions Vtx-3-Vtx remaining uncovered by the first dipole layer DL1 during the anneal process. The second loop includes using a second dipole layer DL2, with DL2 being formed over Vt1, Vt2, Vtx-3, and Vtx-2. After performing the anneal for the second dipole layer DL2, four distinct device regions are formed: device regions Vt1 and Vt2 have been doped with the first dipole layer DL1 and the second dipole layer DL2; device regions Vt3 and Vt4 have been doped with only the first dipole layer DL1; the device regions Vtx-3 and Vtx-2 have been doped with only the second dipole layer DL2; and the device regions Vtx and Vtx-1 remain undoped. As such, after two doping loops, four distinct device regions with different operating characteristics have been formed. This process may be repeated any n number of times (may form nth dipole layer DLn) and may provide 2n different threshold voltages of gate structures (e.g., Vt1 to Vtx) using only n doping loops. Note that FIG. 38 shows examples of respective device regions being doped with the dipole layers, and the anneal process and the removal of the dipole layers in each dipole loop are not specifically shown in FIG. 38.

Figure 31A:
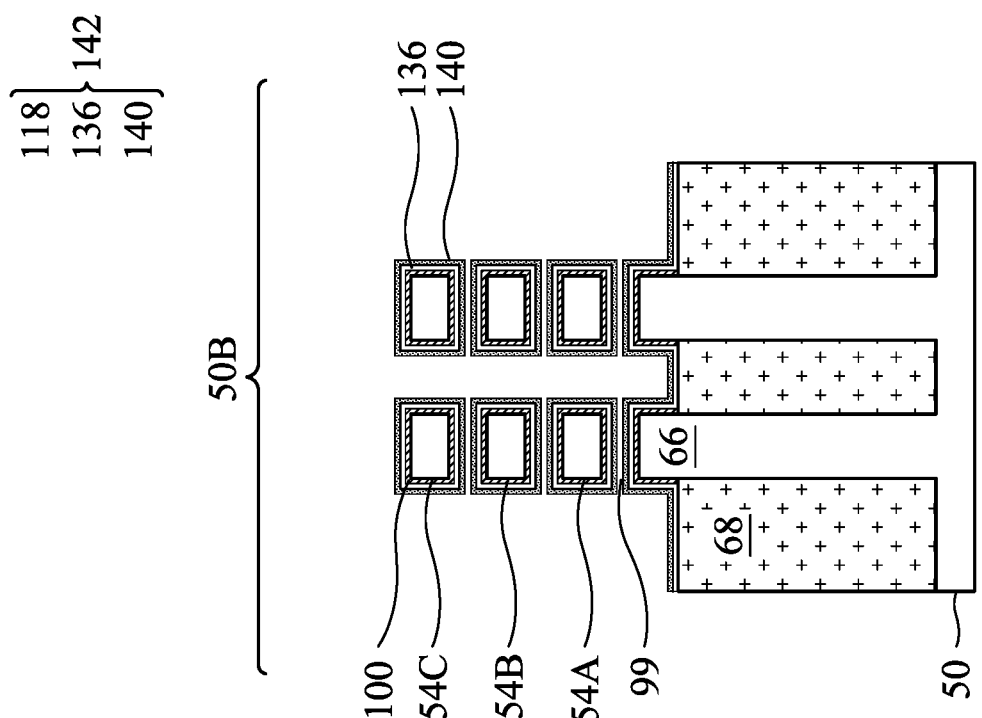
Figure 31A:
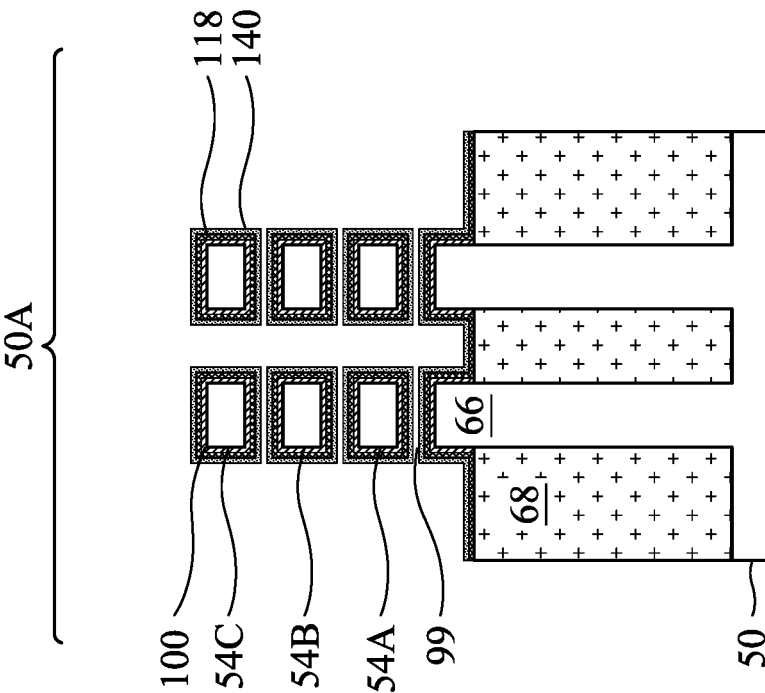
Figure 31B:
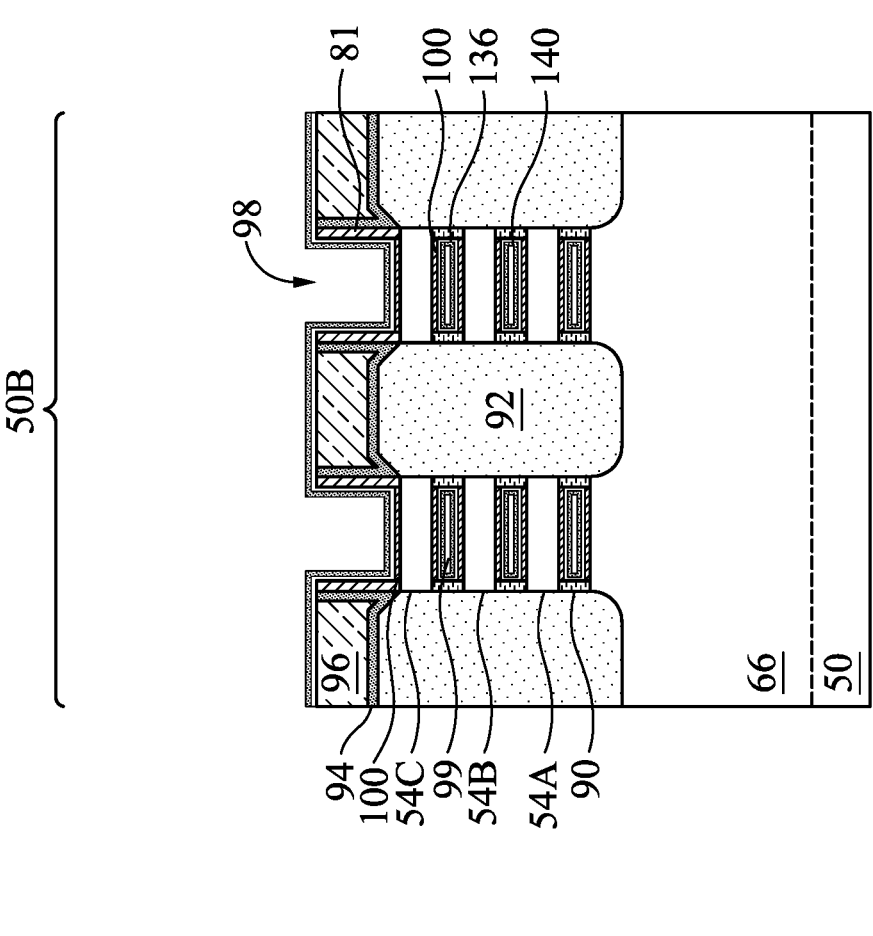
Figure 31B:
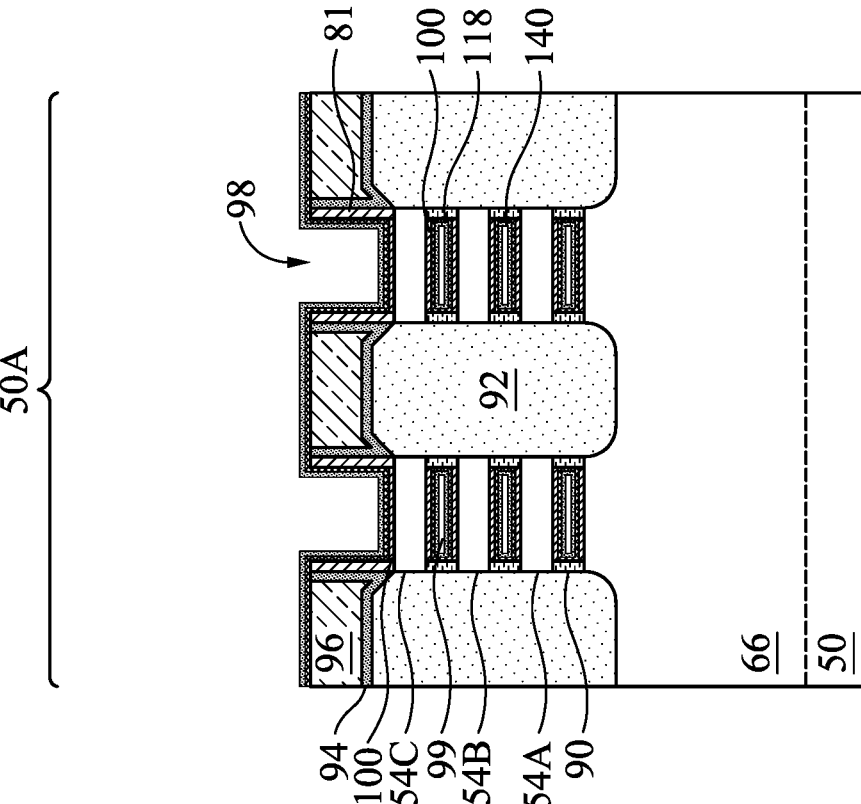

Next, in FIGS. 31A and 31B, an optional fourth gate dielectric layer 140 is conformally formed over the doped gate dielectric layers in the first region 50A and the second region 50B, such as over the first and second gate dielectric layers 118 and 126 (or the third gate dielectric layer 136 if present). The fourth gate dielectric layer 140 may be formed of a same or similar material as the dielectric layer 104 using a same or similar formation method. In some embodiments, the fourth gate dielectric layer 140 is free of dipole dopants. The first and third gate dielectric layers 118, 136 and the fourth gate dielectric layer 140 may be collectively referred to as a gate dielectric layer 142.

Figure 32A:
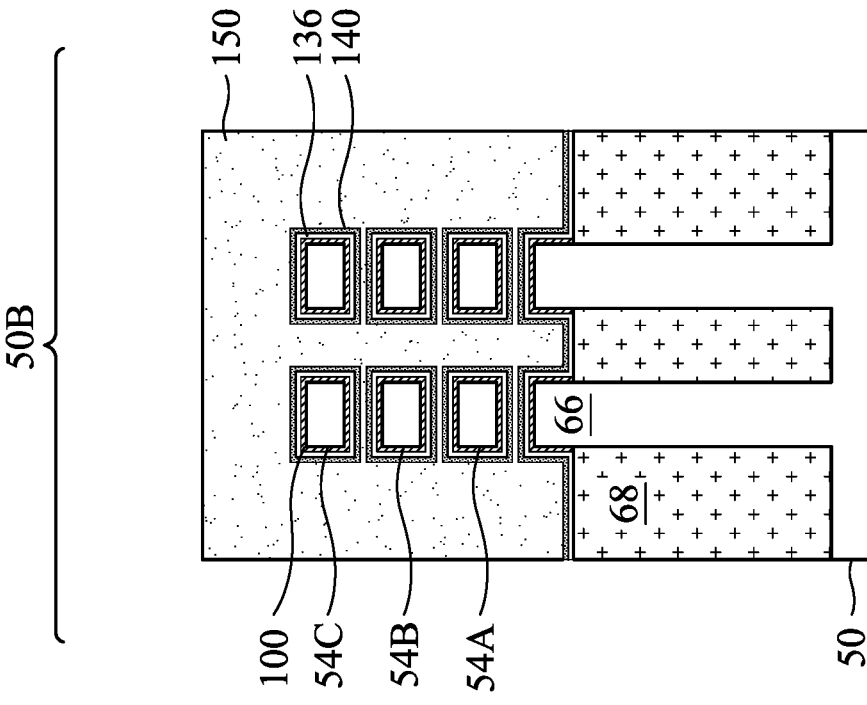
Figure 32A:
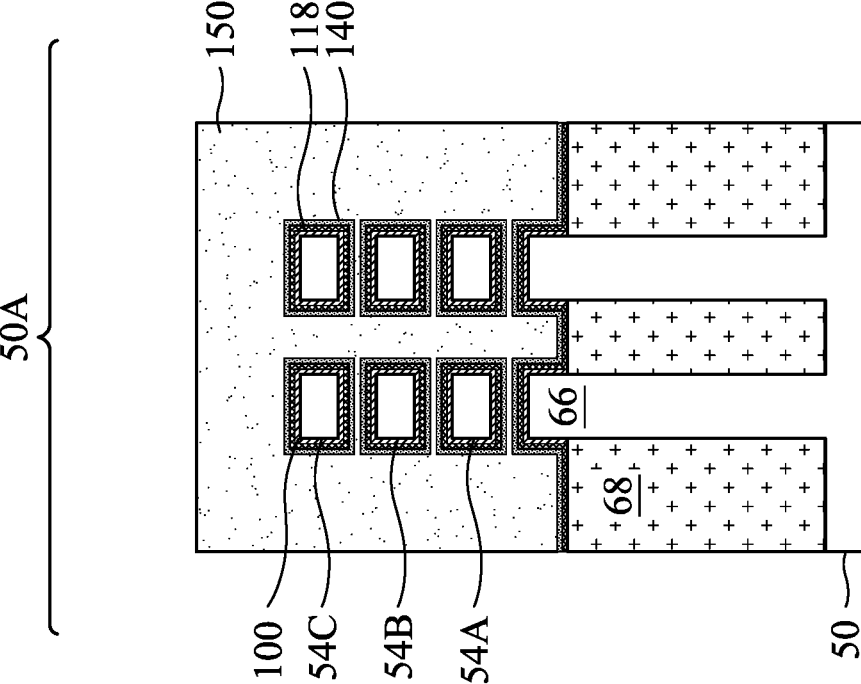
Figure 32B:
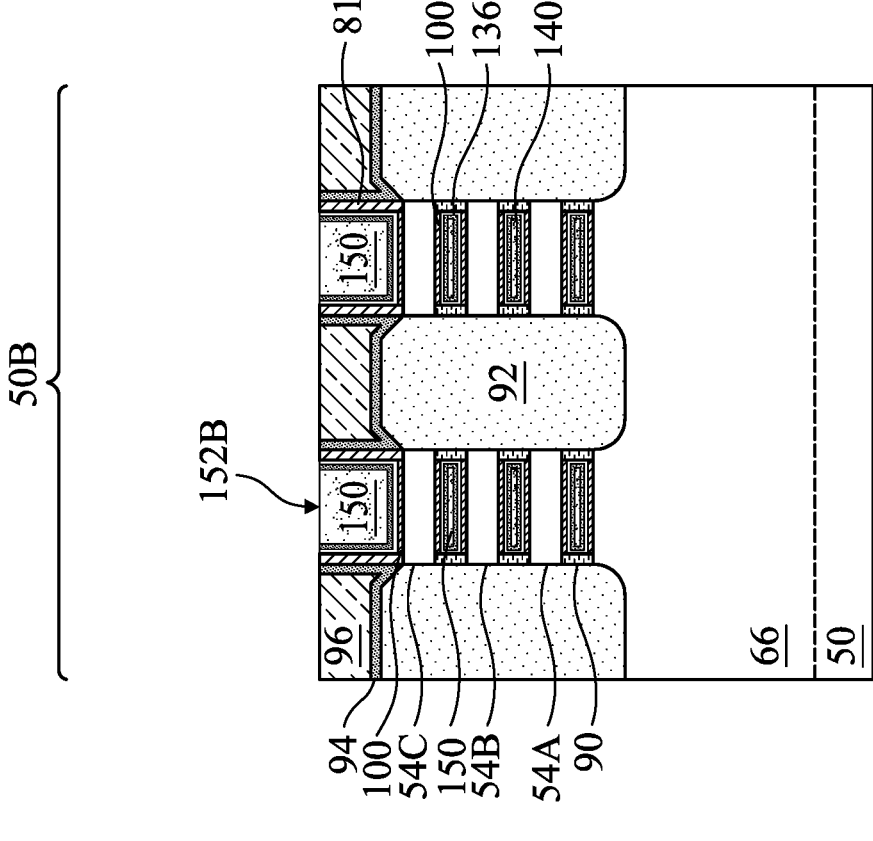
Figure 32B:
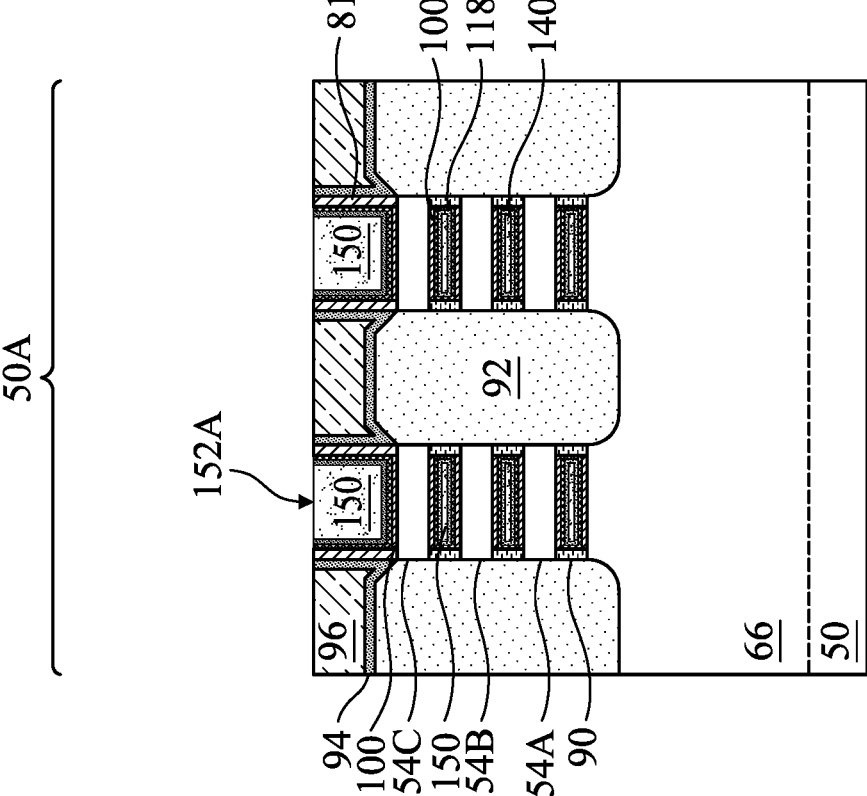

In FIGS. 32A and 32B, the gate electrodes 150 are deposited for filling the remaining portions of the second recesses 98 and openings 99 (e.g., deposited over the fourth gate dielectric layer 140). The gate electrodes 150 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 150 are illustrated in FIGS. 32A and 32B, the gate electrodes 150 may comprise any number of liner layers, any number of work function tuning layers, and a fill material. Any combination of the layers which make up the gate electrodes 150 may be deposited in the first region 50A and the second region 50B.

After the filling of the second recesses 98, a planarization process, such as a CMP, may be performed to remove the excess portions of the gate dielectric layer 142 and the material of the gate electrodes 150, which excess portions are over the top surface of the first ILD 96. The remaining portions of the material of the gate electrodes 150 and the gate dielectric layer 142 thus form replacement gate structures of the resulting nano-FETs. The interfacial layer 100, the gate dielectric layer 142, and the gate electrode 150 in the first region 50A may be collectively referred to as a gate structure 152A, and the interfacial layer 100, the gate dielectric layer 142, and the gate electrode 150 in the second region 50B may be referred to as a gate structure 152B.

Figure 33A:
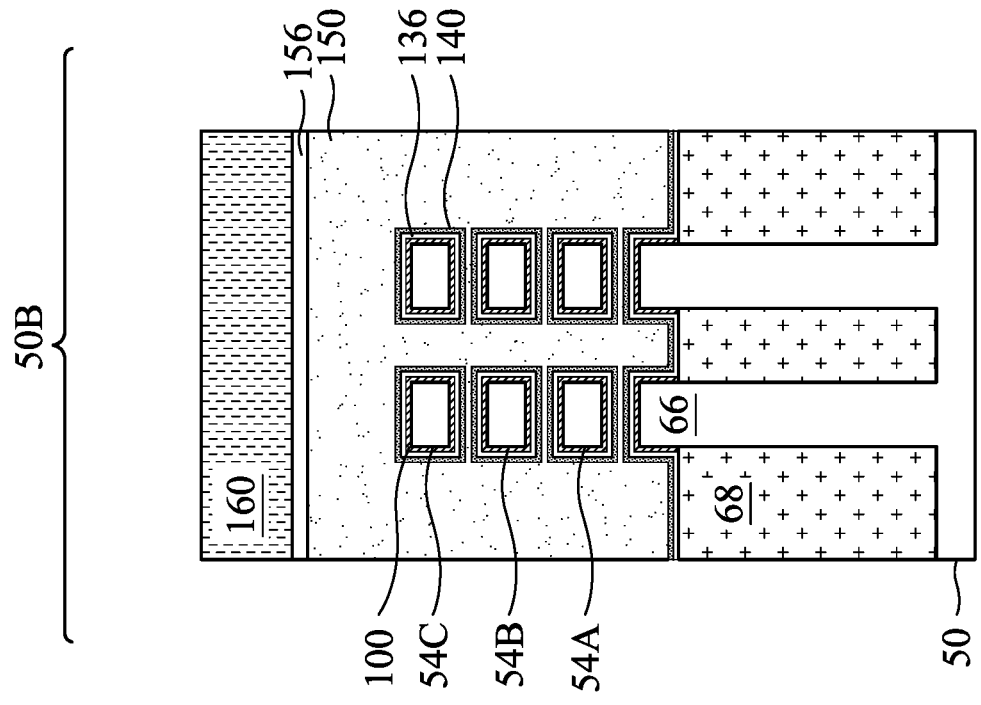
Figure 33A:
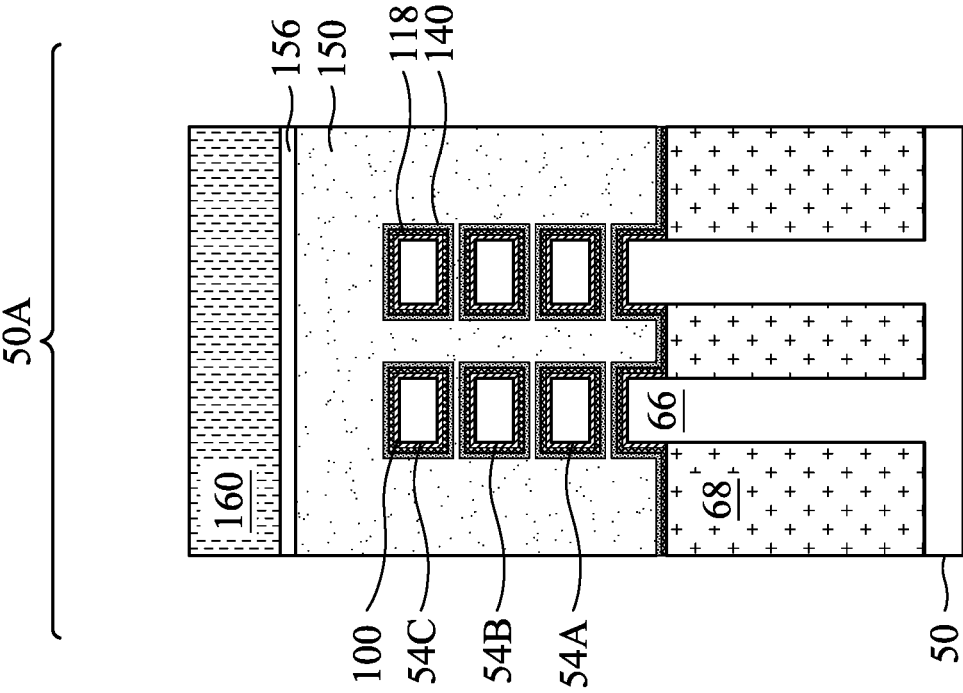
Figure 33B:
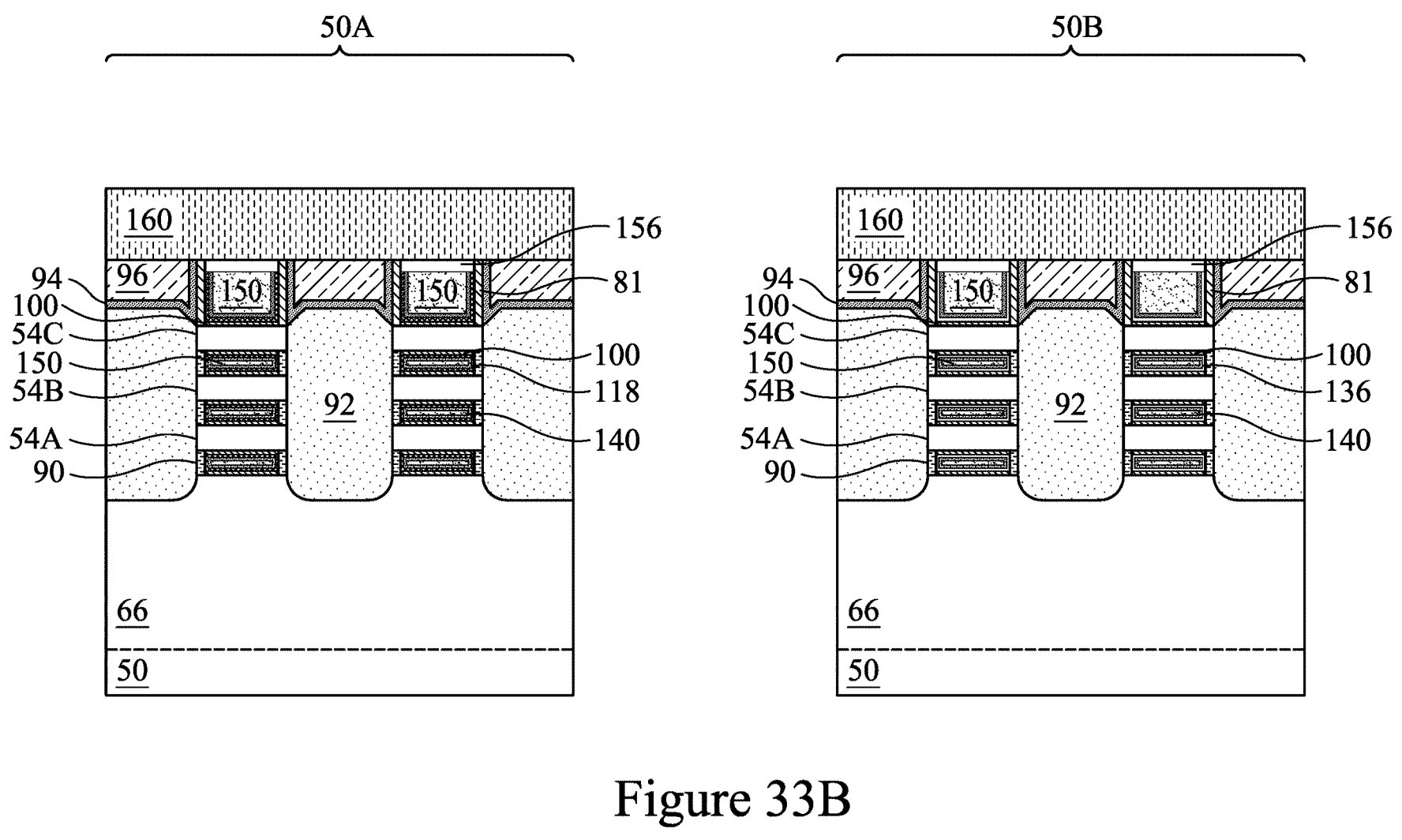
Figure 33C:
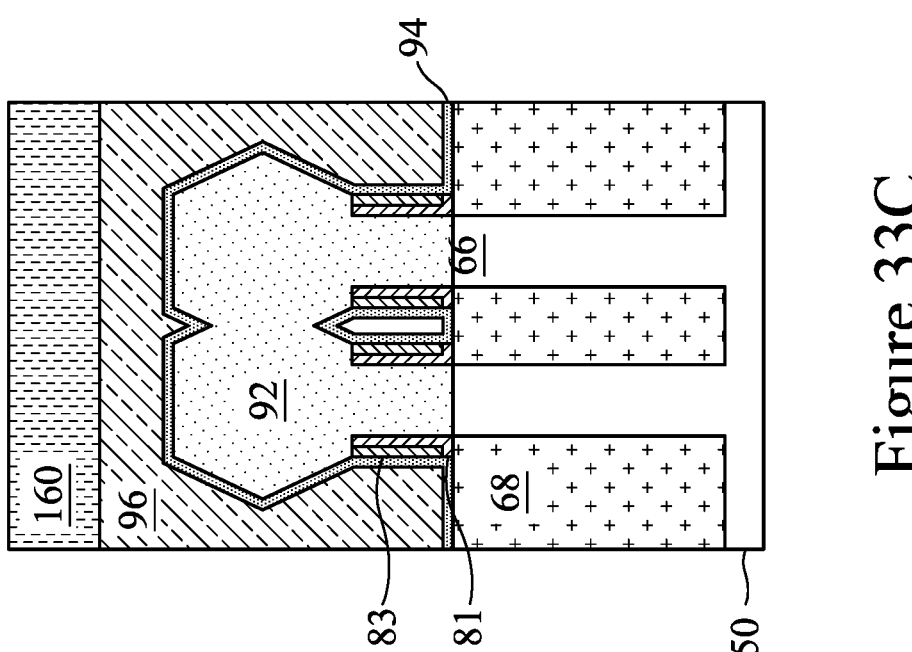

In FIGS. 33A-33C, the gate structures 152A and 152B (including the gate dielectric layer 142 and the corresponding overlying gate electrodes 150) are recessed, so that a recess is formed directly over the gate structure and between opposing portions of first spacers 81. A gate mask 156 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as contacts 172, discussed below with respect to FIGS. 35A and 35B) penetrate through the gate mask 156 to contact the top surface of the recessed gate electrodes 150.

As further illustrated by FIGS. 33A-33C, a second ILD 160 is deposited over the first ILD 96 and over the gate mask 156. In some embodiments, the second ILD 160 is a flowable film formed by FCVD. In some embodiments, the second ILD 160 is formed of a dielectric material such as PSG, BSG, BPSG, USG, or the like, and may be deposited by any suitable method, such as CVD, PECVD, or the like.

Figure 34A:
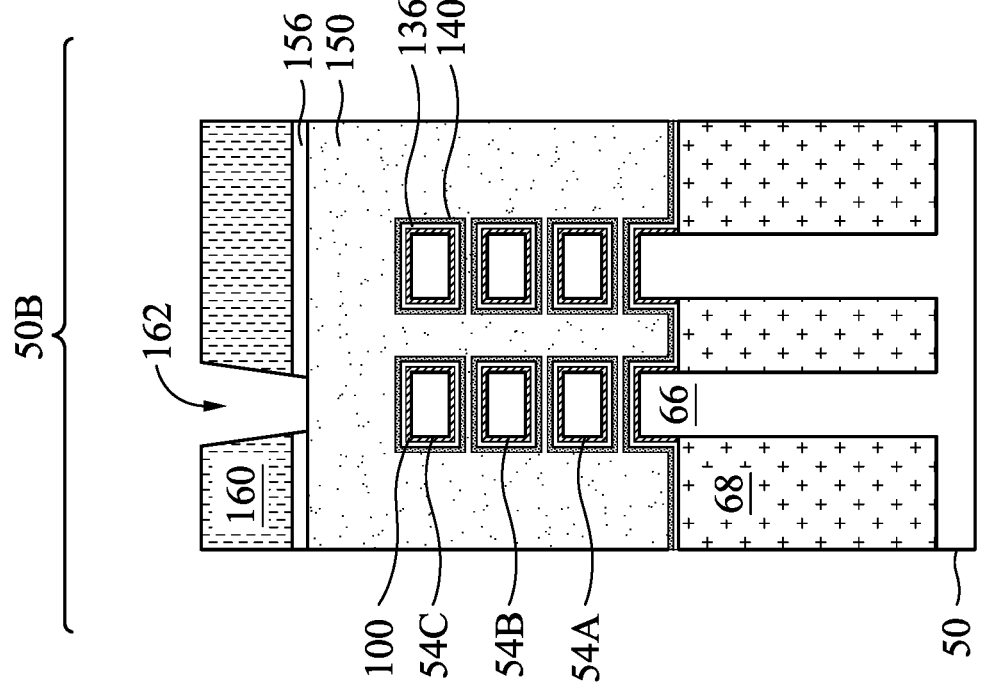
Figure 34A:
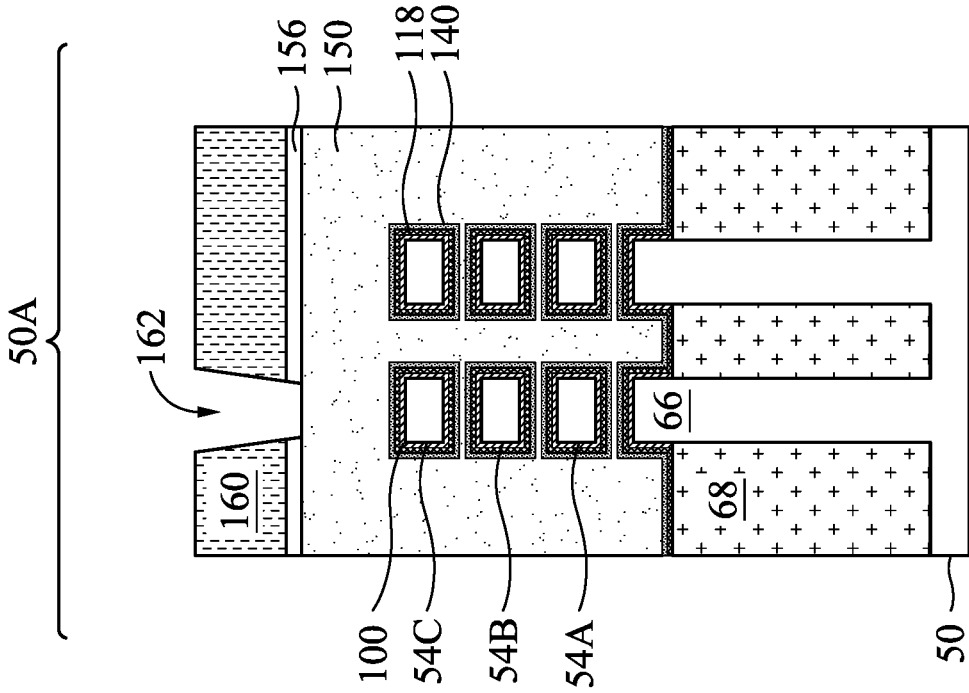
Figure 34B:
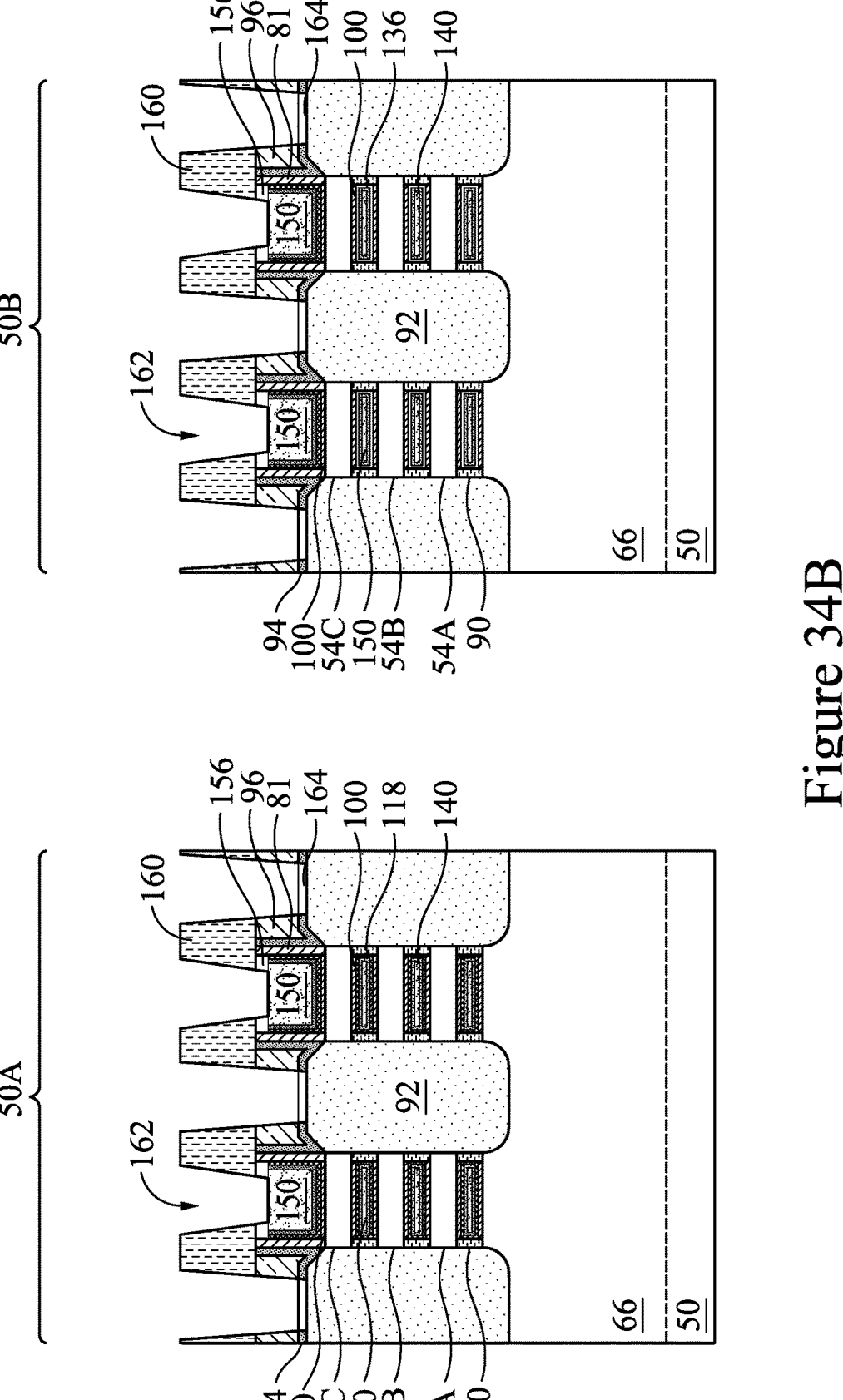
Figure 34C:
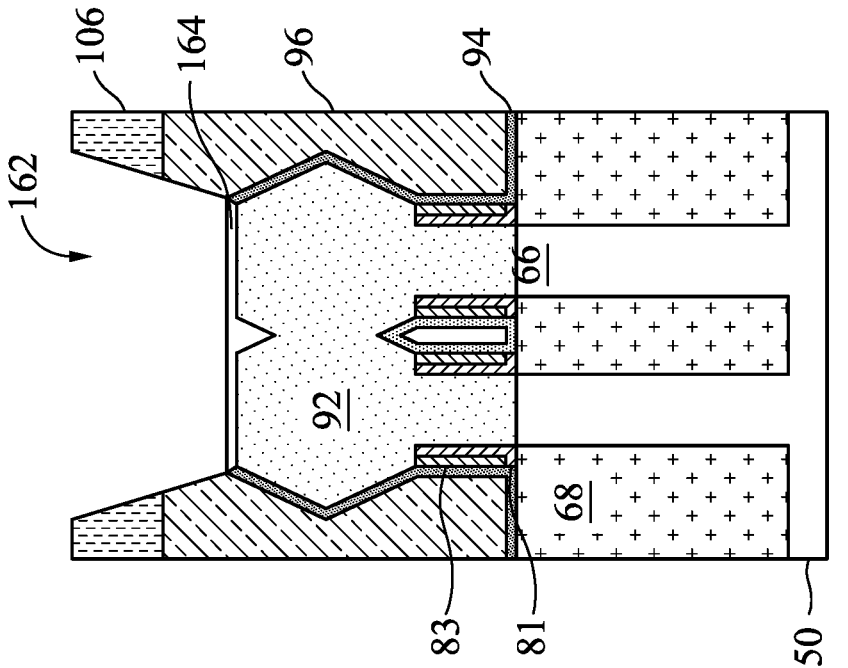

In FIGS. 34A-34C, the second ILD 160, the first ILD 96, the CESL 94, and the gate masks 156 are etched to form third recesses 162 exposing surfaces of the epitaxial source/drain regions 92 and/or the gate structure. The third recesses 162 may be formed by etching using an anisotropic etching process, such as RIE, NBE, or the like. In some embodiments, the third recesses 162 may be etched through the second ILD 160 and the first ILD 96 using a first etching process; may be etched through the gate masks 156 using a second etching process; and may then be etched through the CESL 94 using a third etching process. A mask, such as a photoresist, may be formed and patterned over the second ILD 160 to mask portions of the second ILD 160 from the first etching process and the second etching process. In some embodiments, the etching process may over-etch, and therefore, the third recesses 162 extend into the epitaxial source/drain regions 92 and/or the gate structure, and a bottom of the third recesses 162 may be level with (e.g., at a same level, or having a same distance from the substrate), or lower than (e.g., closer to the substrate) the epitaxial source/drain regions 92 and/or the gate structure. Although FIG. 34B illustrate the third recesses 162 as exposing the epitaxial source/drain regions 92 and the gate structure in a same cross-section, in various embodiments, the epitaxial source/drain regions 92 and the gate structure may be exposed in different cross-sections, thereby reducing the risk of shorting subsequently formed contacts. After the third recesses 162 are formed, silicide regions 164 are formed over the epitaxial source/drain regions 92. In some embodiments, the silicide regions 164 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 164. The un-reacted portions of the deposited metal are then removed, e.g., by an etching process. Although silicide regions 164 are referred to as silicide regions, silicide regions 164 may also be germanide regions, or silicon germanide regions (e.g., regions comprising silicide and germanide). In an embodiment, the silicide region 164 comprises TiSi, and has a thickness in a range between about 2 nm and about 10 nm.

Figure 35A:
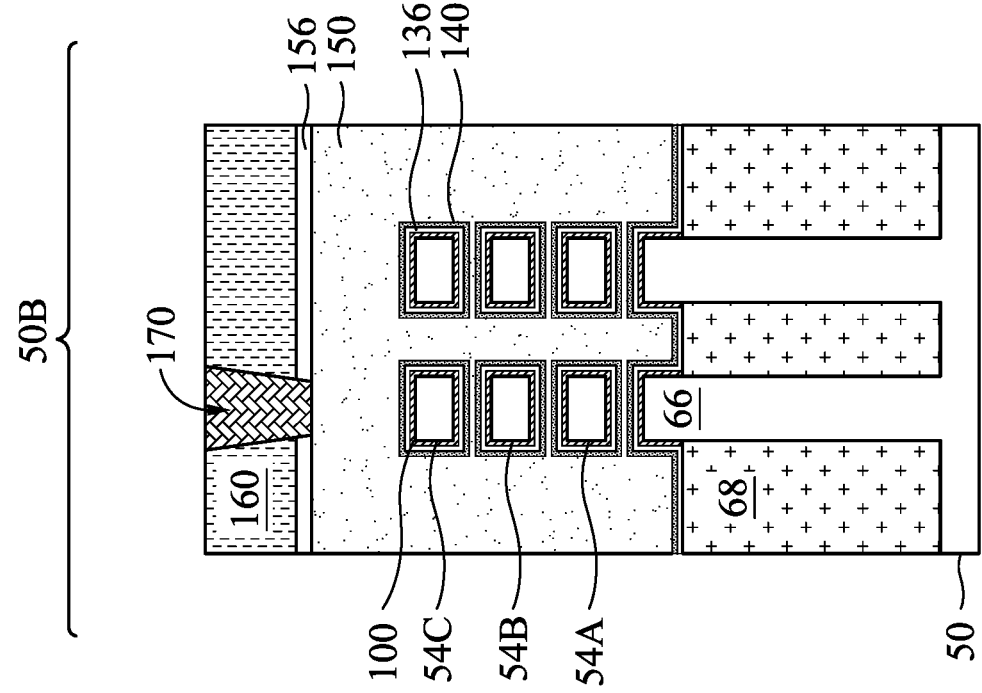
Figure 35A:
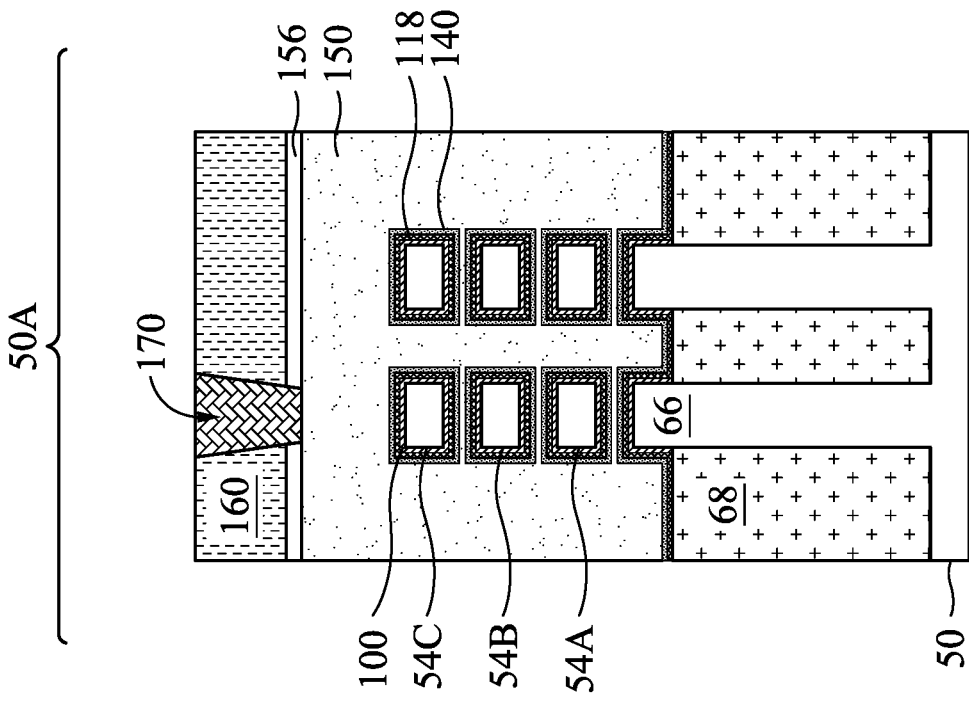
Figure 35B:
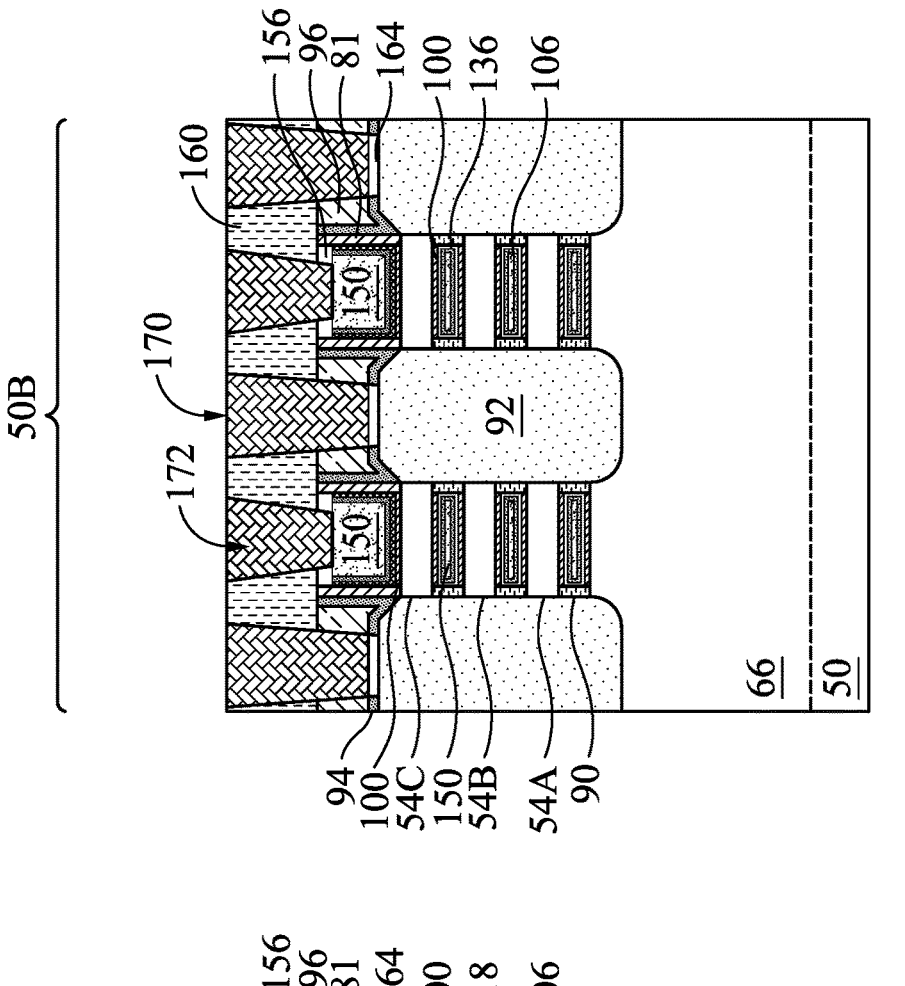
Figure 35B:
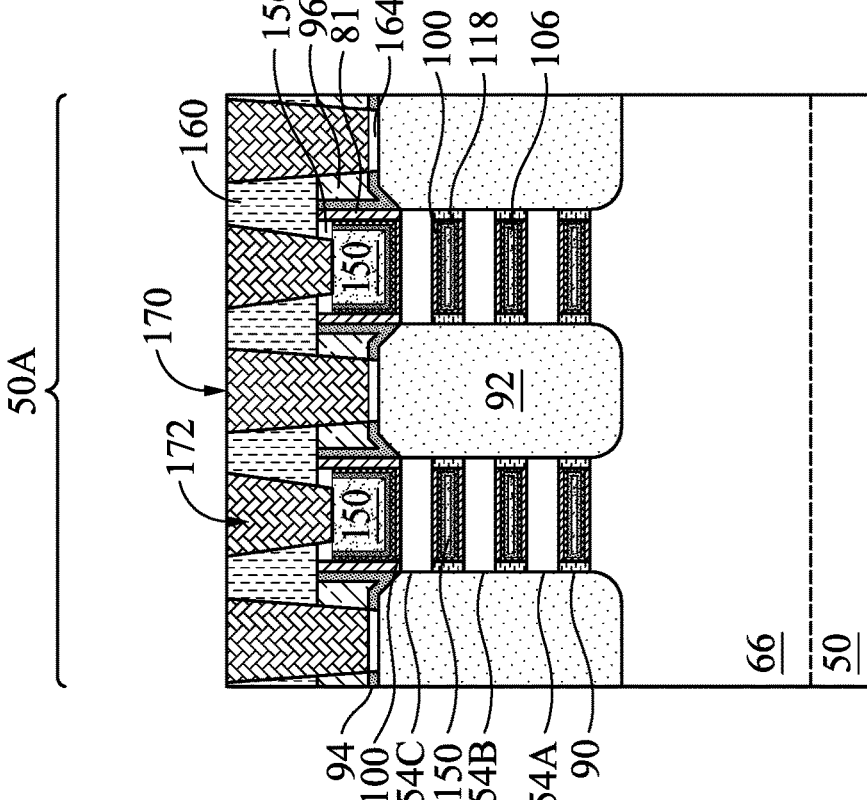
Figure 35C:
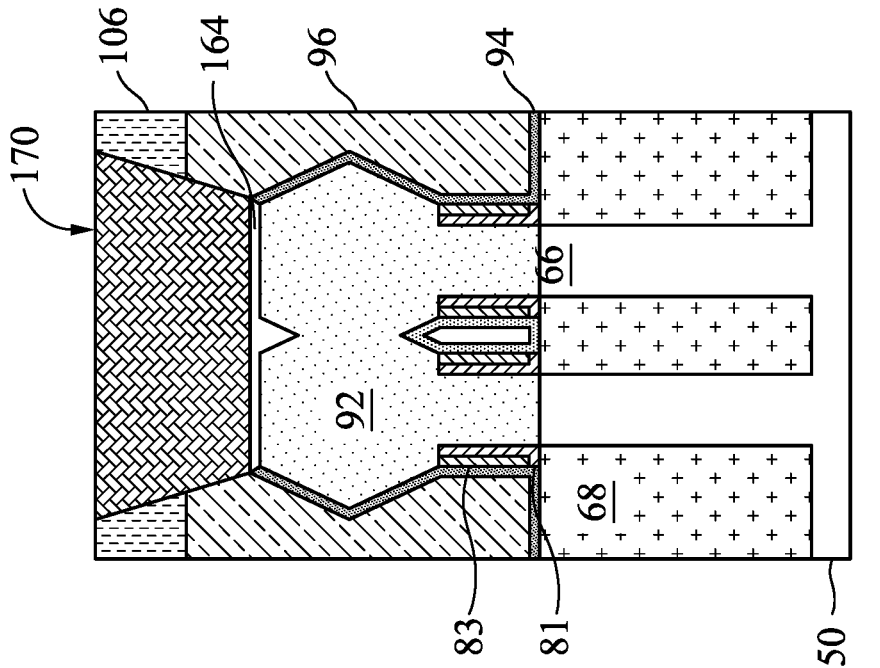

Next, in FIGS. 35A-35C, contacts 170 and 172 (may also be referred to as contact plugs) are formed in the third recesses 162. The contacts 170 and 172 may each comprise one or more layers, such as barrier layers, diffusion layers, and fill materials. For example, in some embodiments, the contacts 170 and 172 each include a barrier layer and a conductive material, and is electrically coupled to the underlying conductive feature (e.g., gate electrodes 150 and/or silicide region 164 in the illustrated embodiment). The contacts 172 are electrically coupled to the gate electrodes 150 and may be referred to as gate contacts, and the contacts 170 are electrically coupled to the silicide regions 164 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 160.

FIGS. 36A-36C illustrate cross-sectional views of a device according to some alternative embodiments. FIG. 36A illustrates reference cross-section A-A' illustrated in FIG. 1. FIG. 36B illustrates reference cross-section B-B' illustrated in FIG. 1. FIG. 36C illustrates reference cross-section C-C' illustrated in FIG. 1. In FIGS. 36A-36C, like reference numerals indicate like elements formed by like processes as the structure of FIGS. 35A-35C. However, in FIGS. 36A-36C, channel regions in the first region 50A and the second region 50B are formed of different materials. For example, the second nanostructures 54, which comprise silicon or silicon carbide, may provide channel regions in the first region 50A, and the first nanostructures 52, which may comprise silicon germanium, may provide channel regions in the second region 50B. The structures of FIGS. 36A-36C may be formed, for example, by removing the first nanostructures 52 in the first region 50A and removing the second nanostructures in the second region 50B; forming the first gate dielectric layer 118 in the first region 50A and the third gate dielectric layer 136 in the second region 50B, respectively; depositing the gate electrodes 150 around the first gate dielectric layer 118 in the first region and the third gate dielectric layer 136 in the second region 50B.

According to embodiments of the present disclosure, a semiconductor device comprising gate dielectric layers doped with dipole dopant materials and methods of forming the semiconductor device are provided. The dipole dopant materials doped in the gate dielectric layers may adjust the threshold voltages of gate structures comprising the gate dielectric layers. In some embodiments, the one or more dipole dopant materials are doped into a gate dielectric layer by one or more individual doping loops, and each of the doping loops comprises an individual dipole layer formation and an individual anneal process. Accordingly, the concentration and concentration profiles of each dipole dopant material in one or more gate dielectric layers may be individually controlled, such as by controlling the thickness of the dipole layer or the temperature and/or time period of the anneal process in each doping loops. The methods according to some embodiments may also provide doping two or more dipole dopant materials in a single gate dielectric layer, with well-controlled concentration and concentration profiles of each of the dipole dopant materials, to provide fine-tuned threshold voltage.

In an embodiment, a semiconductor device includes a first channel region disposed in a first device region over a substrate; a first gate dielectric layer disposed over the first channel region, wherein the first gate dielectric layer includes a first dipole dopant and a second dipole dopant, wherein the first dipole dopant along a thickness direction of the first gate dielectric layer has a first concentration peak, and the second dipole dopant along the thickness direction of the first gate dielectric layer has a second concentration peak, wherein the second concentration peak is located between the first concentration peak and an upper surface of the first gate dielectric layer, wherein the second concentration peak is offset from the upper surface of the first gate dielectric layer; and a gate electrode disposed over the first gate dielectric layer. In an embodiment, the first dipole dopant and the second dipole dopant include La, Mg, Sr, Y, Ti, Al, Ga, In, Nb, or Zn. In an embodiment, the first dipole dopant and the second dipole dopant are different materials. In an embodiment, the first dipole dopant has a smaller thermal diffusivity than the second dipole dopant. In an embodiment, the semiconductor device further includes a second gate dielectric layer disposed between the first gate dielectric layer and the gate electrode, wherein the second gate dielectric layer is substantially free of the first dipole dopant and the second dipole dopant. In an embodiment, an average atomic concentration of the second dipole dopant in the first gate dielectric layer is greater than an average atomic concentration of the first dipole dopant in the first gate dielectric layer.

In an embodiment, a method of manufacturing a semiconductor device includes forming a dielectric layer over a channel region; forming a first dipole layer including a first dipole dopant over the dielectric layer; annealing the first dipole layer and the dielectric layer to transform the dielectric layer to a first doped dielectric layer including the first dipole dopant; removing remaining portions of the first dipole layer; after removing remaining portions of the first dipole layer, forming a second dipole layer including a second dipole dopant over the first doped dielectric layer; annealing the second dipole layer and the first doped dielectric layer to transform the first doped dielectric layer to a second doped dielectric layer including the first dipole dopant and the second dipole dopant; removing remaining portions of the second dipole layer; and after removing remaining portions of the second dipole layer, forming a gate electrode over the second doped dielectric layer. In an embodiment, the first dipole dopant and the second dipole dopant are different materials. In an embodiment, the first dipole dopant has a smaller thermal diffusivity than the second dipole dopant. In an embodiment, a thickness of the second dipole layer is different than a thickness of the first dipole layer. In an embodiment, the method further includes forming a gate dielectric layer over the second doped dielectric layer after removing remaining portions of the second dipole layer and before forming the gate electrode. In an embodiment, the gate dielectric layer and the dielectric layer are a same material. In an embodiment, the first dipole layer is an oxide or a nitride of the first dipole dopant.

In an embodiment, a method for manufacturing a semiconductor device includes forming a dielectric layer over a first channel region and over a second channel region; doping a first dipole dopant and a second dipole dopant into the dielectric layer over the first channel region to form a first gate dielectric layer over the first channel region, wherein the first dipole dopant is annealed one or more times more than the second dipole dopant; after forming the first gate dielectric layer, forming a first dipole layer including a third dipole dopant over the dielectric layer over the second channel region; performing a first anneal process to diffuse the third dipole dopant from the first dipole layer into the dielectric layer over the second channel region to form a second gate dielectric layer over the second channel region; removing remaining portions of the first dipole layer; and forming a gate electrode layer over the first gate dielectric layer and the second gate dielectric layer. In an embodiment, the first dipole dopant has a smaller thermal diffusivity than the second dipole dopant. In an embodiment, forming the first dipole layer over the dielectric layer over the second channel region includes forming the first dipole layer over the dielectric layer over the first channel region and over the second channel region; forming a mask covering the first dipole layer over the second channel region and exposing the first dipole layer over the first channel region; and etching the first dipole layer over the first channel region. In an embodiment, the method further includes doping a fourth dipole dopant into the second gate dielectric layer by forming a second dipole layer over the second gate dielectric layer and performing a second anneal process. In an embodiment, the method further includes forming a third gate dielectric layer over the first gate dielectric layer and the second gate dielectric layer before forming the gate electrode layer. In an embodiment, the third dipole dopant is same as at least one of the first dipole dopant and the second dipole dopant. In an embodiment, removing remaining portions of the first dipole layer includes a wet etch without using a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a dielectric layer over a channel region;
   forming a first dipole layer comprising a first dipole dopant over the dielectric layer over the channel region;
   annealing the first dipole layer and the dielectric layer to transform the dielectric layer to a first doped dielectric layer comprising the first dipole dopant over the channel region;
   removing remaining portions of the first dipole layer;

after removing remaining portions of the first dipole layer, forming a second dipole layer comprising a second dipole dopant over the first doped dielectric layer over the channel region;

annealing the second dipole layer and the first doped dielectric layer to transform the first doped dielectric layer to a second doped dielectric layer comprising the first dipole dopant and the second dipole dopant vertically over the channel region;

removing remaining portions of the second dipole layer; and after removing remaining portions of the second dipole layer, forming a gate electrode over the second doped dielectric layer.

2. The method of claim 1, wherein the first dipole dopant and the second dipole dopant are different materials.

3. The method of claim 1, wherein the first dipole dopant has a smaller thermal diffusivity than the second dipole dopant.

4. The method of claim 1, wherein a thickness of the second dipole layer is different than a thickness of the first dipole layer.

5. The method of claim 1, further comprising forming a gate dielectric layer over the second doped dielectric layer after removing remaining portions of the second dipole layer and before forming the gate electrode.

6. The method of claim 5, wherein the gate dielectric layer and the dielectric layer are a same material.

7. The method of claim 1, wherein the first dipole layer is an oxide or a nitride of the first dipole dopant.

8. A method for manufacturing a semiconductor device, the method comprising:

forming a dielectric layer over a first channel region and over a second channel region;

doping a first dipole dopant and a second dipole dopant into the dielectric layer over the first channel region to form a first gate dielectric layer over the first channel region, wherein the first dipole dopant over the first channel region is annealed one or more times more than the second dipole dopant over the first channel region;

after forming the first gate dielectric layer, forming a first dipole layer comprising a third dipole dopant over the dielectric layer over the second channel region;

performing a first anneal process to diffuse the third dipole dopant from the first dipole layer into the dielectric layer over the second channel region to form a second gate dielectric layer over the second channel region;

removing remaining portions of the first dipole layer; and forming a gate electrode layer over the first gate dielectric layer and the second gate dielectric layer.

9. The method of claim 8, wherein the first dipole dopant has a smaller thermal diffusivity than the second dipole dopant.

10. The method of claim 8, wherein forming the first dipole layer over the dielectric layer over the second channel region comprises:

forming the first dipole layer over the dielectric layer over the first channel region and over the second channel region;

forming a mask covering the first dipole layer over the second channel region and exposing the first dipole layer over the first channel region; and etching the first dipole layer over the first channel region.

11. The method of claim 8, further comprising doping a fourth dipole dopant into the second gate dielectric layer by forming a second dipole layer over the second gate dielectric layer and performing a second anneal process.

12. The method of claim 8, further comprising forming a third gate dielectric layer over the first gate dielectric layer and the second gate dielectric layer before forming the gate electrode layer.

13. The method of claim 8, wherein the third dipole dopant is same as at least one of the first dipole dopant and the second dipole dopant.

14. The method of claim 8, wherein removing remaining portions of the first dipole layer comprises a wet etch without using a mask.

15. A method of manufacturing a semiconductor device, the method comprising:

forming a first dielectric layer over a channel region;

doping the first dielectric layer over the channel region with dipole dopants, wherein doping the first dielectric layer comprises sequentially performing a plurality of cycles, wherein each cycle comprises:

forming a dipole layer comprising dipole dopants over the first dielectric layer vertically over the channel region;

annealing the dipole layer and the first dielectric layer to drive the dipole dopants into the first dielectric layer vertically over the channel region; and removing remaining portions of the dipole layer; and after doping the first dielectric layer, forming a gate electrode over the first dielectric layer.

16. The method of claim 15, wherein a first cycle of the plurality of cycles uses a first dipole dopant for the dipole dopants, wherein a second cycle of the plurality of cycles uses a second dipole dopant for the dipole dopants, wherein the first dipole dopant is different than the second dipole dopant.

17. The method of claim 15, wherein a first cycle of the plurality of cycles uses a first dipole dopant for the dipole dopants, wherein a second cycle of the plurality of cycles uses a second dipole dopant for the dipole dopants, wherein the first dipole dopant is a same dipole dopant as the second dipole dopant.

18. The method of claim 15, wherein the dipole dopants comprise La, Mg, Sr, Y, Ti, Al, Ga, In, Nb, or Zn.

19. The method of claim 15, wherein the plurality of cycles includes a first cycle and a second cycle, the first cycle being performed prior to the second cycle, wherein the dipole dopants used in the first cycle have a smaller thermal diffusivity than the dipole dopants used in the second cycle.

20. The method of claim 15, further comprising:

prior to forming the gate electrode, forming a second dielectric layer over the first dielectric layer, wherein the gate electrode is formed over the second dielectric layer, wherein the second dielectric layer is substantially free of the dipole dopants.

* * * * *